US010818542B2

(12) United States Patent
Cui et al.

(10) Patent No.: US 10,818,542 B2
(45) Date of Patent: Oct. 27, 2020

(54) THREE-DIMENSIONAL MEMORY DEVICE INCLUDING COMPOSITE WORD LINES AND MULTI-STRIP SELECT LINES AND METHOD FOR MAKING THE SAME

(71) Applicant: SANDISK TECHNOLOGIES LLC, Addison, TX (US)

(72) Inventors: Zhixin Cui, Nagoya (JP); Fei Zhou, Milpitas, CA (US); Raghuveer S. Makala, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/362,895

(22) Filed: Mar. 25, 2019

(65) Prior Publication Data

US 2020/0312706 A1   Oct. 1, 2020

(51) Int. Cl.
*H01L 21/768* (2006.01)
*H01L 23/522* (2006.01)
(Continued)

(52) U.S. Cl.
CPC ...... *H01L 21/7682* (2013.01); *H01L 23/5226* (2013.01); *H01L 23/53257* (2013.01);
(Continued)

(58) Field of Classification Search
None
See application file for complete search history.

(56) References Cited

U.S. PATENT DOCUMENTS 9,515,085 B2   12/2016   Rabkin et al.
9,780,182 B2   10/2017   Peri et al.
(Continued)

FOREIGN PATENT DOCUMENTS

WO   WO2019055075 A1   3/2019
WO   WO2019209408 A1   10/2019

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — Herve-Louis Y Assouman
(74) *Attorney, Agent, or Firm* — The Marbury Law Group, PLLC

(57) ABSTRACT

An alternating stack of insulating layers and sacrificial material layers is formed over a substrate. Memory stack structures are formed through the alternating stack. Drain-select-level trenches through an upper subset of the sacrificial material layers, and backside trenches are formed through each layer of the alternating stack. Backside recesses are formed by removing the sacrificial material layers. A first electrically conductive material and a second electrically conductive material are sequentially deposited in the backside recesses and the drain-select-level trenches. Portions of the second electrically conductive material and the first electrically conductive material may be removed by at least one anisotropic etch process from the drain-select-level trenches to provide drain-select-level electrically conductive layers as multiple groups that are laterally spaced apart and electrically isolated from one another by cavities within the drain-select-level trenches.

19 Claims, 59 Drawing Sheets

(51) Int. Cl.
*H01L 23/532* (2006.01)
*H01L 27/11582* (2017.01)
*H01L 27/11556* (2017.01)
*H01L 21/311* (2006.01)
*H01L 21/3213* (2006.01)
*H01L 27/11565* (2017.01)
*H01L 27/11519* (2017.01)

(52) U.S. Cl.
CPC .. *H01L 27/11556* (2013.01); *H01L 27/11582* (2013.01); *H01L 21/31111* (2013.01); *H01L 21/31116* (2013.01); *H01L 21/32134* (2013.01); *H01L 21/32136* (2013.01); *H01L 27/11519* (2013.01); *H01L 27/11565* (2013.01)

(56) References Cited

U.S. PATENT DOCUMENTS

| | | | |
|---|---|---|---|
| 9,922,987 | B1 | 3/2018 | Mizutani et al. |
| 9,929,174 | B1 | 3/2018 | Mizutani et al. |
| 9,984,963 | B2 | 5/2018 | Peri et al. |
| 10,115,735 | B2 | 10/2018 | Yu et al. |
| 10,192,878 | B1 | 1/2019 | Tsutsumi et al. |
| 10,236,300 | B2 | 3/2019 | Zhang et al. |
| 2009/0224309 | A1 | 9/2009 | Kidoh et al. |
| 2016/0172370 | A1 | 6/2016 | Makala et al. |
| 2016/0225866 | A1* | 8/2016 | Peri ................ H01L 29/66833 |
| 2016/0307915 | A1 | 10/2016 | Pang et al. |
| 2017/0125538 | A1 | 5/2017 | Sharangpani et al. |
| 2018/0097009 | A1 | 4/2018 | Zhang et al. |
| 2019/0027488 | A1 | 1/2019 | Kai et al. |
| 2019/0027489 | A1 | 1/2019 | Orimoto et al. |
| 2019/0326313 | A1 | 10/2019 | Cui et al. |

OTHER PUBLICATIONS

Walker et al., "Handbook of Metal Etchants", CRC Press LLC, 1991, "https://vector.umd.edu/images/links/Handbook_of_Metal_Etchants.pdf", 1428 pages.
A. Picard et al. "Plasma Etching of Refractory Metals (W, Mo, Ta) and Silicon in SF6 and SF6-O2. An Analysis of the Reaction Products", Plasma Chemistry and Plasma Processing, vol. 5, No. 4, 1985, 2 pages.
U.S. Appl. No. 16/362,857, filed Mar. 25, 2019, SanDisk Technologies LLC.
U.S. Appl. No. 15/906,109, filed Feb. 27, 2018, SanDisk Technologies LLC.
U.S. Appl. No. 15/888,714, filed Feb. 5, 2018, SanDisk Technologies LLC.
U.S. Appl. No. 15/865,892, filed Jan. 9, 2018, SanDisk Technologies LLC.
U.S. Appl. No. 16/019,821, filed Jun. 27, 2018, SanDisk Technologies LLC.
U.S. Appl. No. 16/019,856, filed Jun. 27, 2018, SanDisk Technologies LLC.
U.S. Appl. No. 16/023,289, filed Jun. 29, 2018, SanDisk Technologies LLC.
U.S. Appl. No. 16/023,866, filed Jun. 29, 2018, SanDisk Technologies LLC.
U.S. Appl. No. 16/142,875, filed Sep. 26, 2018, SanDisk Technologies LLC.
U.S. Appl. No. 16/211,387, filed Dec. 6, 2018, SanDisk Technologies LLC.
U.S. Appl. No. 16/267,592, filed Feb. 5, 2019, SanDisk Technologies LLC.
U.S. Appl. No. 16/267,625, filed Feb. 5, 2019, SanDisk Technologies LLC.
U.S. Appl. No. 16/352,157, filed Mar. 13, 2019, SanDisk Technologies LLC.
U.S. Appl. No. 16/142,752, filed Sep. 26, 2018, SanDisk Technologies LLC.
U.S. Appl. No. 15/804,692, filed Nov. 6, 2017, SanDisk Technologies LLC.
U.S. Appl. No. 16/136,686, filed Sep. 20, 2018, SanDisk Technologies LLC.
U.S. Appl. No. 16/024,048, filed Jun. 29, 2018, SanDisk Technologies LLC.
U.S. Appl. No. 16/361,722, filed Mar. 22, 2019, SanDisk Technologies LLC.
Notification of Transmittal of the International Search Report and Written Opinion of the International Search Authority for International Patent Application No. PCT/US2019/064411, dated Mar. 23, 2020, 14 pages.
USPTO Office Communication, Notice of Allowance and Fee(s) Due for U.S. Appl. No. 16/362,857, dated Mar. 12, 2020, 13 pages.

* cited by examiner

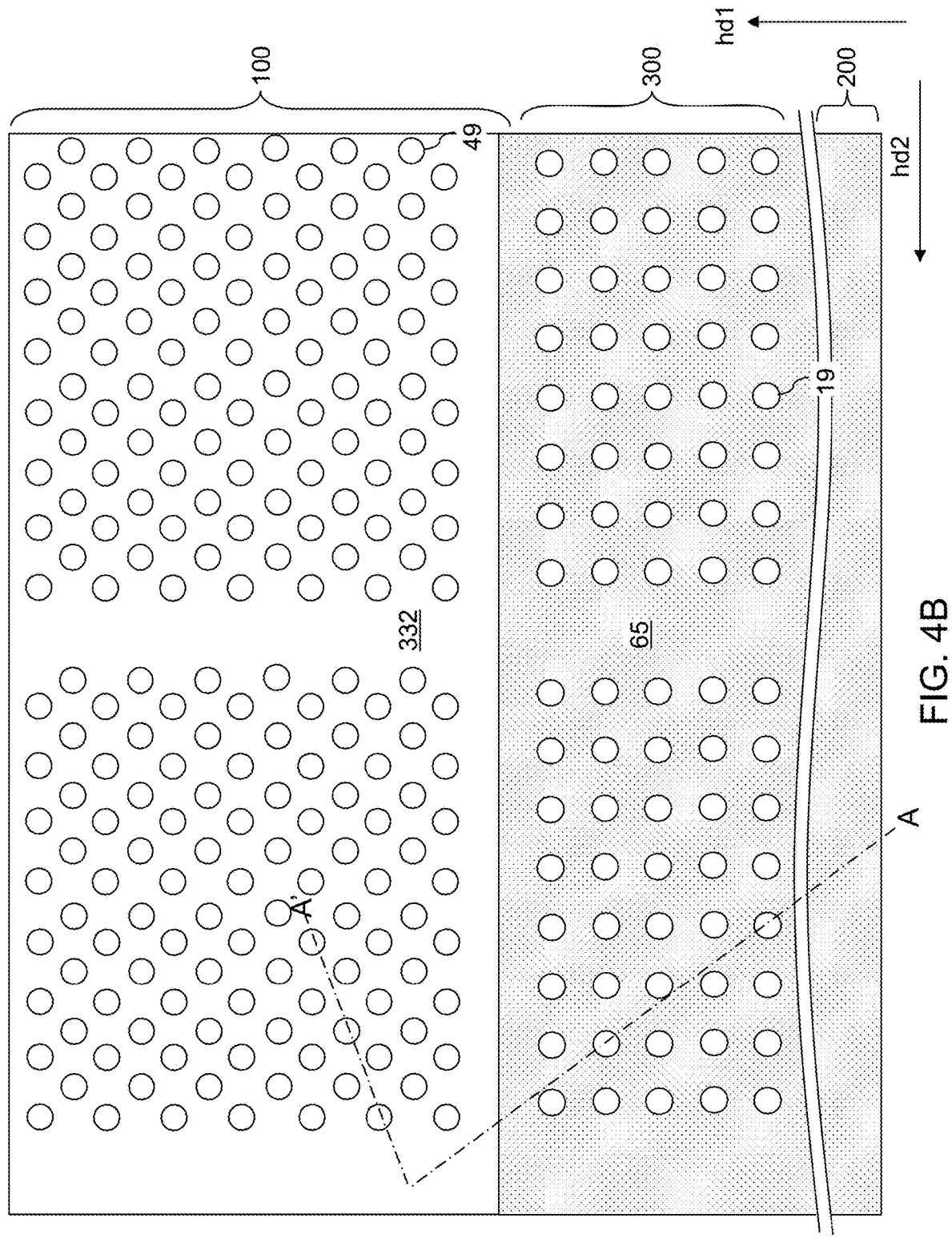

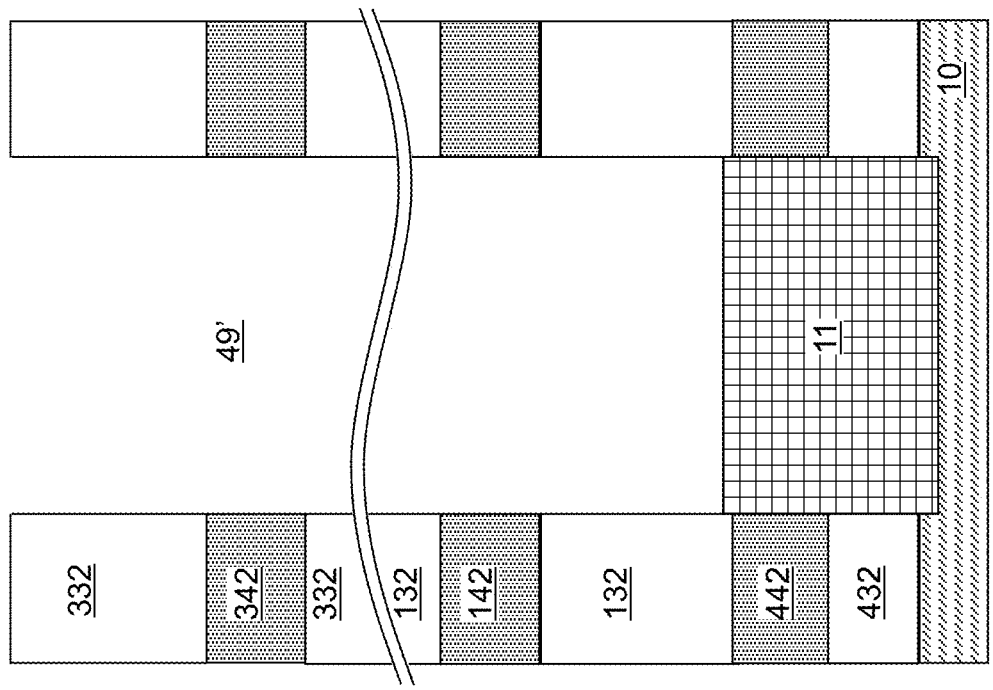
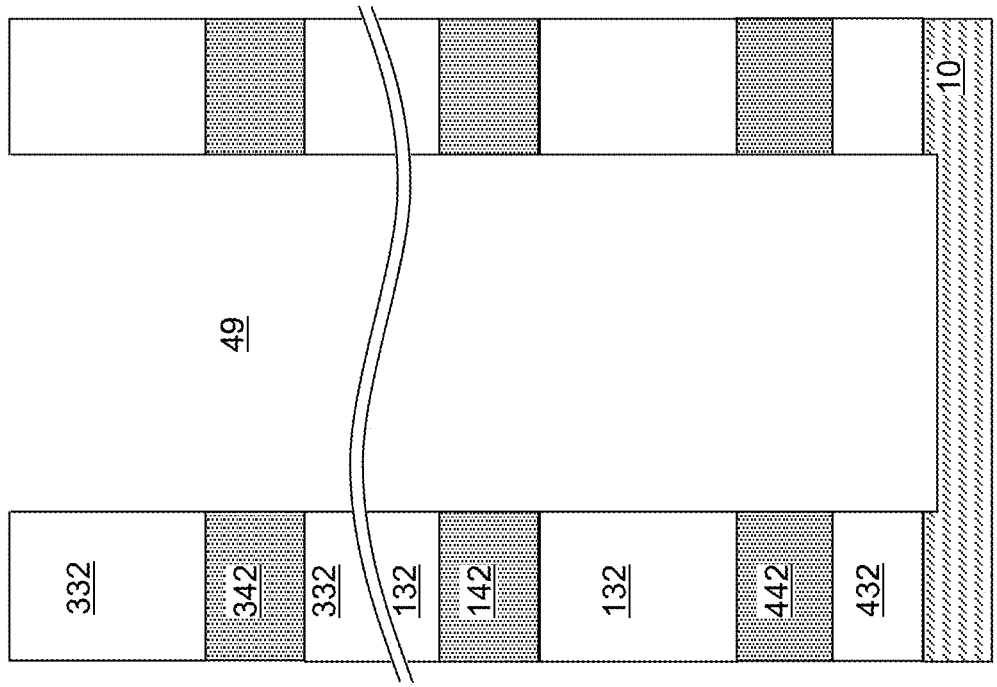

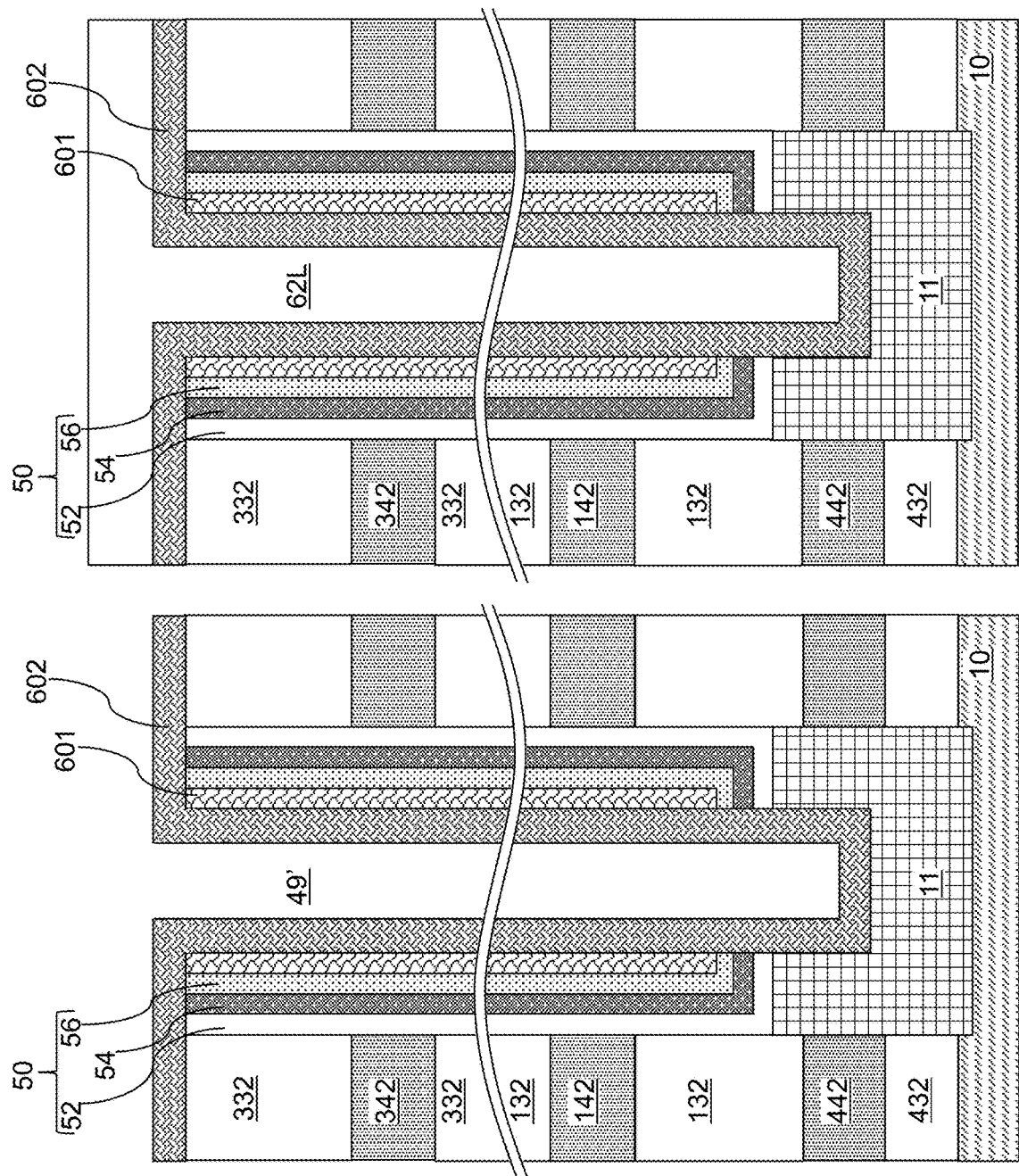

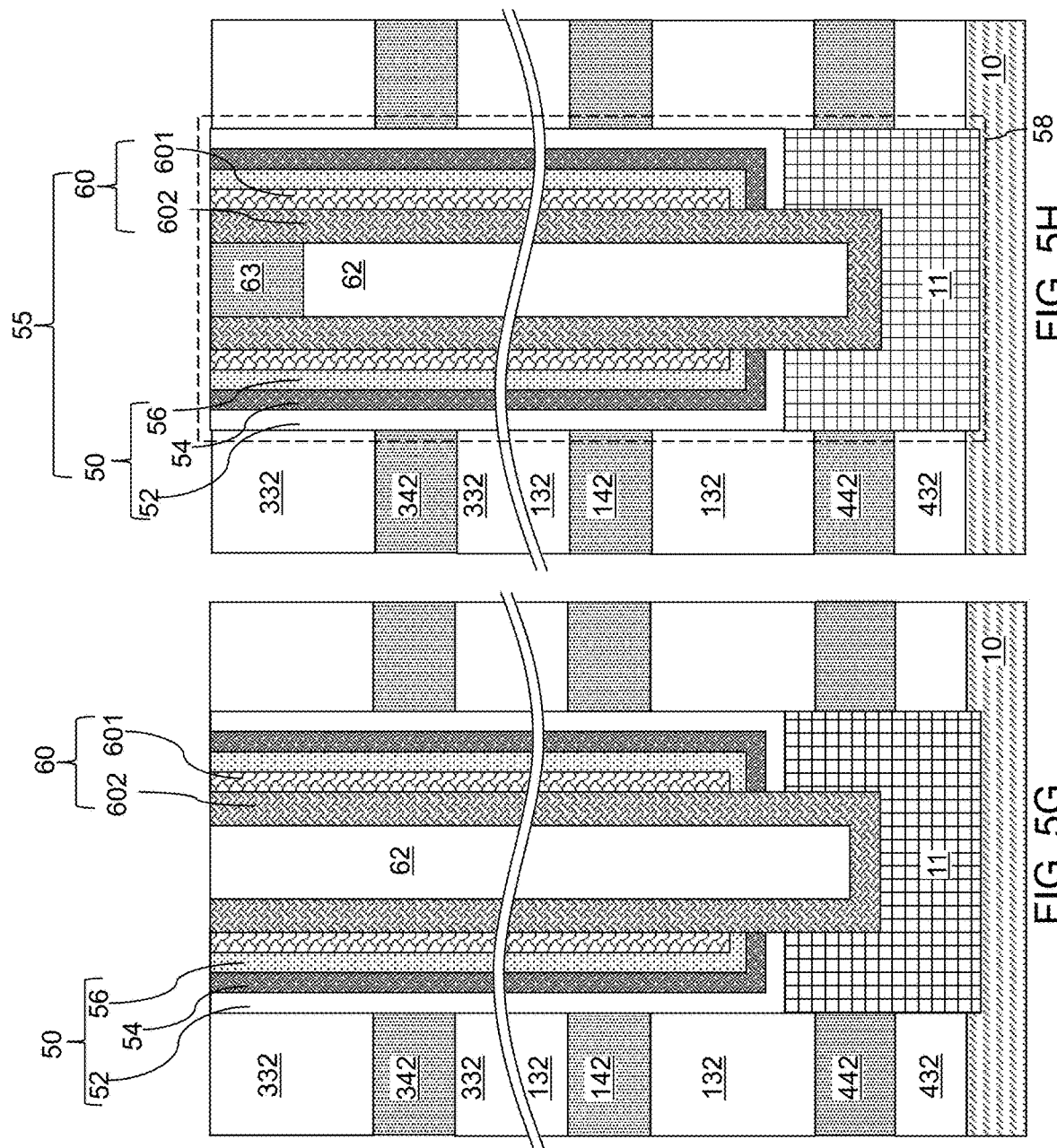

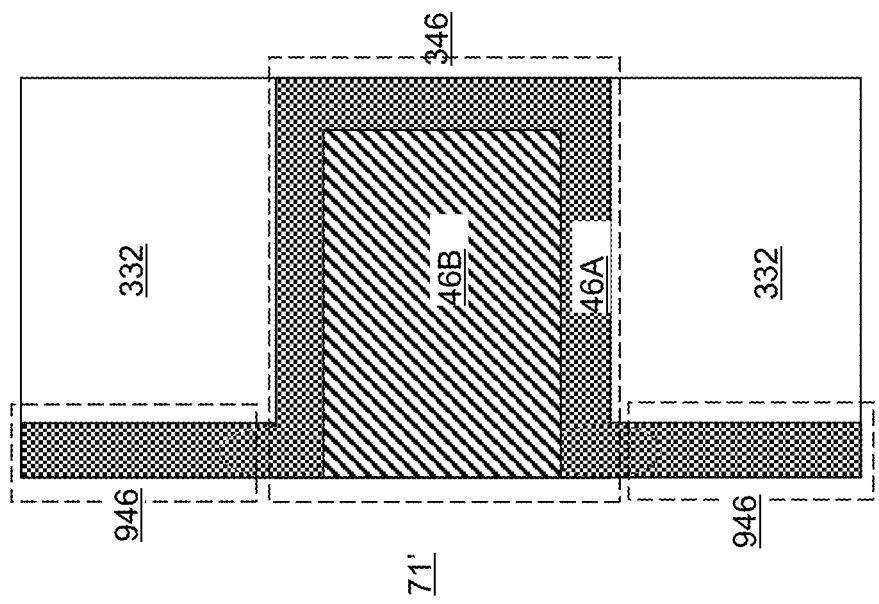

THREE-DIMENSIONAL MEMORY DEVICE INCLUDING COMPOSITE WORD LINES AND MULTI-STRIP SELECT LINES AND METHOD FOR MAKING THE SAME

FIELD

The present disclosure relates generally to the field of semiconductor devices, and particular to a three-dimensional memory device including composite word lines and laterally divided drain-select-level electrodes and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: a first alternating stack of insulating layers and electrically conductive layers located over a substrate; and memory stack structures extending through the first alternating stack; wherein: the electrically conductive layers comprise drain-select-level electrically conductive layers located in at least two different levels having different vertical distances from the substrate and laterally spaced apart as multiple groups that are electrically isolated from one another; each horizontal portion of the drain-select-level electrically conductive layers located between a vertically neighboring pair of insulating layers comprises a stack of a first electrically conductive material layer comprising a first electrically conductive material and a second electrically conductive material layer that does not contact any of the insulating layers and comprises a second electrically conductive material; and drain-select-level electrically conductive layers within each group selected from the multiple groups are electrically connected by at least one vertical conductive strip comprising the first electrically conductive material, wherein each of the drain-select-level electrically conductive layers contains an air gap at an end portion thereof.

According to another embodiment of the present disclosure, a method of forming a semiconductor structure is provided, which comprises: forming an alternating stack of insulating layers and sacrificial material layers over a substrate; forming memory stack structures through the alternating stack; forming drain-select-level trenches vertically extending through an upper subset of the sacrificial material layers; forming backside trenches vertically extending through each layer of the alternating stack; forming backside recesses by removing the sacrificial material layers selective to the insulating layers; depositing a first continuous electrically conductive material layer including a first electrically conductive material and a second continuous electrically conductive material layer including a second electrically conductive material in the backside recesses, the drain-select-level trenches, and the backside trenches; isotropically removing the first electrically conductive material and the second electrically conductive material from the backside trenches and from above a topmost one of the insulating layers by an isotropic recess etch process, wherein electrically conductive layers including remaining portions of the first and second continuous electrically conductive layers are formed in the backside recesses and in the drain-select-level trenches; anisotropically etching the second electrically conductive material in the drain-select-level cavities selective to the first material; and etching physically exposed portions of the first electrically conductive material from the drain-select-level cavities, wherein remaining portions of the electrically conductive layers include multiple groups of drain-select-level electrically conductive layers that are laterally spaced apart and electrically isolated from one another.

According to yet another embodiment of the present disclosure, a three-dimensional memory device comprises: a first alternating stack of insulating layers and electrically conductive layers located over a substrate; and memory stack structures extending through the first alternating stack; wherein: the electrically conductive layers comprise drain-select-level electrically conductive layers located in at least two different levels having different vertical distances from the substrate and laterally spaced apart as multiple groups that are electrically isolated from one another; the electrically conductive layers further comprise word-line-level electrically conductive layers that underlie the drain-select-level electrically conductive layers and include a respective pair of sidewalls that laterally extend along a first horizontal direction; each of the word-line-level electrically conductive layers comprises a respective first electrically conductive material layer including a first electrically conductive material and a respective second electrically conductive material layer comprising a second electrically conductive material that is different from the first electrically conductive material and formed within the respective first electrically conductive material layer; and each of the drain-select-level electrically conductive layers consists essentially of the first electrically conductive material.

A method of forming a semiconductor structure is provided, which comprises: forming an alternating stack of insulating layers and sacrificial material layers over a substrate, wherein the sacrificial material layers comprise word-line-level sacrificial material layers and drain-select-level sacrificial material layers that overlie the word-line-level sacrificial material layers and have a lesser thickness than the word-line-level sacrificial material layers; forming memory stack structures through the alternating stack; forming drain-select-level trenches through an upper subset of the sacrificial material layers; forming backside trenches through each layer of the alternating stack; forming word-line-level backside recesses and drain-select-level backside recesses by removing the word-line-level sacrificial material layers and the drain-select-level sacrificial material layers, respectively; depositing a first continuous electrically conductive material layer including a first electrically conductive material to fill all volumes of the drain-select-level backside recesses and to partially fill volumes of the drain-select-level backside recesses; depositing a second continuous electrically conductive material layer including a second electrically conductive material in unfilled volumes of the word-line-level backside recesses; and removing at least partially portions of the second electrically conductive material and the first electrically conductive material from the drain-select-level trenches, wherein drain-select-level electrically conductive layers are provided in volumes of the drain-select-level backside recesses as multiple groups that are laterally spaced apart and electrically isolated from one another.

BRIEF DESCRIPTION OF THE DRAWINGS

FIG. 4B is a top-down view of the first exemplary structure of FIG. 4A. The vertical plane A-A' is the plane of the cross-section for FIG. 4A.

FIGS. 5A-5H are sequential schematic vertical cross-sectional views of a memory opening within the first exemplary structure during formation of a memory stack structure, an optional dielectric core, and a drain region therein according to the first embodiment of the present disclosure.

FIG. 14B is a magnified view of the first exemplary structure of FIG. 14A around an encapsulated cavity.

DETAILED DESCRIPTION

Figure 1:
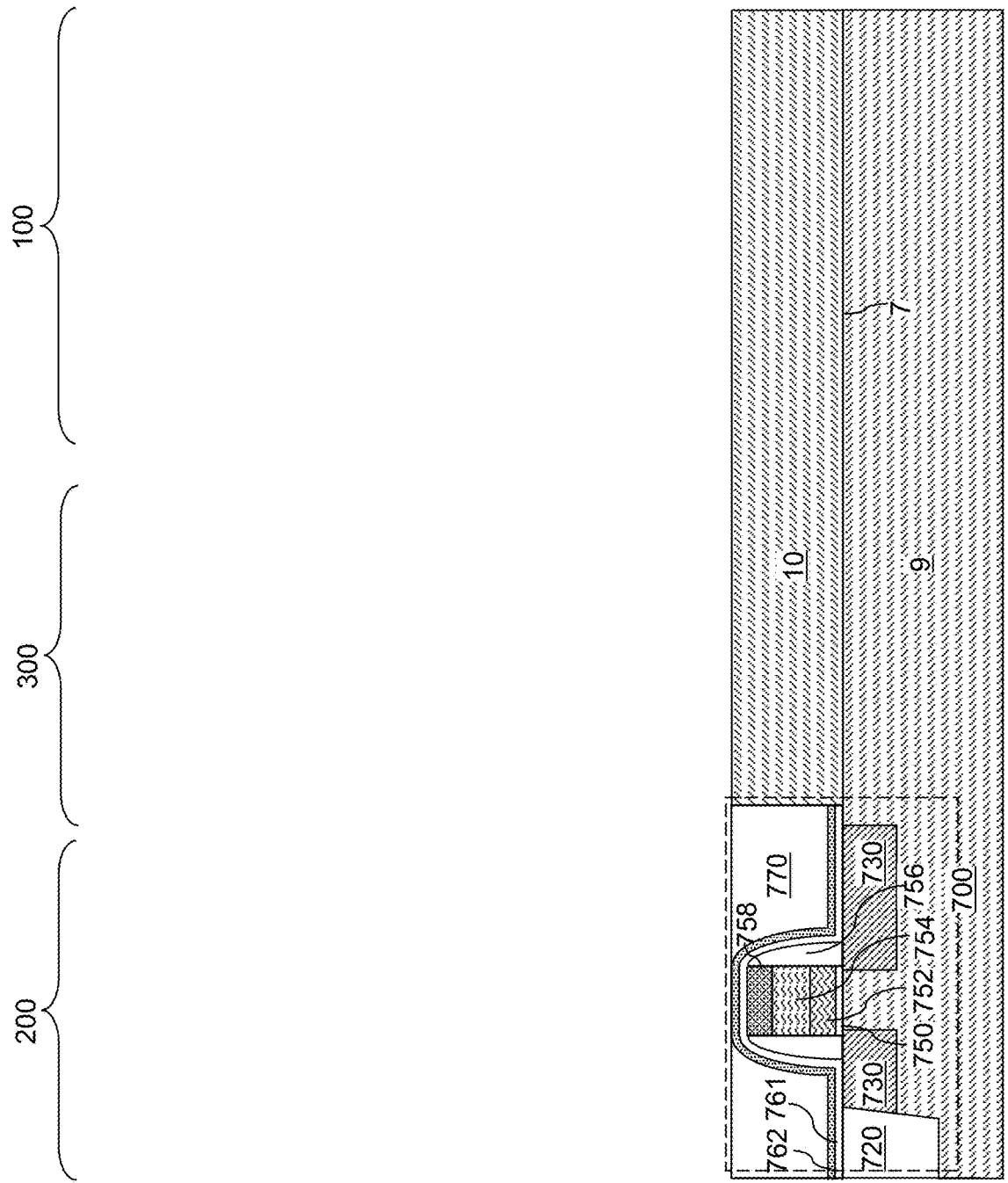
FIG. 1 is a schematic vertical cross-sectional view of a first exemplary structure after formation of at least one peripheral device and a semiconductor material layer according to a first embodiment of the present disclosure.

As discussed above, various embodiments of the present disclosure are directed to a three-dimensional memory device including composite word lines and laterally divided drain-select-level electrodes and methods of manufacturing the same, the various embodiments of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to an embodiment of the present disclosure is illustrated, which may be used, for example, to fabricate a device structure containing vertical NAND memory devices. The first exemplary structure includes a substrate (9, 10), which may be a semiconductor substrate. The substrate may include a substrate semiconductor layer 9 and an optional semiconductor material layer 10. The substrate semiconductor layer 9 maybe a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The at least one semiconductor device 700 for the peripheral circuitry may contain a driver circuit for memory devices to be subsequently formed, which may include at least one NAND device.

A dielectric material such as silicon oxide may be deposited over the at least one semiconductor device 700, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, may be formed on the top surface of the substrate semiconductor layer 9 prior to, or after, formation of the at least one semiconductor device 700 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the substrate semiconductor layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200.

Figure 2:
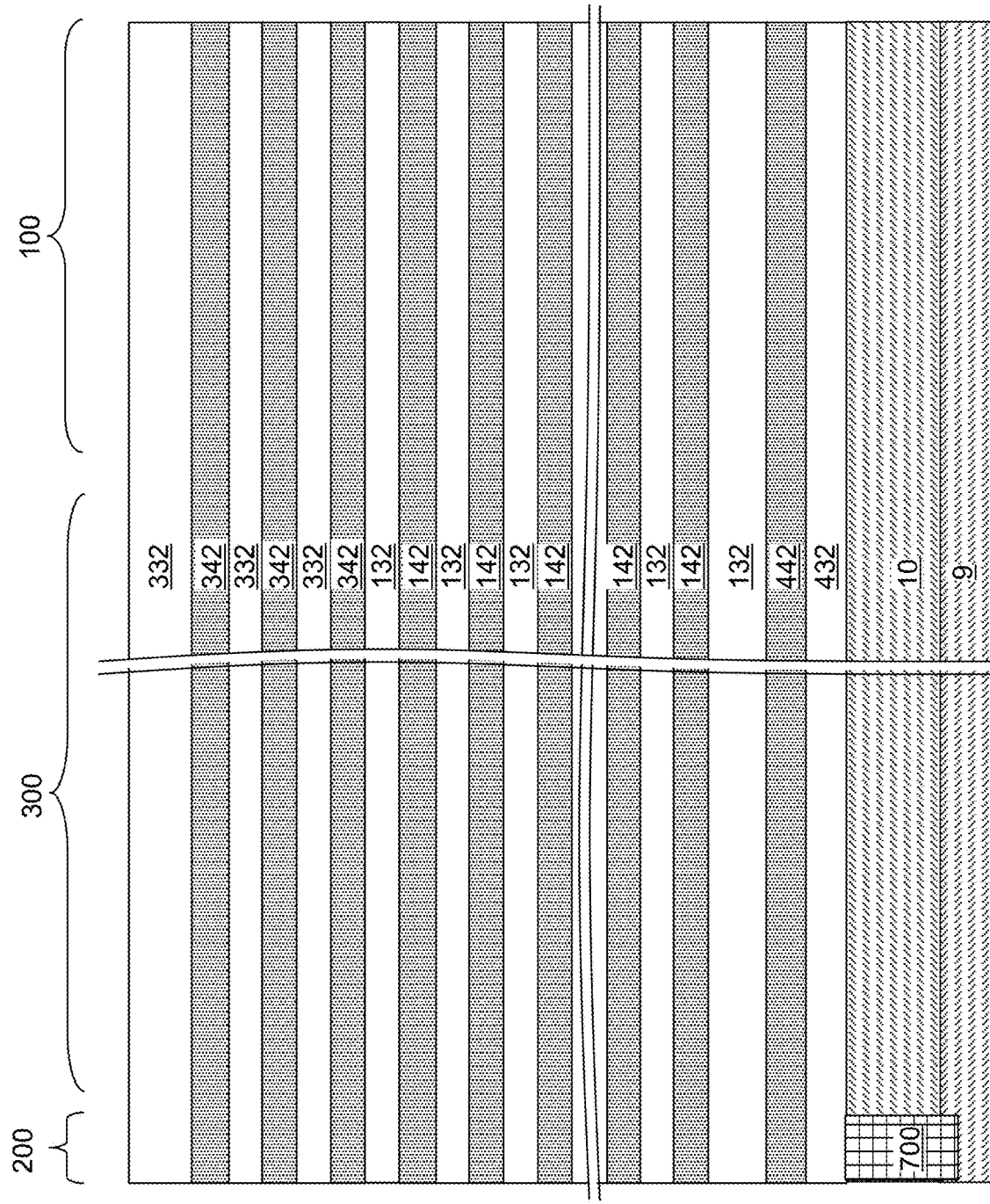
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers and second material layers is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer, and each second material layer may be a sacrificial material layer. In this case, the stack may include an alternating plurality of insulating layers and sacrificial material layers, and constitutes a prototype stack of alternating layers comprising insulating layers and sacrificial material layers. The insulating layers include a source-select-level insulating layer 432 contacting a top surface of the semiconductor material layer 10, word-line-level insulating layers 132 located between the source-select-level insulating layer 432 and a bottommost one of drain-select-level sacrificial material layers 342, and drain-select-level insulating layers 332 located above the bottommost one of the drain-select-level sacrificial material layers 342. The sacrificial material layers include a source-select-level sacrificial material layer 442 contacting a top surface of the source-select-level insulating layer 432, word-line-level sacrificial material layers 142 located between the source-select-level sacrificial material layer 442 and a bottommost one of the drain-select-level insulating layers 332, and drain-select-level sacrificial material layers 342 located above the topmost one of the word-line-level insulating layers 132.

The source-select-level sacrificial material layer 442 may be formed at the level at which a source-select-level electrically conductive layer is subsequently formed. The source-select-level electrically conductive layer may be subsequently used to select a group of memory stack structures to be activated. The drain-select-level sacrificial material layers 342 may be formed at levels at which drain-select-level electrically conductive layers are to be subsequently formed. The drain-select-level electrically conductive layers may be subsequently used to select a cluster of memory stack structures to be activated. The total number of drain-select-level sacrificial material layers 342 may be in a range from 1 to 8, such as from 2 to 4. Each group of memory stack structures may include at least two clusters of memory stack structures. A total number of clusters in each group may be in a range from 2 to 16. The word-line-level sacrificial material layers 142 may be formed at levels at which word-line-level electrically conductive layers are to be subsequently formed. The word-line-level electrically conductive layers function as word lines and gate electrodes for memory elements in the memory stack structures that are to be subsequently formed.

The stack of the alternating plurality is herein referred to as an alternating stack {(432, 132, 332), (442, 142, 342)}. In one embodiment, the alternating stack {(432, 132, 332), (442, 142, 342)} may include insulating layers (432, 132, 332) composed of the first material, and sacrificial material layers (442, 142, 342) composed of a second material different from the first material. The first material of the insulating layers (432, 132, 332) may be at least one insulating material. As such, each insulating layer (432, 132, 332) may be an insulating material layer. Insulating materials that may be used for the insulating layers (432, 132, 332) include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers (432, 132, 332) may be silicon oxide.

The second material of the sacrificial material layers (442, 142, 342) may be a sacrificial material that may be removed selective to the first material of the insulating layers (432, 132, 332). As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers (442, 142, 342) may comprise an insulating material, a semiconductor material, or a conductive material. The second material of the sacrificial material layers (442, 142, 342) may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers (442, 142, 342) may be spacer material layers that comprise silicon nitride or a semiconductor material including at least one of silicon and germanium.

In one embodiment, the insulating layers (432, 132, 332) may include silicon oxide, and sacrificial material layers (442, 142, 342) may include silicon nitride. The first material of the insulating layers (432, 132, 332) may be deposited, for example, by chemical vapor deposition (CVD). For example, if silicon oxide is used for the insulating layers (432, 132, 332), tetraethyl orthosilicate (TEOS) may be used as the precursor material for the CVD process. The second material of the sacrificial material layers (442, 142, 342) may be formed, for example, CVD or atomic layer deposition (ALD).

The sacrificial material layers (442, 142, 342) may be suitably patterned so that conductive material portions that are to be subsequently formed by replacement of the sacrificial material layers (442, 142, 342) may function as electrically conductive electrodes, such as the control gate electrodes of the monolithic three-dimensional NAND string memory devices to be subsequently formed. The sacrificial material layers (442, 142, 342) may comprise a portion having a strip shape extending substantially parallel to the major surface 7 of the substrate.

The thicknesses of the insulating layers (432, 132, 332) and the sacrificial material layers (442, 142, 342) may be in a range from 20 nm to 50 nm, although lesser and greater thicknesses may be used for each insulating layer (432, 132, 332) and for each sacrificial material layer (442, 142, 342). The number of repetitions of the pairs of an insulating layer (432, 132, 332) and a sacrificial material layer (442, 142, 342) may be in a range from 2 to 1,024, and typically from 8 to 256, although a greater number of repetitions may also be used. The top and bottom gate electrodes in the stack may function as the select gate electrodes. In one embodiment, each sacrificial material layer (442, 142, 342) in the alternating stack {(432, 132, 332), (442, 142, 342)} may have a uniform thickness that is substantially the same within each respective sacrificial material layer (442, 142, 342).

Figure 3:
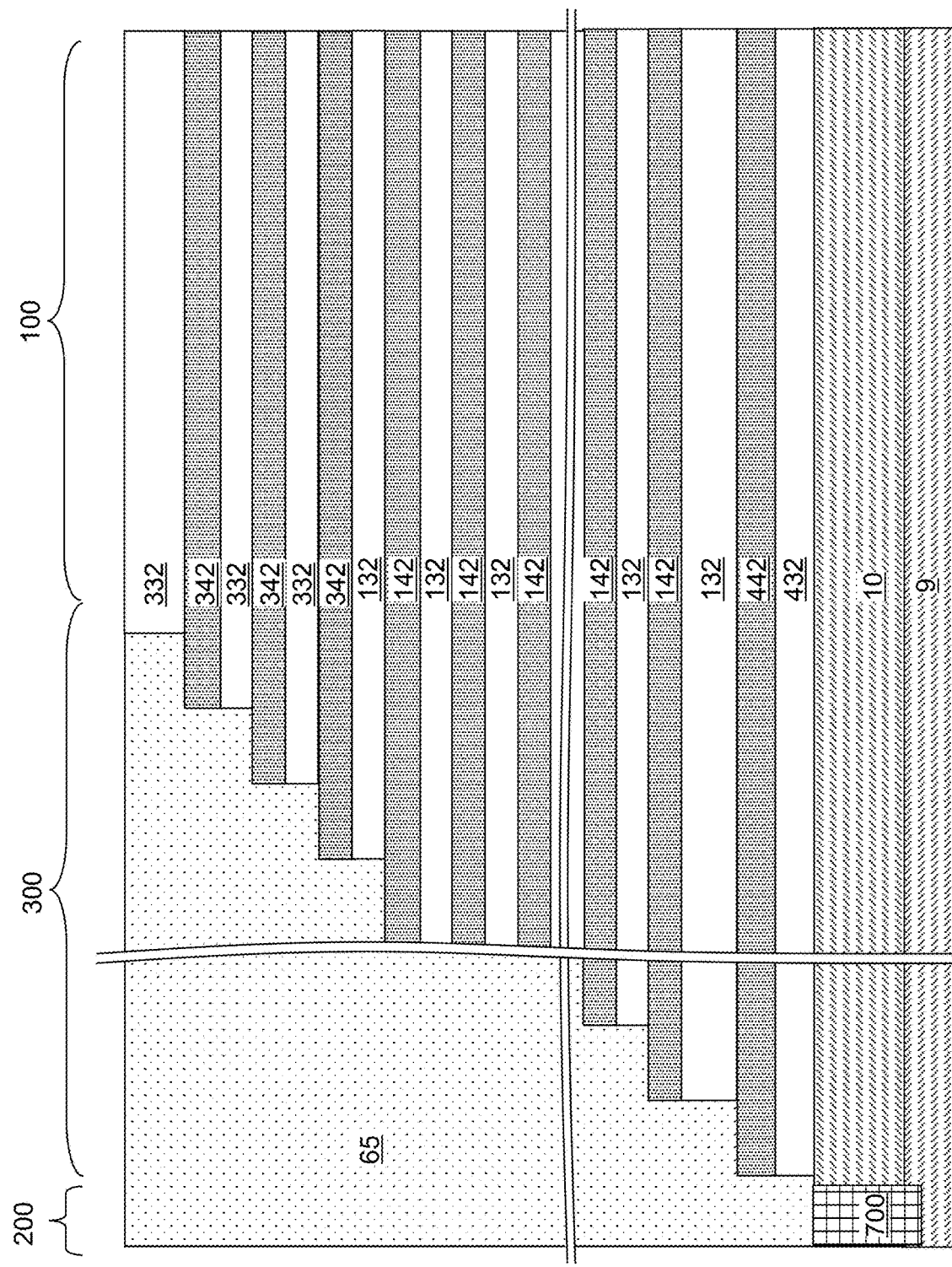
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces may be formed within the staircase region 300 adjacent to a peripheral device region 200 of the alternating stack {(432, 132, 332), (442, 142, 342)}, which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity may be formed within the volume from which portions of the alternating stack {(432, 132, 332), (442, 142, 342)} are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device 700 for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer (442, 142, 342) other than a topmost sacrificial material layer 342 within the alternating stack {(432, 132, 332), (442, 142, 342)} laterally extends farther than any overlying sacrificial material layer (442, 142, 342) within the alternating stack {(432, 132, 332), (442, 142, 342)} in the terrace region. The terrace region includes stepped surfaces of the alternating stack {(432, 132, 332), (442, 142, 342)} that continuously extend from a bottommost layer within the alternating stack {(432, 132, 332), (442, 142, 342)} to a topmost layer within the alternating stack {(432, 132, 332), (442, 142, 342)}.

Each vertical step of the stepped surfaces may have the height of one or more pairs of an insulating layer (432, 132, 332) and a word-line-level sacrificial material layer. In one embodiment, each vertical step may have the height of a single pair of an insulating layer (432, 132, 332) and a word-line-level sacrificial material layer (442, 142, 342). In another embodiment, multiple "columns" of staircases may be formed along a first horizontal direction hd1 such that each vertical step has the height of a plurality of pairs of an insulating layer (432, 132, 332) and a word-line-level sacrificial material layer (442, 142, 342), and the number of columns may be at least the number of the plurality of pairs. Each column of staircase may be vertically offset from one another such that each of the sacrificial material layers (442, 142, 342) has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers (442, 142, 342) (as counted from the bottom) and another column of staircases provide physically exposed top surfaces for even-numbered word-line-level sacrificial material layers (as counted from the bottom). Configurations using three, four, or more columns of staircases with a respective set of vertical offsets from the physically exposed surfaces of the sacrificial material layers (442, 142, 342) may also be used. Each word-line-level sacrificial material layer (442, 142, 342) has a greater lateral extent, at least along one direction, than any overlying sacrificial material layers (442, 142, 342) such that each physically exposed surface of any word-line-level sacrificial material layer (442, 142, 342) does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the topmost drain-select-level insulating layer 332, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Figure 4A:
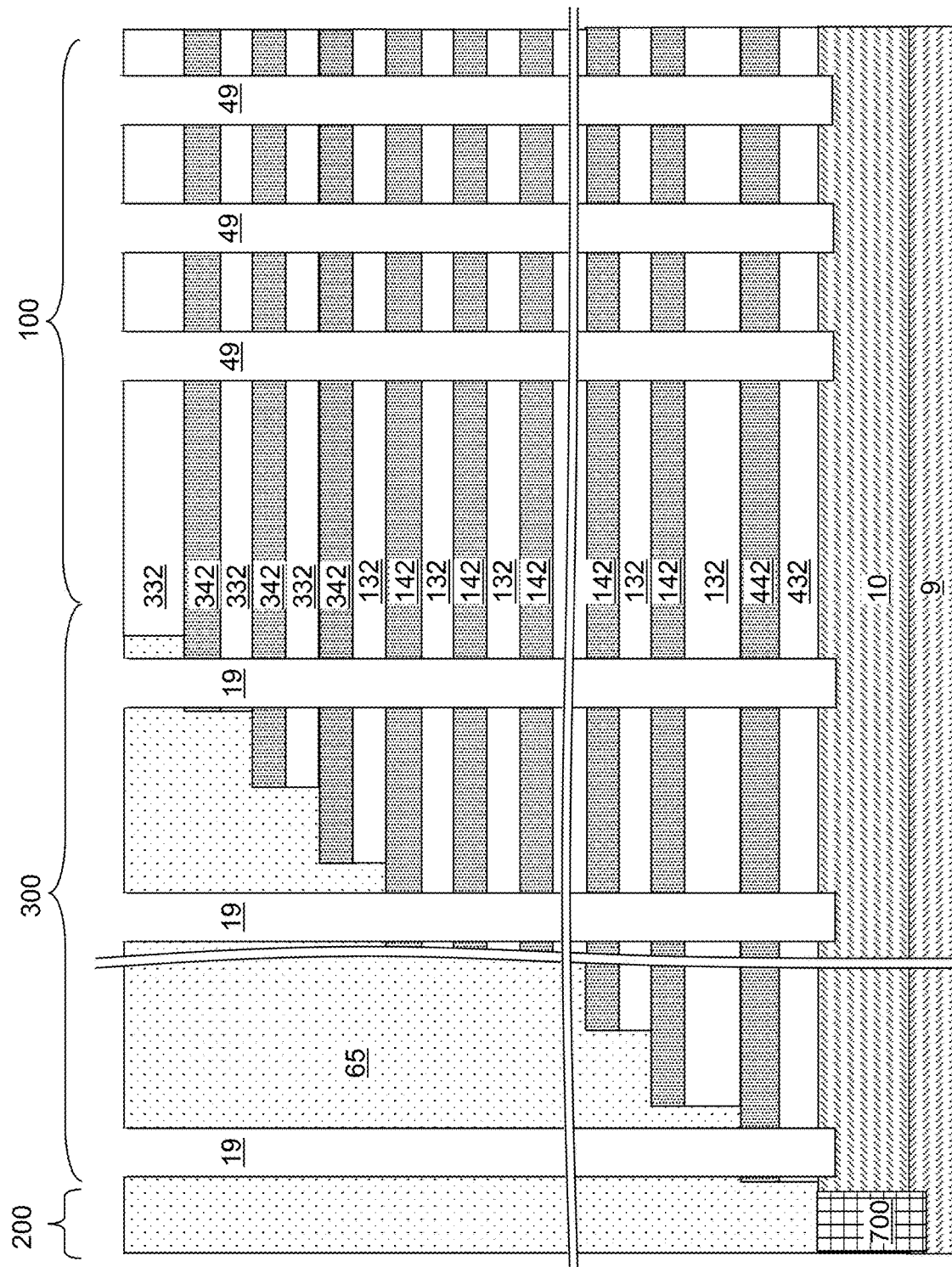
FIG. 4A is a schematic vertical cross-sectional view of the first exemplary structure after formation of memory openings and support openings according to an embodiment of the present disclosure.

Referring to FIGS. 4A and 4B, a lithographic material stack (not shown) including at least a photoresist layer may be formed over the topmost drain-select-level insulating layer 332 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the topmost drain-select-level insulating layer 332 or the retro-stepped dielectric material portion 65, and through the alternating stack {(432, 132, 332), (442, 142, 342)} by at least one anisotropic etch that uses the patterned lithographic material stack as an etch mask. Portions of the alternating stack {(432, 132, 332), (442, 142, 342)} underlying the openings in the patterned lithographic material stack are etched to form memory openings 49 and support openings 19. As used herein, a "memory opening" refers to a structure in which memory elements, such as a memory stack struc-ture, is subsequently formed. As used herein, a "support opening" refers to a structure in which a support structure (such as a support pillar structure) that mechanically supports other elements is subsequently formed. The memory openings 49 are formed through the topmost drain-select-level insulating layer 332 and the entirety of the alternating stack {(432, 132, 332), (442, 142, 342)} in the memory array region 100. The support openings 19 are formed through the retro-stepped dielectric material portion 65 and the portion of the alternating stack {(432, 132, 332), (442, 142, 342)} that underlie the stepped surfaces in the staircase region 300.

The memory openings 49 extend through the entirety of the alternating stack {(432, 132, 332), (442, 142, 342)}. The support openings 19 extend through a subset of layers within the alternating stack {(432, 132, 332), (442, 142, 342)}. The chemistry of the anisotropic etch process used to etch through the materials of the alternating stack {(432, 132, 332), (442, 142, 342)} may alternate to optimize etching of the first and second materials in the alternating stack {(432, 132, 332), (442, 142, 342)}. The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack {(432, 132, 332), (442, 142, 342)} to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 may extend through the topmost drain-select-level insulating layer 332, the alternating stack {(432, 132, 332), (442, 142, 342)}, and optionally into an upper portion of the semiconductor material layer 10. At this processing step, each support opening 19 may extend through the retro-stepped dielectric material portion 65, a subset of layers in the alternating stack {(432, 132, 332), (442, 142, 342)}, and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers (442, 142, 342) may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 may comprise a single crystalline semiconductor material in epitaxial alignment with the single crystalline semiconductor material of the semiconductor material layer 10. In one embodiment, the top surface of each pedestal channel portion 11 may be formed above a horizontal plane including the top surface of a source-select-level sacrificial material layer 442. In this case, a source select gate electrode may be subsequently formed by replacing the source-select-level sacrificial material layer 442 with a conductive material layer. The pedestal channel portion 11 may be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Figure 5C:
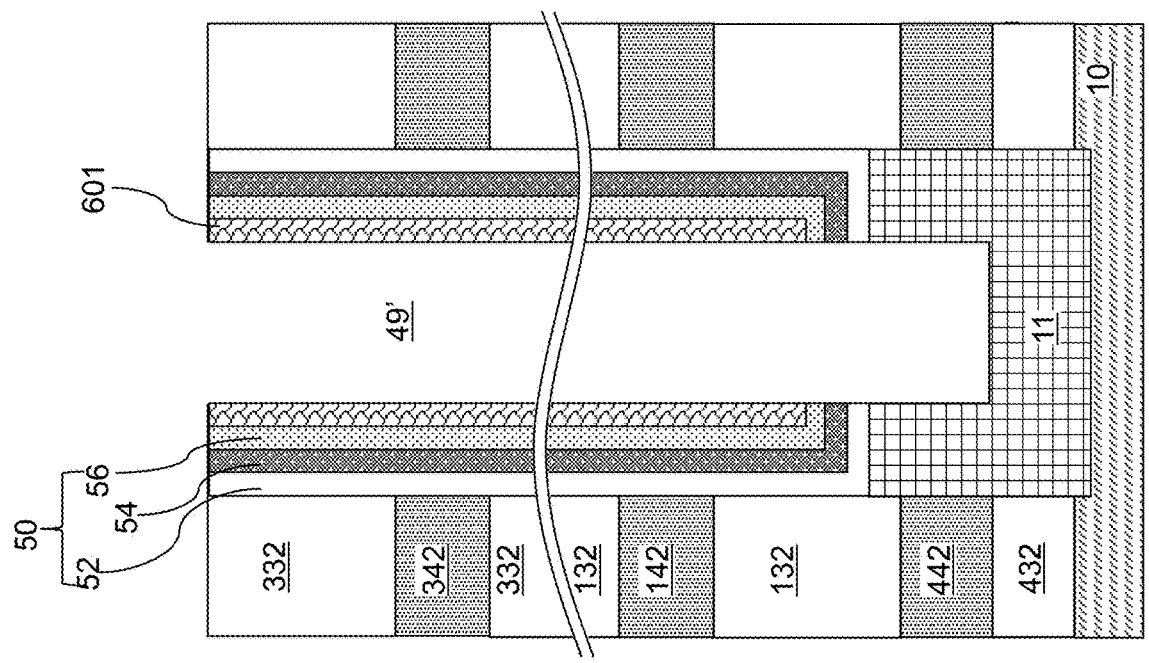

Referring to FIG. 5C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides may include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively, or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (442, 142, 342). In one embodiment, the charge storage layer 54 includes a silicon nitride layer. In one embodiment, the sacrificial material layers (442, 142, 342) and the insulating layers (432, 132, 332) may have vertically coincident sidewalls, and the charge storage layer 54 may be formed as a single continuous layer.

In another embodiment, the sacrificial material layers (442, 142, 342) may be laterally recessed with respect to the sidewalls of the insulating layers (432, 132, 332), and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively, or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 may include a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 may include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 may include amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A memory cavity 49' may be formed in the volume of each memory opening 49 that is not filled with the deposited material layers (52, 54, 56, 601).

Figure 5D:
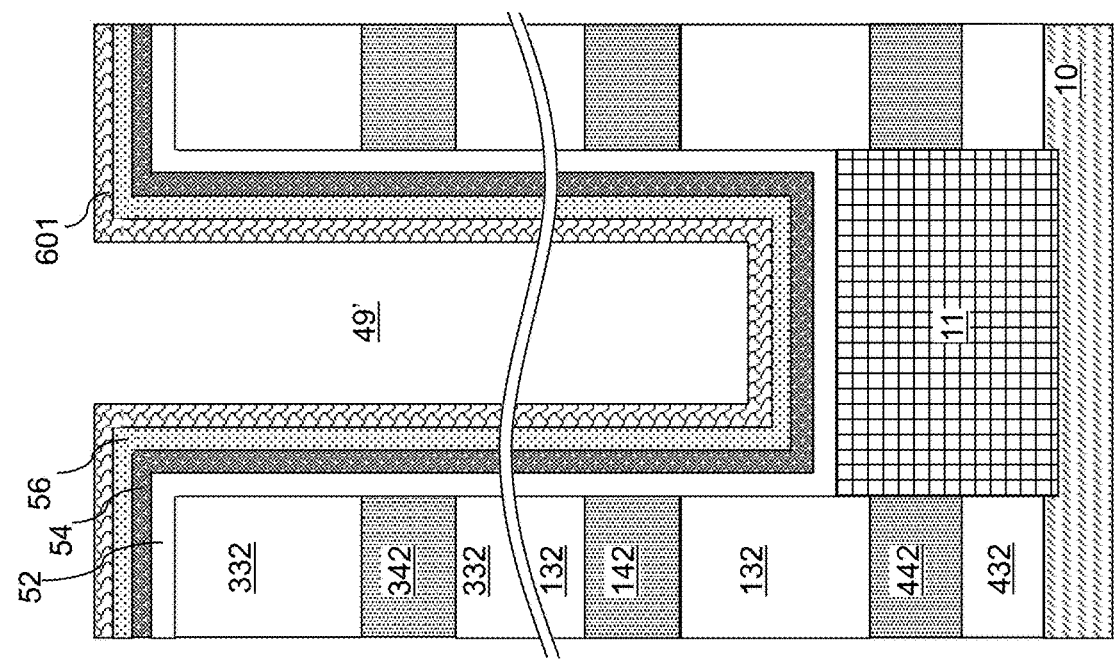

Referring to FIG. 5D, the optional first semiconductor channel layer 601, the tunneling dielectric layer 56, the charge storage layer 54, and the blocking dielectric layer 52 may be sequentially anisotropically etched using at least one anisotropic etch process. The portions of the first semiconductor channel layer 601, the tunneling dielectric layer 56, the charge storage layer 54, and the blocking dielectric layer 52 located above the top surface of the topmost drain-select-level insulating layer 332 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process using a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers (442, 142, 342) constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor material layer 10 in case pedestal channel portions 11 are not used) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Referring to FIG. 5E, a second semiconductor channel layer 602 may be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 may include a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 may include amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L may include a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 5G, the horizontal portion of the dielectric core layer 62L may be removed, for example, by a recess etch from above the top surface of the topmost drain-select-level insulating layer 332. Each remaining portion of the dielectric core layer 62L constitutes a dielectric core 62. Further, the horizontal portion of the second semiconductor channel layer 602 located above the top surface of the topmost drain-select-level insulating layer 332 may be removed by a planarization process, which may use a recess etch or chemical mechanical planarization (CMP). Each remaining portion of the second semiconductor channel layer 602 may be located entirety within a memory opening 49 or entirely within a support opening 19.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 may be further recessed within each memory opening, for example, by a recess etch to a depth that is located between the top surface of the topmost drain-select-level insulating layer 332 and the bottom surface of the topmost drain-select-level insulating layer 332. Drain regions 63 may be formed by depositing a doped semiconductor material within each recessed region above the dielectric cores 62. The drain regions 63 may have a doping of a second conductivity type that is the opposite of the first conductivity type. For example, if the first conductivity type is p-type, the second conductivity type is n-type, and vice versa. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon. Excess portions of the deposited semiconductor material may be removed from above the top surface of the topmost drain-select-level insulating layer 332, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements, which may comprise portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6A:
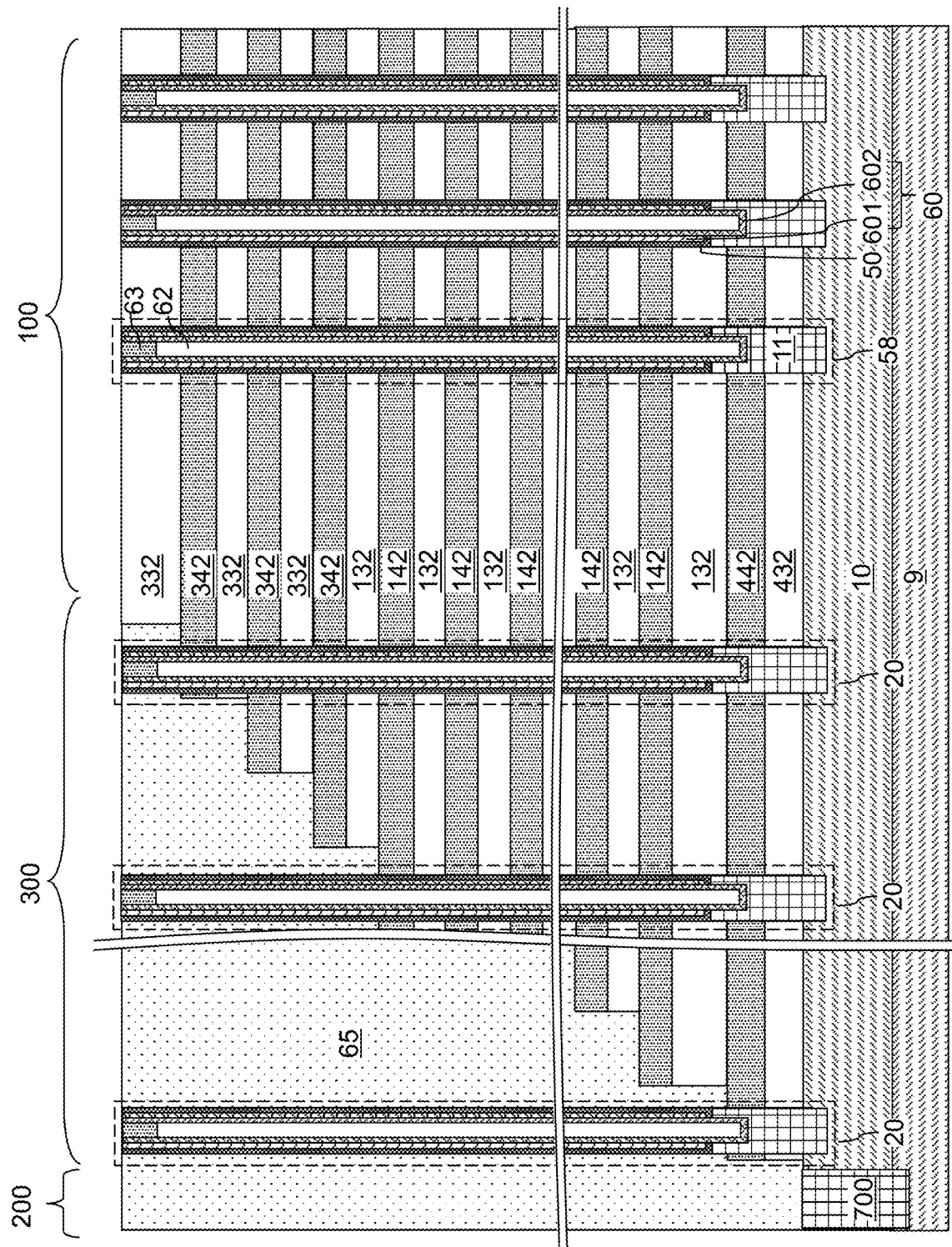
FIG. 6A is a schematic vertical cross-sectional view of the first exemplary structure after formation of memory stack structures and support pillar structures according to an embodiment of the present disclosure.
Figure 6B:
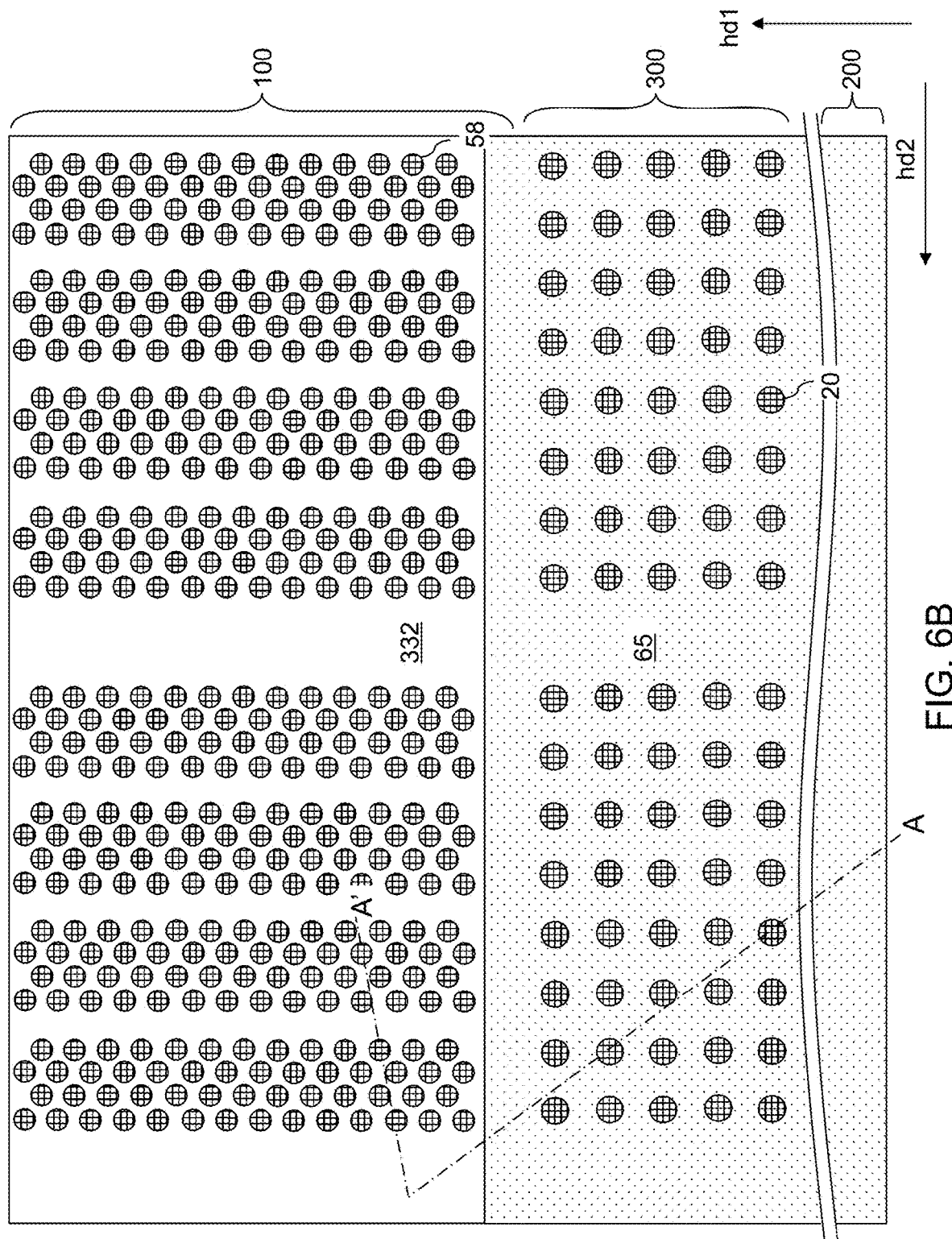
FIG. 6B is a top-down view of the first exemplary structure of FIG. 6A.

Referring to FIGS. 6A and 6B, the first exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (comprising a charge storage layer 54) laterally surrounding the tunneling dielectric layer 56, and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the vertical semiconductor channel 60.

Figure 7A:
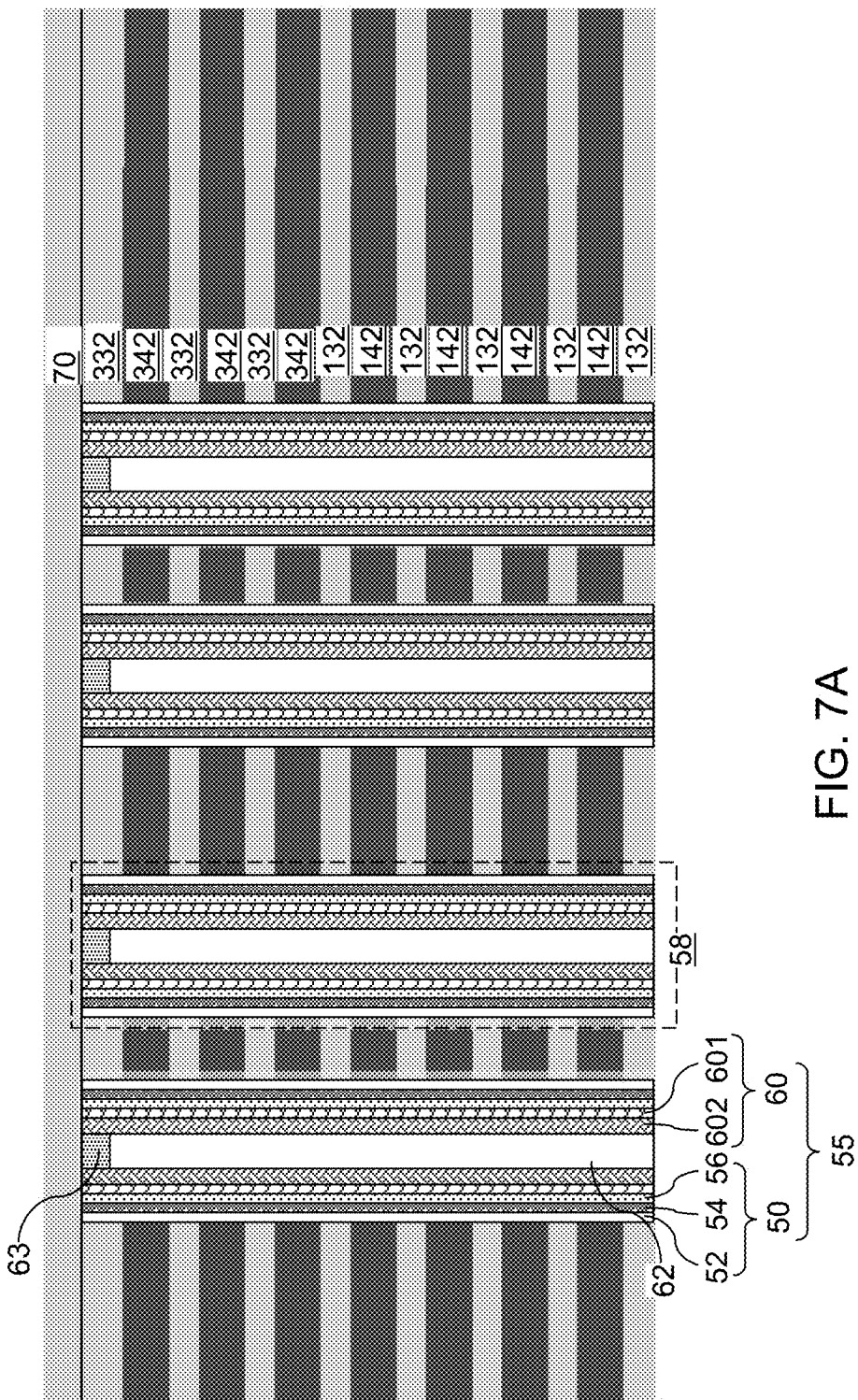
FIG. 7A is a schematic vertical cross-sectional view of the first exemplary structure after formation of a contact-level dielectric layer according to an embodiment of the present disclosure.
Figure 7B:
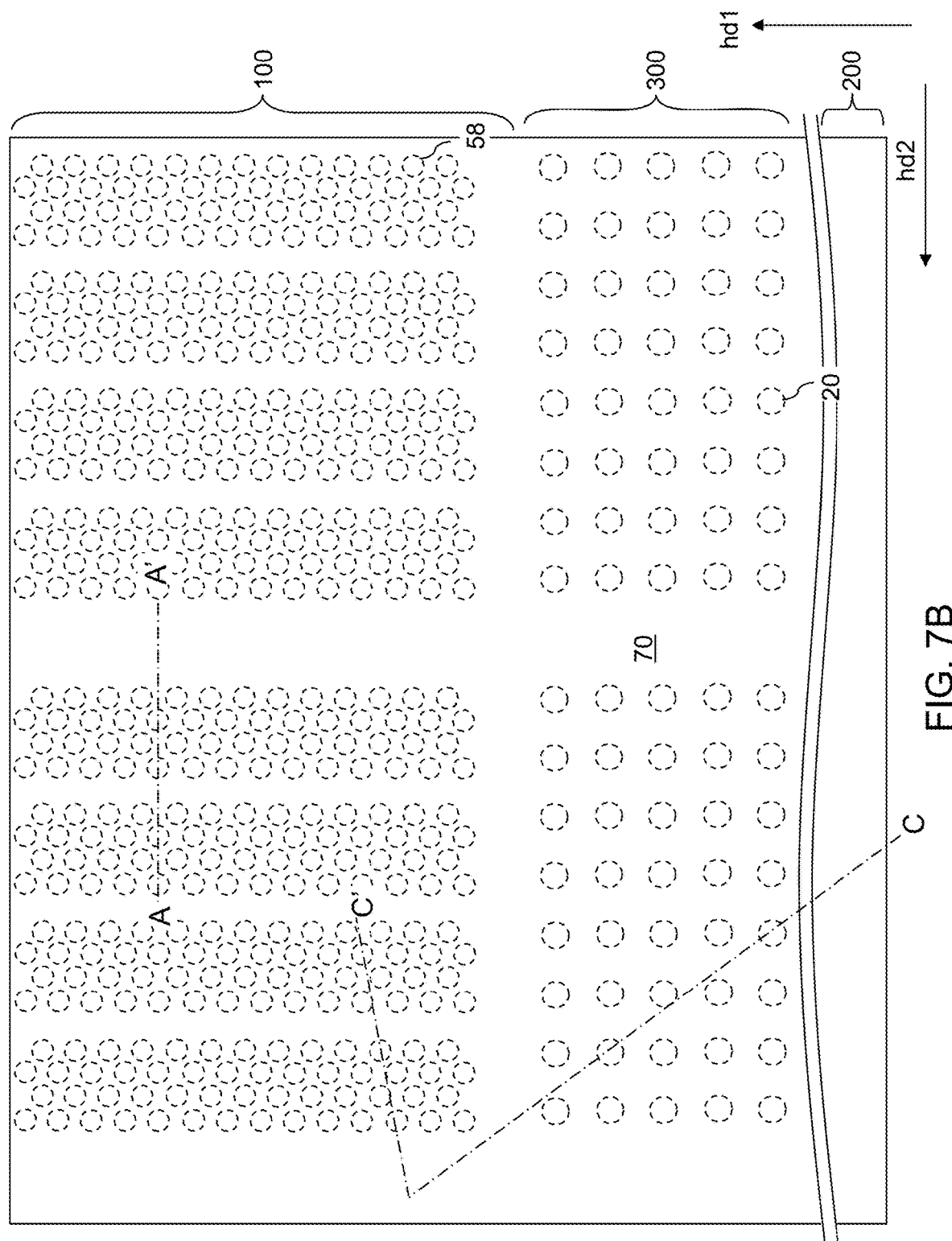
FIG. 7B is a partial see-through top-down view of the first exemplary structure of FIG. 7A. The vertical plane A-A' is the plane of the schematic vertical cross-sectional view of FIG. 7A.
Figure 7C:
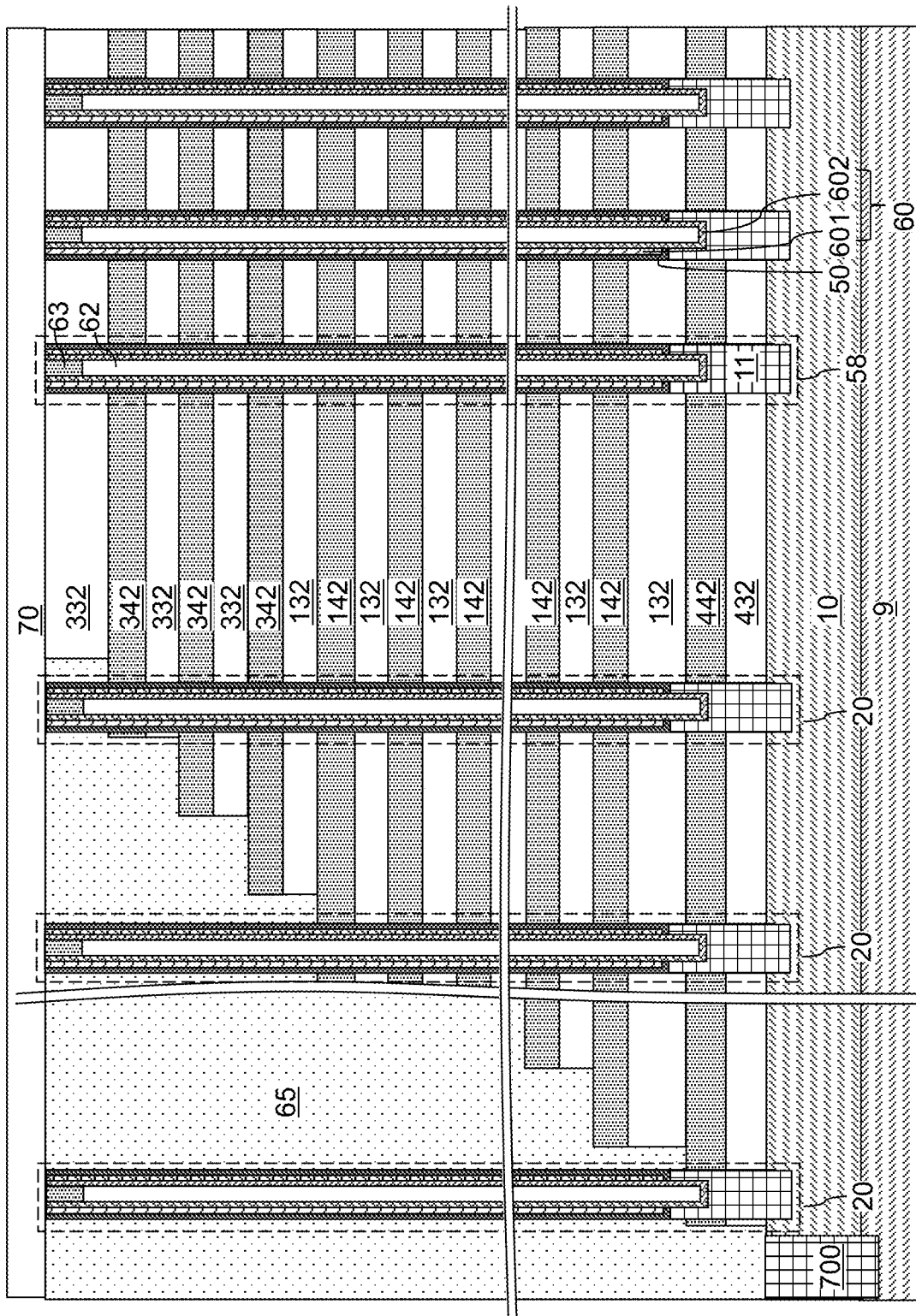
FIG. 7C is a schematic vertical cross-sectional view of the first exemplary structure along the hinged vertical plane C-C' of FIG. 7B.

Referring to FIGS. 7A-7C, a contact-level dielectric layer 70 may be formed over the alternating stack {(432, 132, 332), (442, 142, 342)} of insulating layer (432, 132, 332) and sacrificial material layers (442, 142, 342), and over the memory stack structures 55 and the support pillar structures 20. The contact-level dielectric layer 70 may include a dielectric material that is different from the dielectric material of the sacrificial material layers (442, 142, 342). For example, the contact-level dielectric layer 70 may include silicon oxide. The contact-level dielectric layer 70 may have a thickness in a range from 50 nm to 500 nm, although lesser and greater thicknesses may also be used.

Figure 8A:
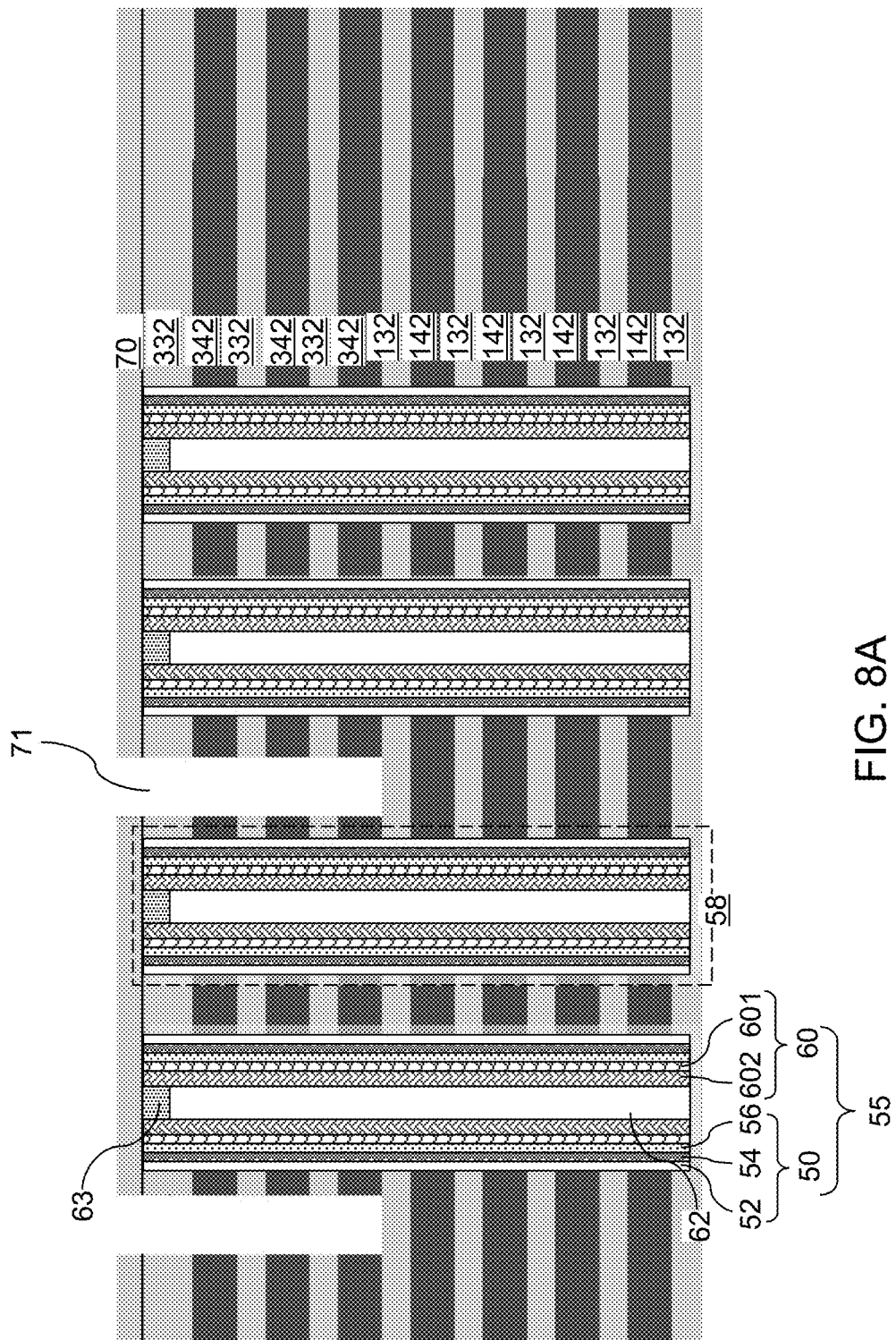
FIG. 8A is a schematic vertical cross-sectional view of the first exemplary structure after formation of drain-select-level trenches according to an embodiment of the present disclosure.
Figure 8B:
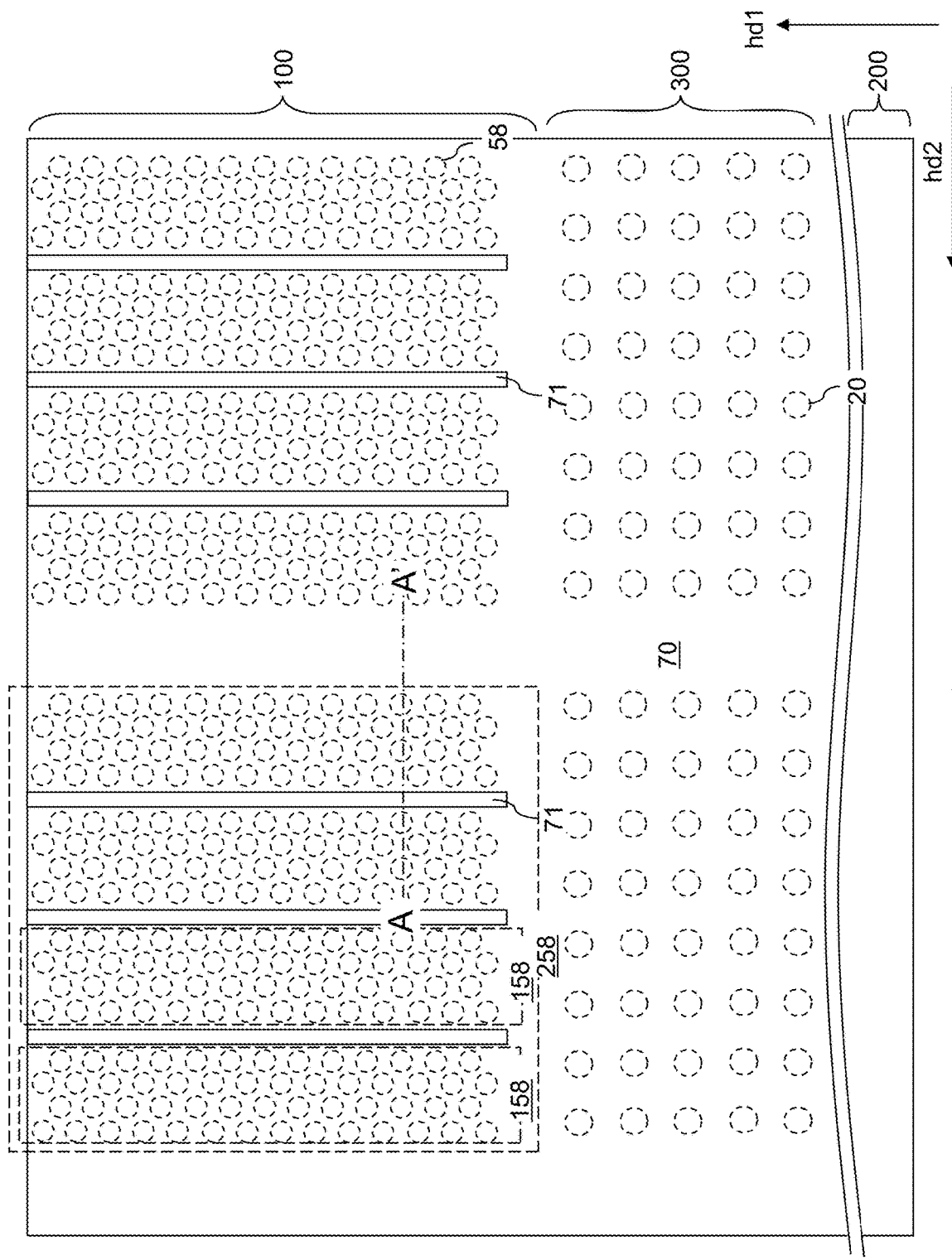
FIG. 8B is a partial see-through top-down view of the first exemplary structure of FIG. 8A. The vertical plane A-A' is the plane of the schematic vertical cross-sectional view of FIG. 8A.

Referring to FIGS. 8A and 8B, a first photoresist layer (not shown) may be applied over the contact-level dielectric layer 70, and may be lithographically patterned to form narrow openings that extend along the first horizontal direction hd1 between clusters 158 of memory stack structures 55. Multiple clusters 158 of memory stack structures 55 may be positioned in proximity from one another to define a group 258 of memory stack structures 55. The groups 258 of memory stack structures 55 may be laterally spaced from one another by a respective strip-shaped space that is free of memory stack structures 55 and support pillar structures 20.

An anisotropic etch process may be performed to transfer the pattern of the openings in the photoresist layer through the contact-level dielectric layer 70, each drain-select-level insulating layer 332, and each drain-select-level sacrificial material layer 342 of the alternating stack {(432, 132, 332), (442, 142, 342)}. Drain-select-level trenches 71 may be formed through the drain-select-level layers (332, 342) of the alternating stack {(432, 132, 332), (442, 142, 342)}. Each drain-select-level trench 71 may be formed between a neighboring pair of clusters 158 of memory stack structures 55. Each drain-select-level trench 71 may laterally extend along the first horizontal direction hd1 with a uniform width along the second horizontal direction. In one embodiment, each drain-select-level trench 71 may be laterally spaced from the memory stack structures 55 to avoid cutting through portions of the memory stack structures 55. Each drain-select-level trench 71 may include a pair of lengthwise sidewalls that are parallel to the first horizontal direction hd1. Each sidewall of the drain-select-level trenches 71 may be straight sidewalls. The first photoresist layer may be subsequently removed, for example, by ashing.

Figure 9A:
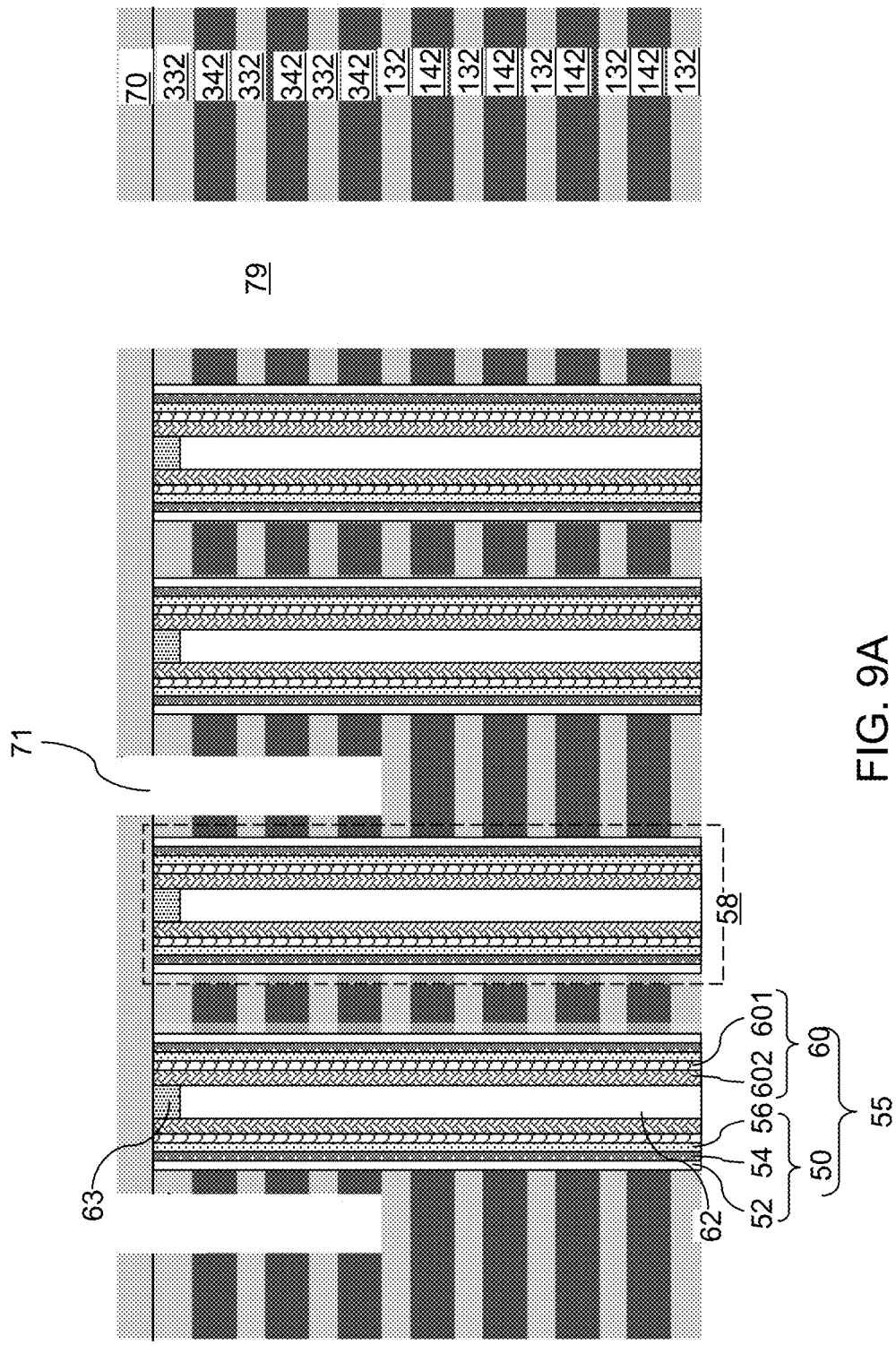
FIG. 9A is a schematic vertical cross-sectional view of the first exemplary structure after formation of backside trenches according to an embodiment of the present disclosure.
Figure 9B:
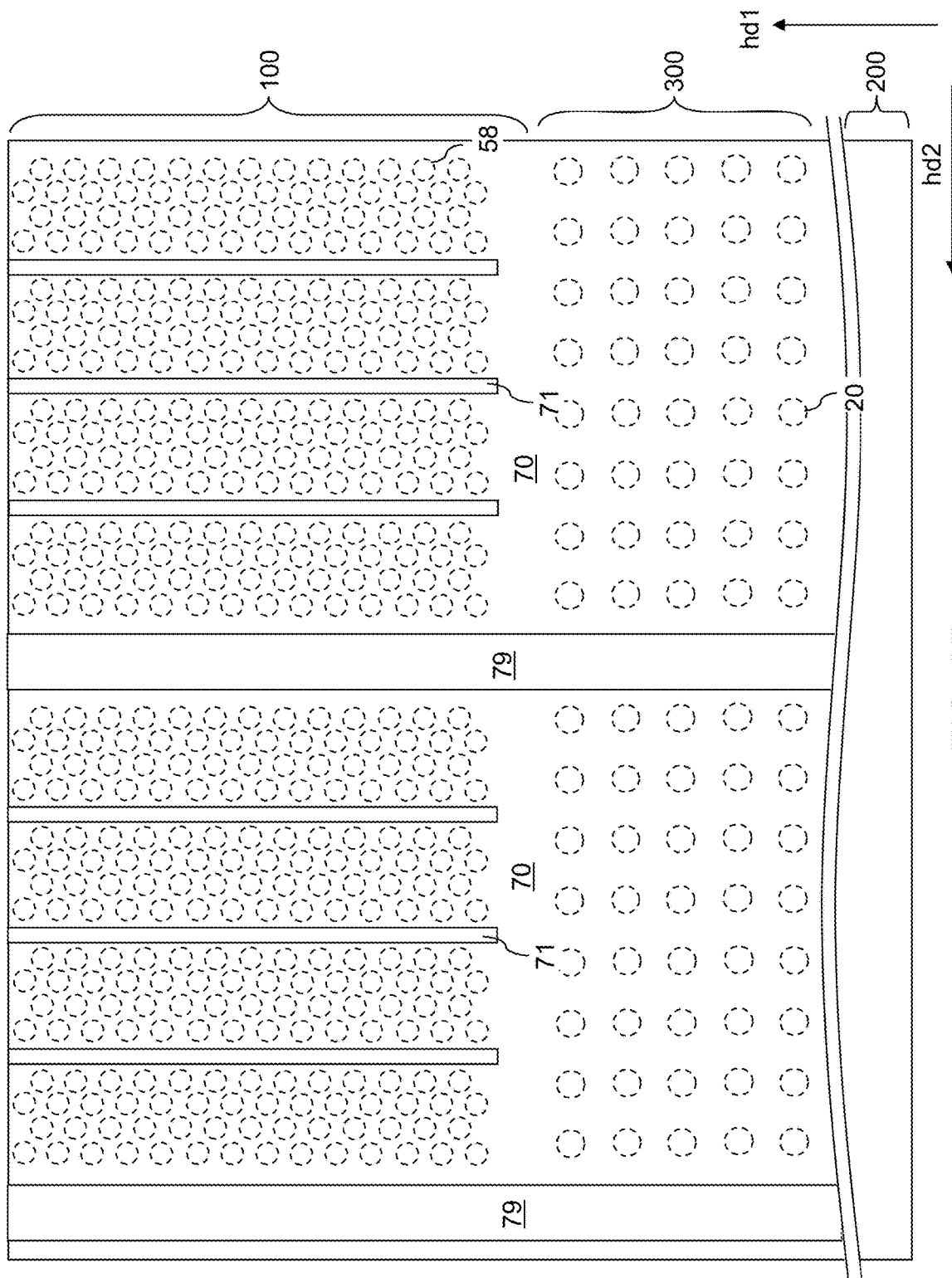
FIG. 9B is a partial see-through top-down view of the first exemplary structure of FIG. 9A. The vertical plane A-A' is the plane of the schematic vertical cross-sectional view of FIG. 9A.

Referring to FIGS. 9A and 9B, a second photoresist layer (not shown) may be applied over the contact-level dielectric layer 70, and may be lithographically patterned to form openings in areas between groups 258 of memory stack structures 55. The openings in the photoresist layer may be elongated openings that laterally extend along the first horizontal direction hd1. The pattern in the photoresist layer may be transferred through the contact-level dielectric layer 70, the alternating stack {(432, 132, 332), (442, 142, 342)} and/or the retro-stepped dielectric material portion 65 using an anisotropic etch to form backside trenches 79, which vertically extend from the top surface of the contact-level dielectric layer 70 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from one another along a second horizontal direction hd2 that is perpendicular to the first horizontal direction hd1. The memory stack structures 55 may be arranged in rows that extend along the first horizontal direction hd1. The drain-select-level trenches 71 may laterally extend along the first horizontal direction hd1. Each backside trench 79 may have a uniform width that is consistent along the lengthwise direction (i.e., along the first horizontal direction hd1). The width of the backside trenches 79 may be greater than the width of the drain-select-level trenches 71. Each drain-select-level trench 71 may have a uniform vertical cross-sectional profile along vertical planes that are perpendicular to the first horizontal direction hd1 that do not substantially change with translation along the first horizontal direction hd1. Multiple rows of memory stack structures 55 may be located between a neighboring pair of a backside trench 79 and a drain-select-level trench 71, or between a neighboring pair of drain-select-level trenches 71. In one embodiment, the backside trenches 79 may include a source contact opening in which a source contact via structure may be subsequently formed. The second photoresist layer may be removed, for example, by ashing.

Figure 10A:
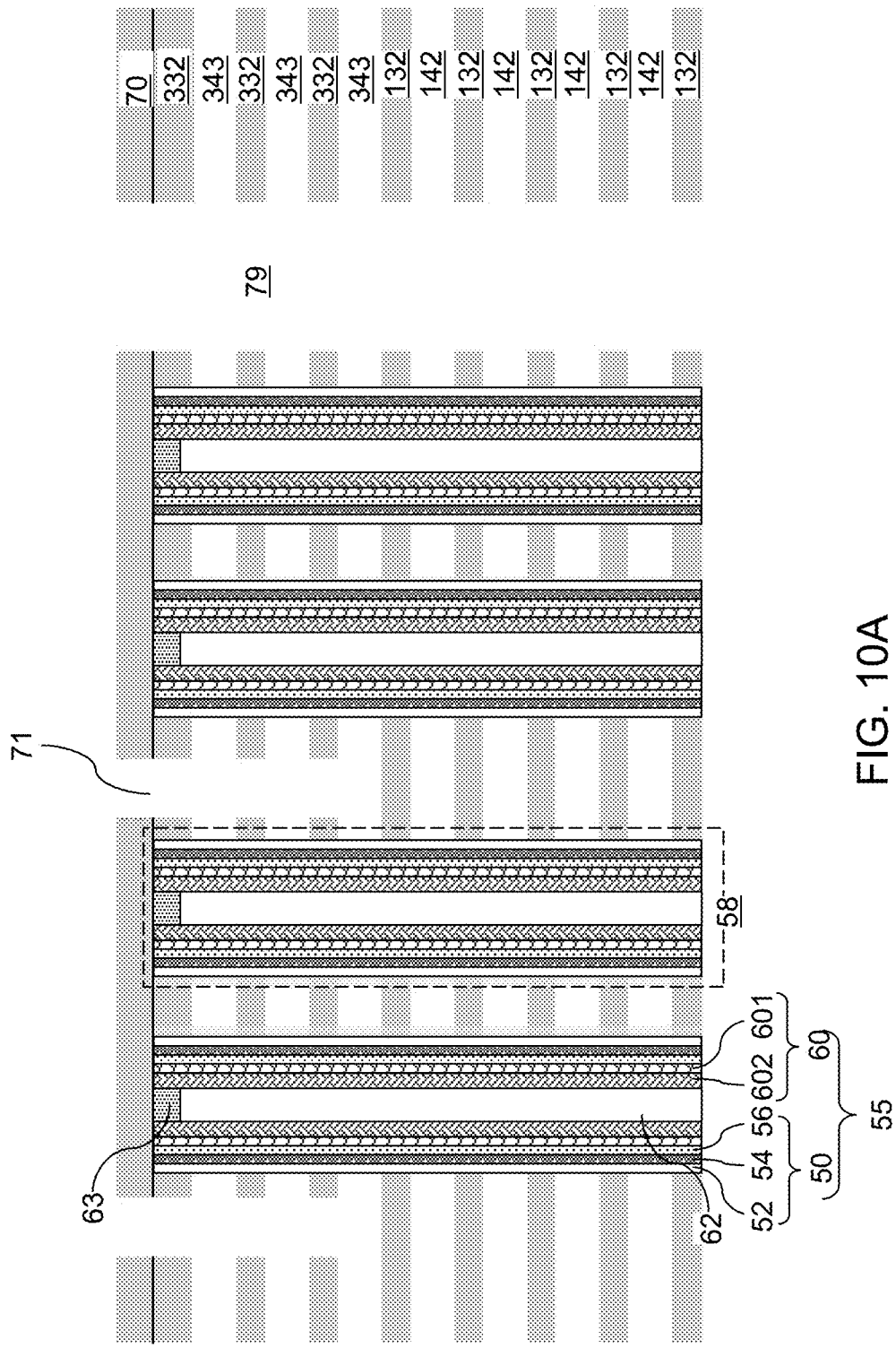
FIG. 10A is a schematic vertical cross-sectional view of the first exemplary structure after formation of backside recesses according to an embodiment of the present disclosure.
Figure 10B:
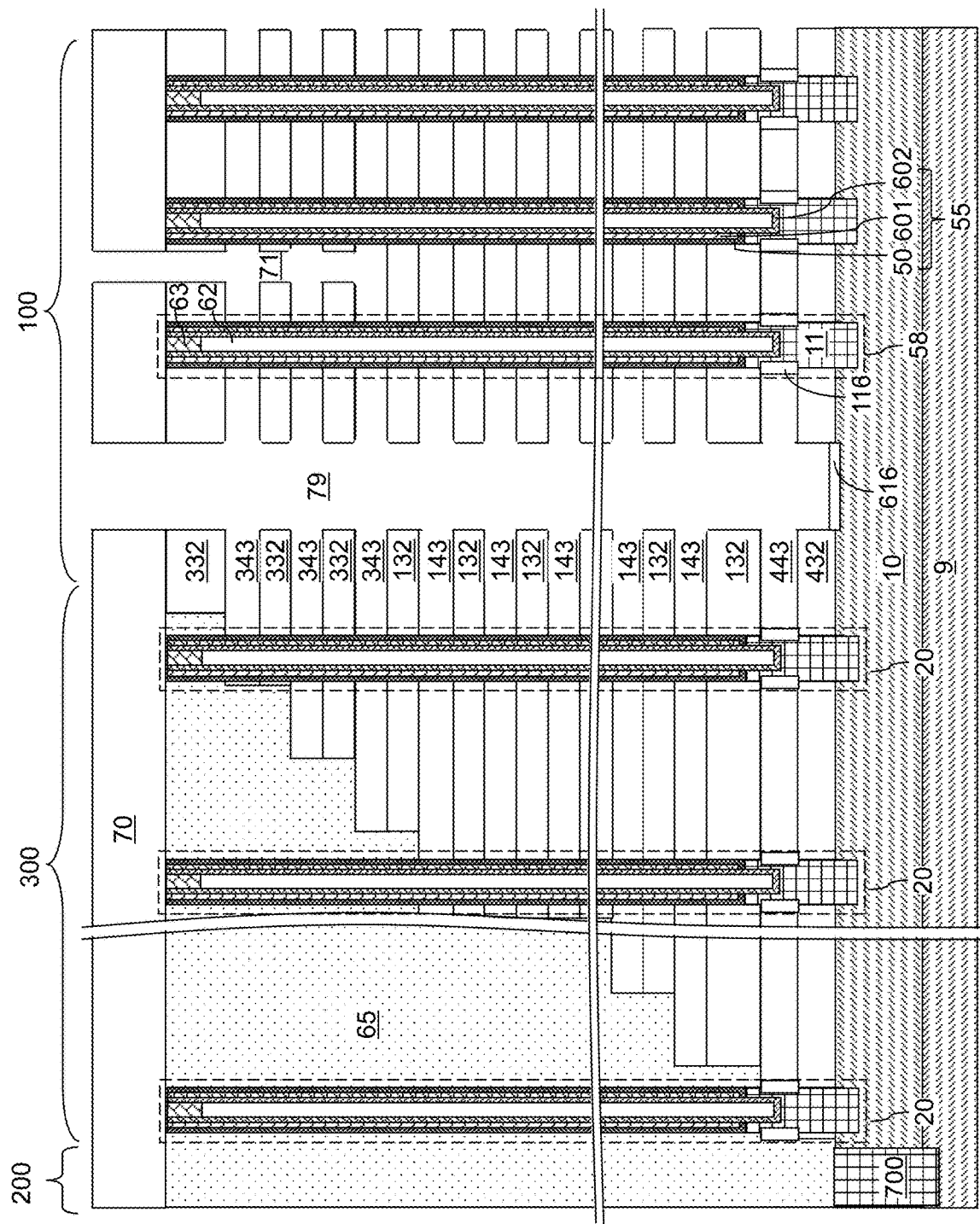
FIG. 10B is another schematic vertical cross-sectional view of the first exemplary structure of FIG. 10A.

Referring to FIGS. 10A and 10B, an etchant that selectively etches the second material of the sacrificial material layers (442, 142, 342) with respect to the first material of the insulating layers (432, 132, 332) may be introduced into the backside trenches 79, for example, using an etch process. Backside recesses (443, 143, 343) may be formed in volumes from which the sacrificial material layers (442, 142, 342) are removed. The backside recesses (443, 143, 343) may include word-line-level backside recesses 143 that are formed in volumes from which the word-line-level sacrificial material layers 142 are removed, drain-select-level backside recesses 343 that are formed in volumes from which the drain-select-level sacrificial material layers 342 are removed, and source-select-level backside recesses 443 that are formed in volumes from which the source-select-level sacrificial material layer 442 is removed. The removal of the second material of the sacrificial material layers (442, 142, 342) may be selective to the first material of the insulating layers (432, 132, 332), the material of the retro-stepped dielectric material portion 65, the semiconductor material of the semiconductor material layer 10, and the material of the outermost layer of the memory films 50. In one embodiment, the sacrificial material layers (442, 142, 342) may include silicon nitride, and the materials of the insulating layers (432, 132, 332) and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers (442, 142, 342) include silicon nitride, the etch process may be a wet etch process in which the first exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses (443, 143, 343) are present within volumes previously occupied by the sacrificial material layers (442, 142, 342).

Each backside recess (443, 143, 343) may be a laterally extending cavity having a lateral dimension that is greater than the vertical extent of the cavity. In other words, the lateral dimension of each backside recess (443, 143, 343) may be greater than the height of the backside recess (443, 143, 343). A plurality of backside recesses (443, 143, 343) may be formed in the volumes from which the second material of the sacrificial material layers (442, 142, 342) is removed. The memory openings in which the memory stack structures 55 are formed are herein referred to as front side openings or front side cavities in contrast with the backside recesses (443, 143, 343). In one embodiment, the memory array region 100 comprises an array of monolithic three-dimensional NAND strings having a plurality of device levels disposed above the substrate (9, 10). In this case, each backside recess (443, 143, 343) may define a space for receiving a respective word line of the array of monolithic three-dimensional NAND strings.

The drain-select-level backside recesses 343 are connected to the drain-select-level trenches 71. Each of the plurality of backside recesses (443, 143, 343) may extend substantially parallel to the top surface of the substrate (9, 10). A backside recess (443, 143, 343) may be vertically bounded by a top surface of an underlying insulating layer (432, 132, 332) and a bottom surface of an overlying insulating layer 132, 332). In one embodiment, each backside recess (443, 143, 343) may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 may include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 may include a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Figure 11:
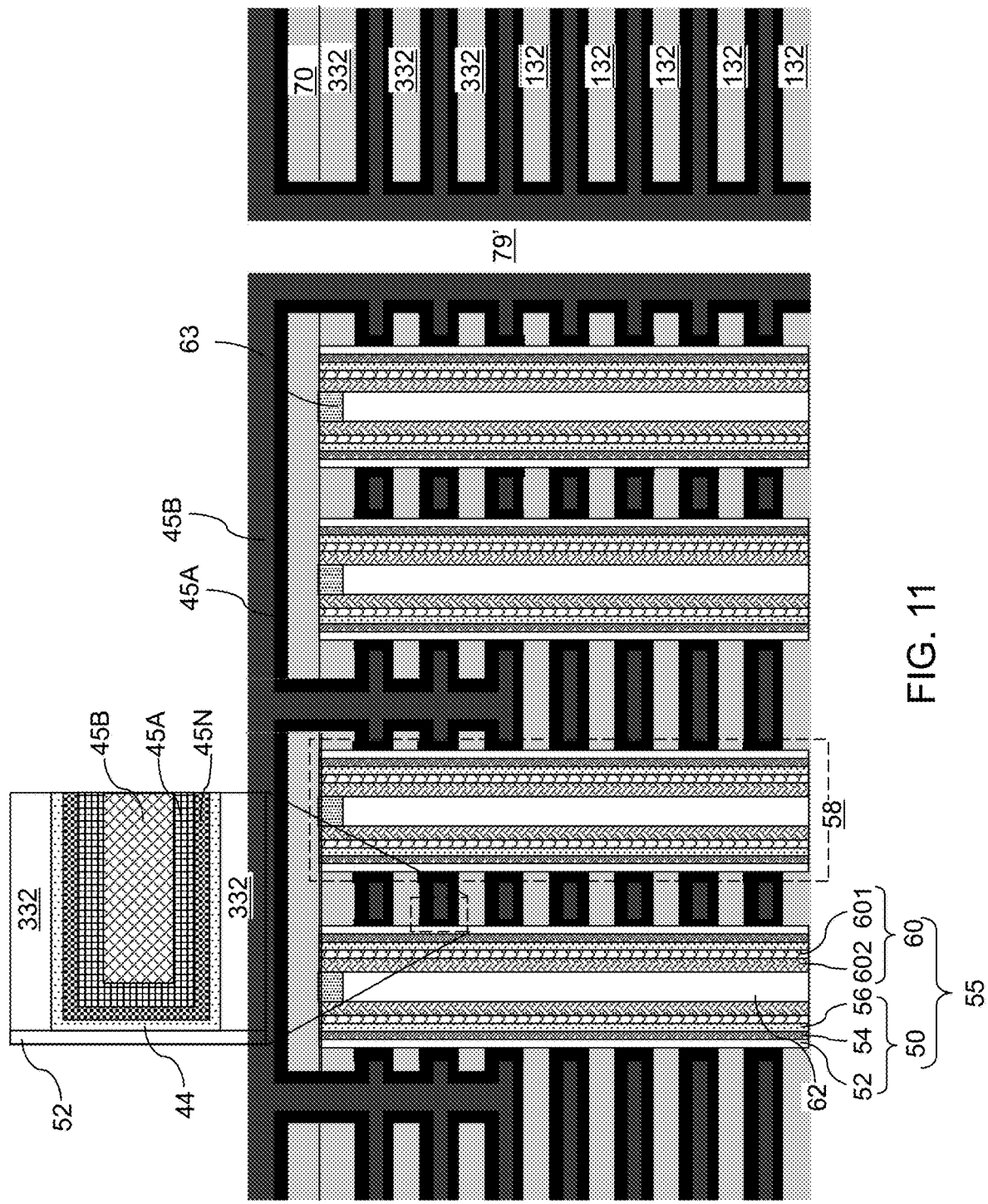
FIG. 11 is a schematic vertical cross-sectional view of the first exemplary structure after formation of a first continuous electrically conductive material layer and a second electrically conductive material layer according to the first embodiment of the present disclosure.

Referring to FIG. 11, a backside blocking dielectric layer 44 may be optionally formed. The backside blocking dielectric layer 44, if present, comprises a dielectric material that functions as a control gate dielectric for the control gates to be subsequently formed in the backside recesses (443, 143, 343). The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. In embodiments in which the blocking dielectric layer 52 is present within each memory opening, the backside blocking dielectric layer 44 is optional. In embodiments in which the blocking dielectric layer 52 is omitted, the backside blocking dielectric layer 44 is present. The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

A continuous metallic barrier layer 45N may be deposited in the backside recesses (443, 143, 343). The continuous metallic barrier layer 45N includes an electrically conductive metallic material that may function as a diffusion barrier layer and/or adhesion promotion layer for a metallic fill material to be subsequently deposited. The continuous metallic barrier layer 45N may include a conductive metallic nitride material such as TiN, TaN, WN, or a stack thereof, or may include a conductive metallic carbide material such as TiC, TaC, WC, or a stack thereof. In one embodiment, the continuous metallic barrier layer 45N may be deposited by a conformal deposition process such as chemical vapor deposition (CVD) or atomic layer deposition (ALD). The thickness of the continuous metallic barrier layer 45N may be in a range from 2 nm to 8 nm, such as from 3 nm to 6 nm, although lesser and greater thicknesses may also be used. In one embodiment, the continuous metallic barrier layer 45N may consist essentially of a conductive metal nitride such as TiN.

A first metal fill material is deposited in the backside recesses (443, 143, 343), in the drain-select-level trenches 71, on the sidewalls of the backside trenches 79, and over the top surface of the contact-level dielectric layer 70 to form a first continuous electrically conductive material layer 45A. The first continuous electrically conductive material layer 45A may be deposited by a conformal deposition method, which may be, for example, chemical vapor deposition (CVD), atomic layer deposition (ALD), electroless plating, electroplating, or a combination thereof. In one embodiment, the first continuous electrically conductive material layer 45A may consist essentially of at least one elemental metal. The at least one elemental metal of the first continuous electrically conductive material layer 45A may be selected, for example, from tungsten, cobalt, ruthenium, titanium, and tantalum. In one embodiment, the first continuous electrically conductive material layer 45A may consist essentially of a single elemental metal. In one embodiment, the first continuous electrically conductive material layer 45A may be deposited using a fluorine-containing precursor gas such as $WF_6$. In one embodiment, the first continuous electrically conductive material layer 45A may be a tungsten layer including a residual level of fluorine atoms as impurities. The first continuous electrically conductive material layer 45A does not completely fill any of the backside recesses (443, 143, 343).

A second metal fill material is deposited in remaining unfilled volumes of backside recesses (443, 143, 343) and the drain-select-level trenches 71, at a peripheral portion of each backside trench 79, and over the horizontal portion of the first continuous electrically conductive material layer 45A overlying the contact-level dielectric layer 70. A second continuous electrically conductive material layer 45B may be formed on the physically exposed surfaces of the first continuous electrically conductive material layer 45A. The second continuous electrically conductive material layer 45B may be deposited by a conformal deposition method, which may be, for example, chemical vapor deposition (CVD), atomic layer deposition (ALD), electroless plating, electroplating, or a combination thereof. The second continuous electrically conductive material layer 45B may consist essentially of at least one elemental metal. The at least one elemental metal of the second continuous electrically conductive material layer 45B is different from the at least one elemental metal of the first continuous electrically conductive material layer 45A, and may be selected, for example, from tungsten, cobalt, ruthenium, molybdenum, titanium, and tantalum. For example, the first continuous electrically conductive material layer 45A may include tungsten, and the second continuous electrically conductive material layer 45B may consist essentially of a single elemental metal selected from cobalt, ruthenium, and molybdenum. The second continuous electrically conductive material layer 45B may completely fill the backside recesses (443, 143, 343).

The width of each drain-select-level trench 71 and the thicknesses of the backside blocking dielectric layer 44, the continuous metallic barrier layer 45N, and the first continuous electrically conductive material layer 45A may be selected such that a vertically extending unfilled volume exists within each drain-select-level trench 71 after deposition of the first continuous electrically conductive material layer 45A. The vertically extending unfilled volumes of the drain-select-level trenches 71 may be filled by the second continuous electrically conductive material layer 45B. A backside cavity 79' is present within each backside trench 79.

Figure 12:
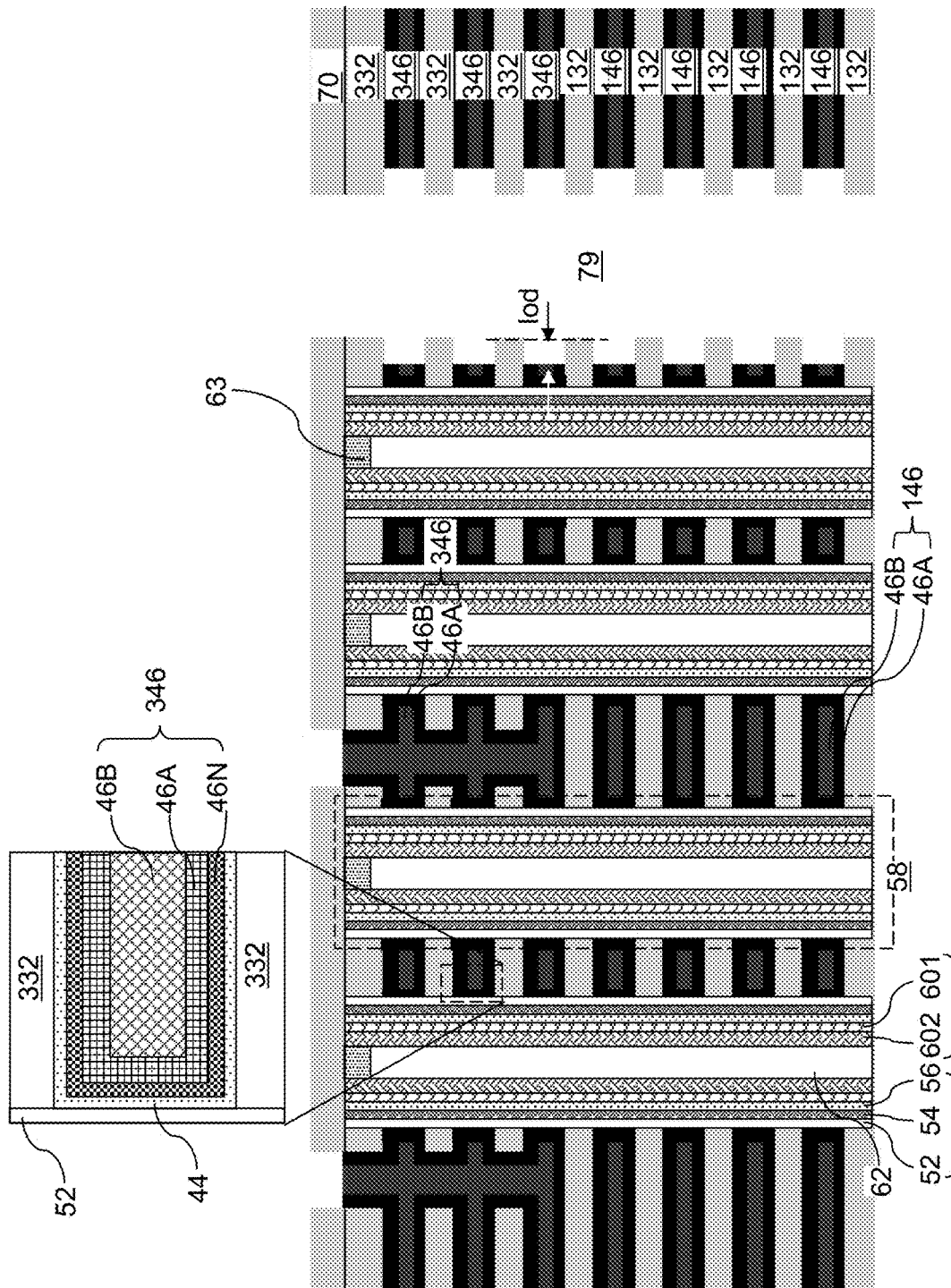
FIG. 12 is a schematic vertical cross-sectional view of the first exemplary structure after isotropically recessing the first continuous electrically conductive material layer and the second electrically conductive material layer according to the first embodiment of the present disclosure.

Referring to FIG. 12, an isotropic recess etch process is performed to etch back the materials of the continuous metallic barrier layer 45N, the first continuous electrically conductive material layer 45A, and the second continuous electrically conductive material layer 45B selective to the material of the optional backside blocking dielectric layer 44 (if present) and/or selective to the material of the insulating layers (432, 132, 332) and the contact-level dielectric layer 70. A wet etch process that etches metallic materials selective to dielectric materials may be used. The metallic barrier material of the continuous metallic barrier layer 45N, the first electrically conductive material of the first continuous electrically conductive material layer 45A, and the second electrically conductive material of the second continuous electrically conductive material layer 45B may be etched back from the backside trenches 79 and from above the contact-level dielectric layer 70 by the isotropic recess etch process.

Further, the isotropic recess etch process may laterally recess the metallic barrier material, the first electrically conductive material, and the second electrically conductive material in volumes of the backside recesses (443, 143, 343) relative to sidewalls of the insulating layers (432, 132, 332) that are exposed to the backside trenches 79. Thus, each sidewall of the electrically conductive layers (146, 346) may be laterally recessed relative to sidewalls of the insulating layers (432, 132, 332) by a lateral offset distance lod, which may be in a range from 5 nm to 100 nm, although lesser and greater distances may also be used.

The combination of the continuous metallic barrier layer 45N, the first continuous electrically conductive material layer 45A, and the second continuous electrically conductive material layer 45B is divided into discrete conductive material potions. The discrete material portions include word-line-level electrically conductive layers 146 that fill word-line-level backside recesses 143, drain-select-level electrically conductive layers 346 that fill drain-select-level backside recesses 343, a source-select-level electrically conductive layer (not shown) that fills the source-select-level backside recesses 443. Further, remaining portions of the continuous metallic barrier layer 45N, the first continuous electrically conductive material layer 45A, and the second continuous electrically conductive material layer 45B fill the drain-select-level trenches 71. Each of the electrically conductive layers (146, 346) may be formed in the backside recesses (443, 143) and in the drain-select-level trenches 71, and may include remaining portions of the first and second continuous electrically conductive layers (45A, 45B).

Each of the word-line-level electrically conductive layers 146, the drain-select-level electrically conductive layers 346, the source-select-level electrically conductive layer may include a respective metallic barrier layer 46N that is a patterned remaining portion of the continuous metallic barrier layer 45N, a respective first electrically conductive material layer 46A that is a patterned remaining portion of the first continuous electrically conductive material layer 45A, and a respective second electrically conductive material layers 46B that is a patterned remaining portion of the second continuous electrically conductive material layer 45B.

Figure 13:
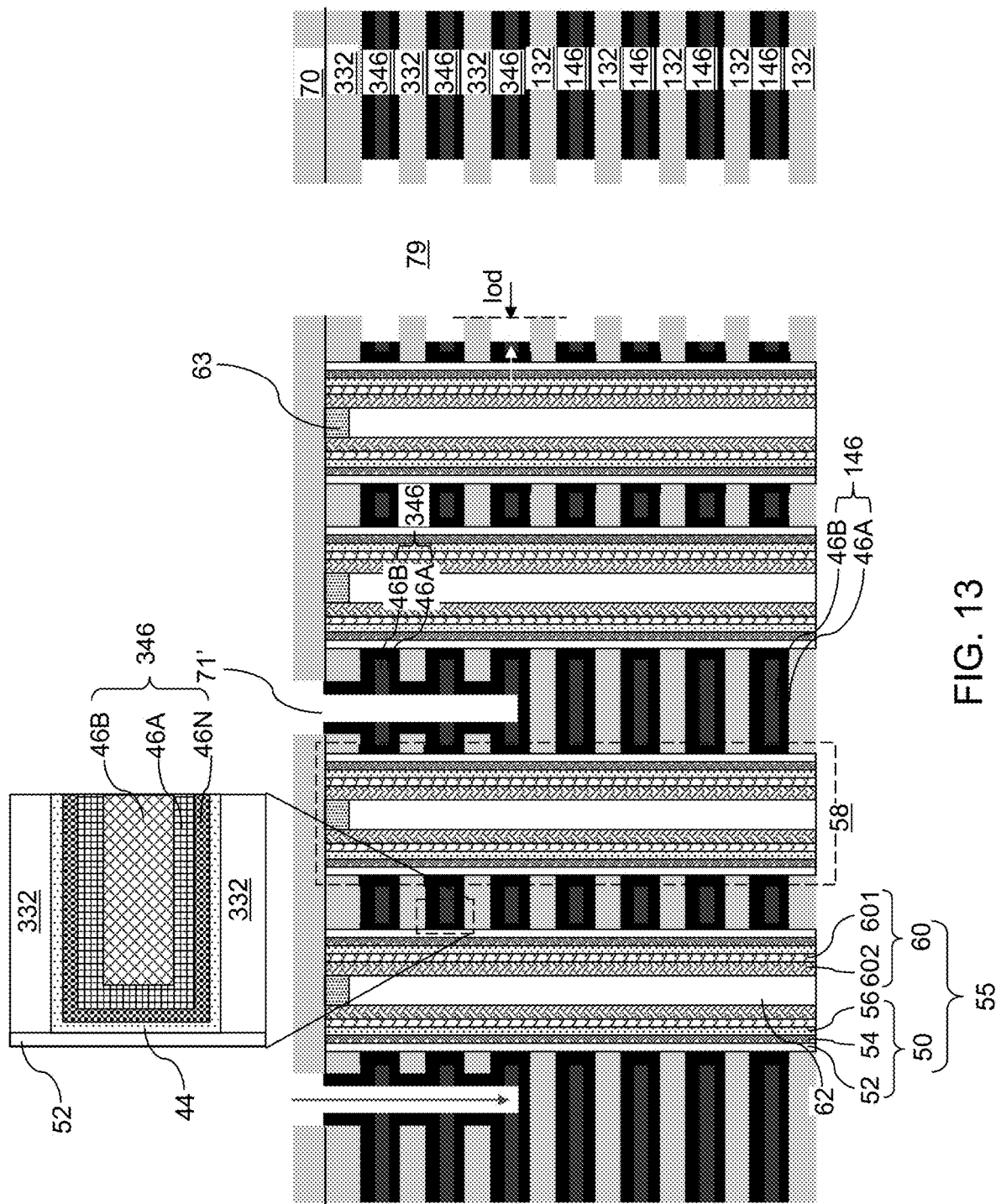
FIG. 13 is a schematic vertical cross-sectional view of the first exemplary structure after a first anisotropic etching of the material of second electrically conductive layers according to the first embodiment of the present disclosure.

Referring to FIG. 13, a first anisotropically etch process is performed to etch the second electrically conductive material selective to the first electrically conductive material and the metallic barrier material. For example, a reactive ion etch process using an etchant that etches the second electrically conductive material selective to the first electrically conductive material and the metallic barrier material. For example, if the second electrically conductive material layers 46B includes cobalt, ruthenium, or molybdenum and if the first electrically conductive material layers 46A includes tungsten, a reactive ion etch process using a plasma composition that etches cobalt, ruthenium, or molybdenum selective to tungsten may be used. The first anisotropic etch process removes portions of the second electrically conductive material layers 46B that are not covered by the first electrically conductive material layers 46A within each of the drain-select-level trenches 71. The direction of ions that impinge into the drain-select-level trenches 71 is schematically illustrated by an arrow. A cavity 71' is formed within each volume of the drain-select-level trenches 71 from which the second electrically conductive material is removed. A first electrically conductive material layer 46A may be physically exposed at the bottom of each cavity 71' in the drain-select-level trenches 71.

Figure 14A:
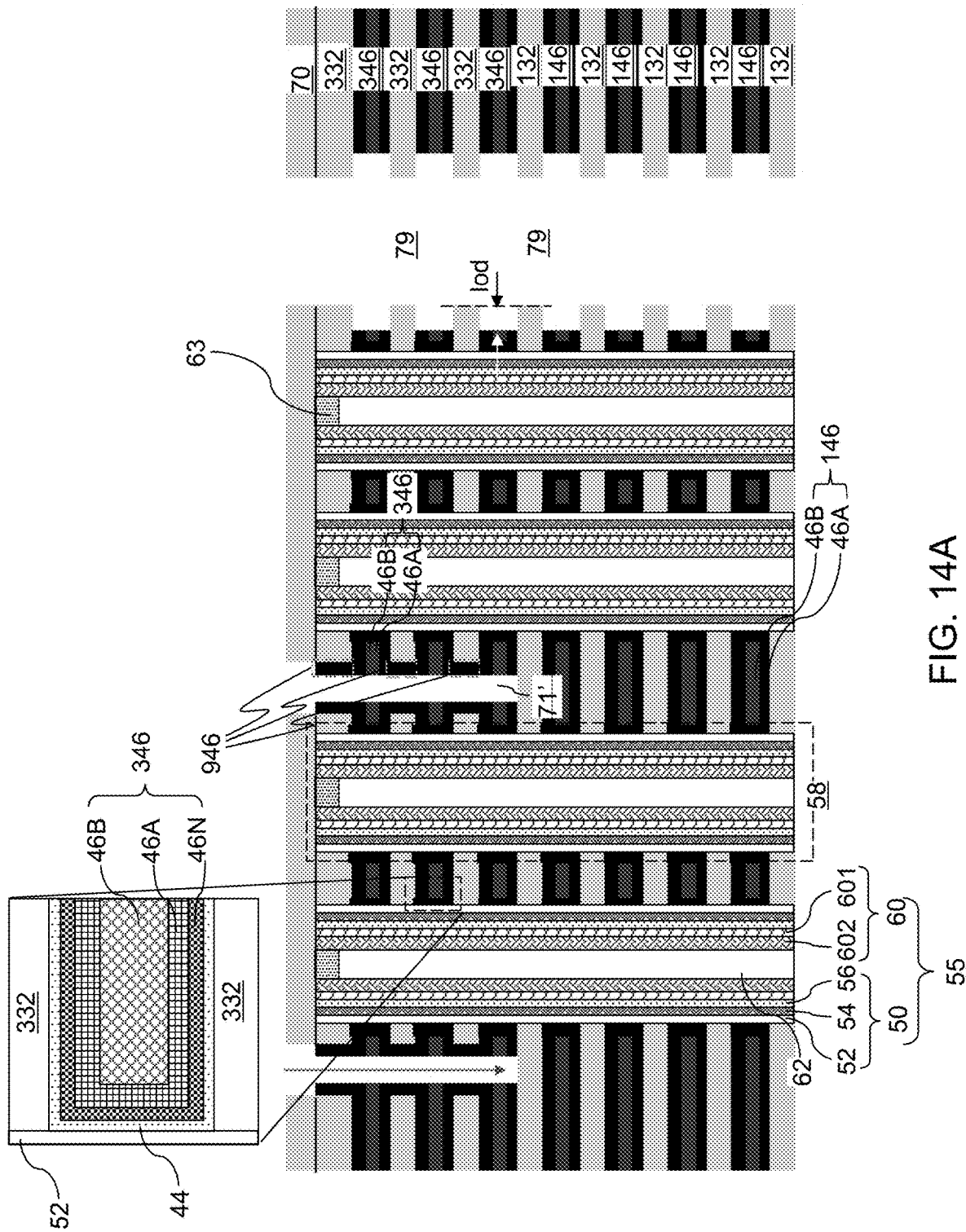
FIG. 14A is a schematic vertical cross-sectional view of the first exemplary structure after a second anisotropic etching of the material of second electrically conductive layers according to the first embodiment of the present disclosure.

Referring to FIGS. 14A and 14B, a second anisotropic etch process may be performed to vertically recess each horizontal portion of the first electrically conductive material layer 46A and the metallic barrier layer 46N that underlie the drain-select-level trenches 71. Each of the drain-select-level electrically conductive layers 346 may be laterally divided at the drain-select-level trenches into laterally disjoined strips by the second anisotropic etch process. Multiple groups of drain-select-level electrically conductive layers 346 may be laterally spaced apart, and may be electrically isolated from one another. Remaining portions of the first electrically conductive material layers 46A and the metallic barrier layers 46N within the volumes of the drain-select-level trenches 71 constitute vertical conductive strips 946.

End segments of the vertical conductive strips 946 located at lengthwise ends of each drain-select-level trench 71 may be removed, for example, by applying a photoresist layer over the first exemplary structure, lithographically patterning the photoresist layer to form openings that physically expose lengthwise ends of the drain-select-level trenches 71, and by removing the physically exposed end segments of the vertical conductive strips 946. For example, if a drain-select-level trench 71 has an elongated horizontal cross-sectional shape with a pair of lengthwise sidewalls that extend along the first horizontal direction and a pair of widthwise sidewalls that extend along the second horizontal direction, segments of the vertical conductive strips 946 that are located on the widthwise sidewalls of the drain-select-level trenches 71 may be removed. The photoresist layer may be subsequently removed. Upon patterning of the vertical conductive strips 946, each drain-select-level trench 71 may include at least two vertical conductive strips 946 that extend along the first horizontal direction.

Groups of drain-select-level electrically conductive layers 346 may be laterally spaced apart by the cavities 71' that are formed in the drain-select-level trenches 71. A top surface of the topmost word-line-level insulating layer 132 may be physically exposed at the bottom of each drain-select-level trench 71. Each drain-select-level electrically conductive layer 346 within each group of drain-select-level electrically conductive layers 346 may be electrically connected to and from each other or one another by at least one vertical conductive strip 946. Each vertical conductive strip 946 may contact a sidewall of a drain-select-level insulating layer 332 and/or a sidewall of the contact-level dielectric layer 70. Drain-select-level electrically conductive layers 346 having sidewalls that are exposed to a backside trench 79 and provided within a same group may be connected from one another by a single set of vertical conductive strip 946 located within a same drain-select-level trench 71. Drain-select-level electrically conductive layers 346 including sidewalls that are not exposed to a backside trench 79 and provided within a same group may be connected to and from one another by two sets of vertical conductive strips 946 located within two drain-select-level trenches 79. Each vertical conductive strip 946 includes a first electrically conductive material and a metallic barrier material (if a metallic barrier layer 46N is used). In one embodiment, a plurality of drain-select-level electrically conductive layers 346 may be vertically stacked, and a vertically alternating sequence of at least two drain-select-level electrically conductive layers 346 and at least two vertical conductive strips 946 may be located on each side of a drain-select-level trench 71.

Referring to FIGS. 15A-15D, a nonconformal insulating layer 74 may be anisotropically deposited. The nonconformal insulating layer 74 may include an insulating material such as silicon oxide, and may be deposited by an anisotropic deposition method such as plasma-enhanced chemical vapor deposition. The nonconformal insulating layer 74 may be deposited over the sidewalls of the insulating layers (432, 132, 332) that are exposed to the backside trenches 79 and over the drain-select-level trenches 71. The vertical thickness of the horizontal portion of the nonconformal insulating layer 74 that overlies the contact-level dielectric layer 70 may be greater than the maximum of the lateral thickness of the nonconformal insulating layer 74 in the backside trenches 79. The lateral thickness of the nonconformal insulating layer 74 in the backside trenches 79 may decrease with a vertical distance from the horizontal plane between the top surface of the contact-level dielectric layer 70 and a bottom surface of the horizontal portion of the nonconformal insulating layer 74 that overlies the contact-level dielectric layer 70.

An air gap comprising encapsulated cavity 77 that is free of any solid material therein and bounded by a bottom surface of the nonconformal insulating layer 74 may be formed in the volume(s) of one or more of the drain-select-level trenches 71. In one embodiment, an encapsulated cavity 77 may be vertically bounded by a concave bottom surface of the nonconformal insulating layer 74. An encapsulated cavity 77 may be laterally bounded by the drain-select-level electrically conductive layers 346 and the vertical conductive strips 946 in case a highly anisotropic deposition process is used to form the nonconformal insulating layer 74 as illustrated in FIG. 15C. Alternatively, an encapsulated cavity 77 may be laterally bounded by a vertically extending portion of the nonconformal insulating layer 74 in case a less anisotropic deposition process is used to form the nonconformal insulating layer 74 as illustrated in FIG. 15D.

Encapsulated cavities may be formed between laterally recessed sidewalls of the electrically conductive layers (446, 146, 346) and the vertically extending portions of the nonconformal insulating layer 74. The electrically conductive layers (446, 146, 346) may include the source-select-level electrically conductive layer 446, the word-line-level electrically conductive layers 146, and the drain-select-level electrically conductive layers 346. The encapsulated cavities comprise air gaps and are herein referred to as pocket cavities 73. The pocket cavities 73 may be formed between each of the electrically conductive layers (446, 146, 346) and a respective most proximal one of vertically-extending portions of the nonconformal insulating layer 74 within the backside trenches 79. Each of the pocket cavities 73 may be free of any solid material therein. Each pocket cavity 73 may laterally extend along the lengthwise direction of an adjacent backside trench 79, and thus, are also referred to rail cavities, i.e., a cavity having a vertical cross-sectional shape that is invariant upon translation along the lengthwise direction of the backside trenches 79.

An isotropic etch process or an anisotropic etch process may be performed to remove bottom horizontal portions of the nonconformal insulating layer 74 at the bottom of each backside trench 79 and any planar dielectric portion 616. A top surface of the semiconductor material layer 10 may be physically exposed at the bottom of each backside trench 79. A backside cavity 79' is present within each backside trench 79.

Figure 16A:
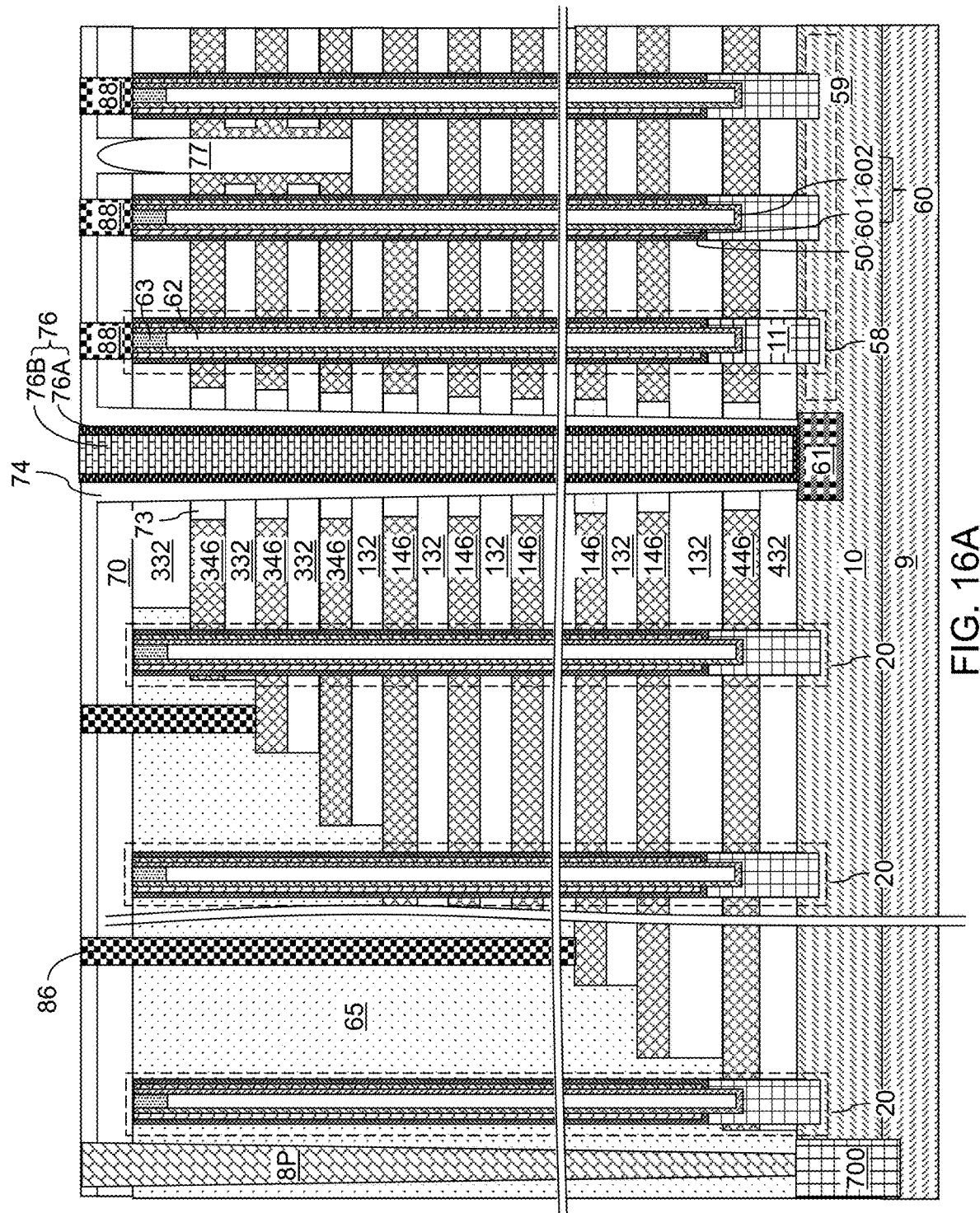
FIG. 16A is a schematic vertical cross-sectional view of the first exemplary structure after formation of various contact via structures according to the first embodiment of the present disclosure.
Figure 16B:
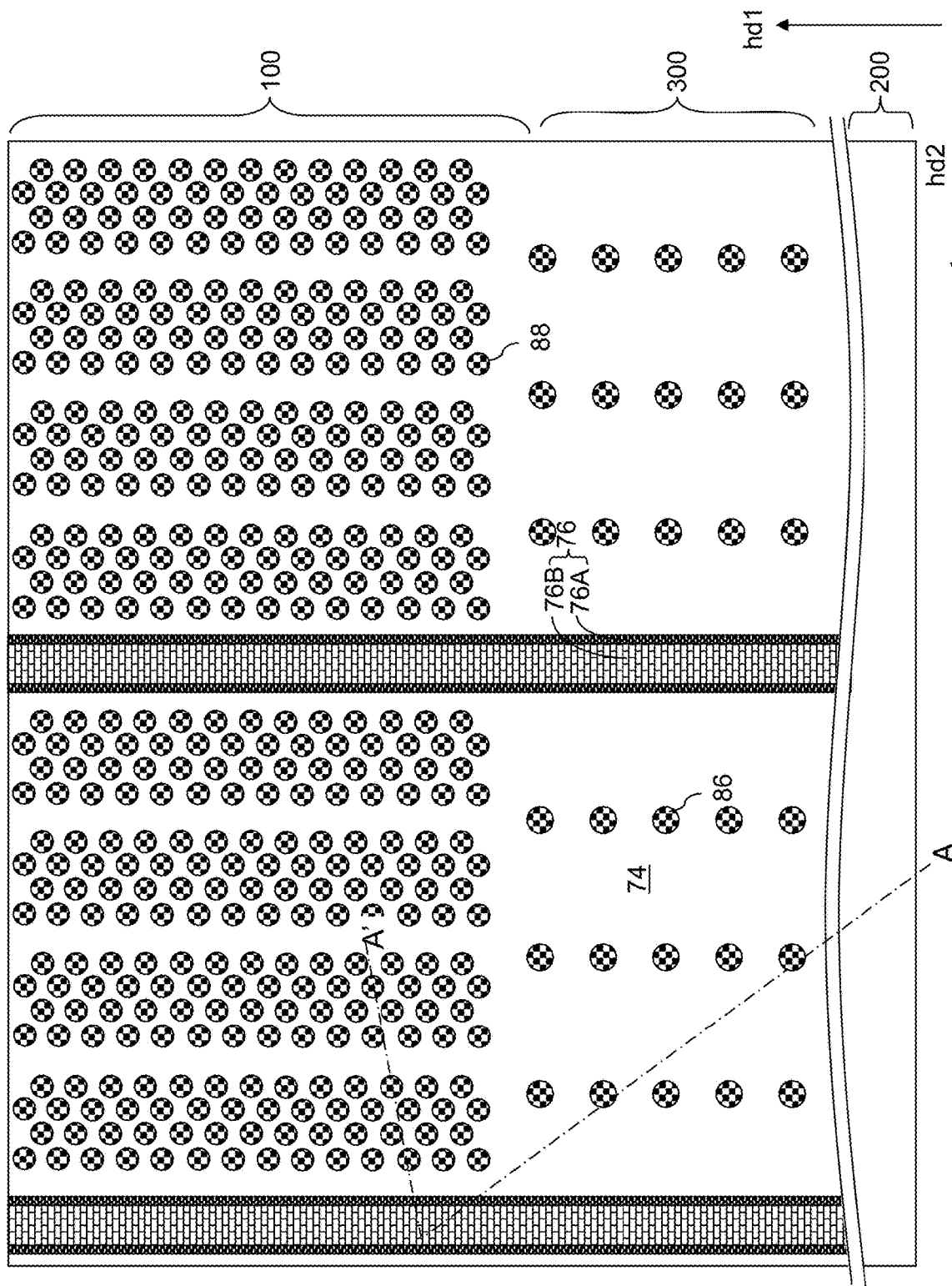
FIG. 16B is a top-down view of the first exemplary structure of FIG. 16A.

Referring to FIGS. 16A and 16B, a source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the nonconformal insulating layer 74. Due to the straggle of the implanted dopant atoms during the implantation process and lateral diffusion of the implanted dopant atoms during a subsequent activation anneal process, each source region 61 may have a lateral extent greater than the lateral extent of the opening through the nonconformal insulating layer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 may be connected to multiple vertical semiconductor channels 60 through respective pedestal channel portions 11. The horizontal semiconductor channel 59 contacts the source region 61 and the plurality of pedestal channel portions 11. Each source region 61 may be formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact-level dielectric layer 70 overlying the alternating stack {(432, 132, 332), (446, 146, 346)} as a stopping layer. If chemical mechanical planarization (CMP)

process is used, the contact-level dielectric layer 70 may be used as a CMP stopping layer. Each remaining continuous portion of the at least one conductive material in the backside trenches 79 constitutes a backside contact via structure 76.

The backside contact via structure 76 extends through the alternating stack {(432, 132, 332), (446, 146, 346)}, and contacts a top surface of the source region 61. If a backside blocking dielectric layer 44 is used, the backside contact via structure 76 may contact a sidewall of the backside blocking dielectric layer 44.

Additional contact via structures (88, 86, 8P) may be formed through the contact-level dielectric layer 70, and optionally through the retro-stepped dielectric material portion 65. For example, drain contact via structures 88 may be formed through the contact-level dielectric layer 70 on each drain region 63. Word line contact via structures 86 may be formed on the word-line-level electrically conductive layers 146 through the contact-level dielectric layer 70, and through the retro-stepped dielectric material portion 65. Peripheral device contact via structures 8P may be formed through the retro-stepped dielectric material portion 65 directly on respective nodes of the peripheral devices.

Referring to all drawings of the first exemplary structure and according to various embodiments of the present disclosure, a three-dimensional memory device is provided, which comprises: a first alternating stack {(432, 132, 332), (446, 146, 346)} of insulating layers (432, 132, 332) and electrically conductive layers (446, 146, 346) located over a substrate (9, 10); and memory stack structures 55 extending through the first alternating stack {(432, 132, 332), (446, 146, 346)}; wherein: the electrically conductive layers (446, 146, 346) comprise drain-select-level electrically conductive layers 346 located in at least two different levels having different vertical distances from the substrate (9, 10) and laterally spaced apart as multiple groups that are electrically isolated from one another; each horizontal portion of the drain-select-level electrically conductive layers 346 located between a vertically neighboring pair of insulating layers 332 comprises a stack of a first electrically conductive material layer 46A comprising a first electrically conductive material and a second electrically conductive material layer 46B that does not contact any of the insulating layers (432, 132, 332) and comprises a second electrically conductive material; and drain-select-level electrically conductive layers 346 within each group selected from the multiple groups are electrically connected by at least one vertical conductive strip 946 comprising the first electrically conductive material. Each of the drain-select-level electrically conductive layers 346 contains an air gap (e.g., pocket cavity) 73 at an end portion thereof.

In one embodiment, each sidewall of the at least one vertical conductive strip 946 is not in direct contact with any surface of the second electrically conductive material. Each sidewall of the at least one vertical conductive strip 946 contacts an element selected from: one of the insulating layers 332; a cavity 77 that is free of any solid material; and a vertically extending portion of an insulating material (such as a nonconformal insulating layer 74) that overlies and surrounds a cavity 77.

In one embodiment, each of the at least one vertical conductive strip 946 has a same lateral thickness as a vertical thickness of horizontal portions of the first electrically conductive material layers 46A.

In one embodiment, the first electrically conductive material consists essentially of a first elemental metal; and the second electrically conductive material consists essentially of a second elemental metal. In one embodiment, the first elemental metal comprises tungsten; and the second elemental metal comprises a metal selected from molybdenum, cobalt, and ruthenium.

In one embodiment, each laterally neighboring pair of groups selected from the multiple groups is laterally spaced apart by a respective encapsulated cavity 77 that is free of any solid material therein.

In one embodiment, the electrically conductive layers (446, 146, 346) further comprise word-line-level electrically conductive layers 146 that underlie the drain-select-level electrically conductive layers 346 and include a respective pair of sidewalls that laterally extend along a first horizontal direction hd1.

In one embodiment, the word-line-level electrically conductive layers 146 laterally extend along the first horizontal direction hd1 and have a uniform word-line-level width along a second horizontal direction hd2 that is perpendicular to the first horizontal direction hd1; and each of the drain-select-level electrically conductive layers 346 laterally extends along the first horizontal direction hd1 and has a respective uniform drain-select-level width along the second horizontal direction hd2 that is less than one third of the uniform word-line-level width. In this case, two or more drain-select-level trenches 71 may be formed between a pair of backside trenches 79.

In one embodiment, the three-dimensional memory device comprises a second alternating stack {(432, 132, 332), (446, 146, 346)} of first additional insulating layers (432, 132, 332) and first additional electrically conductive layers (446, 146, 346) located over the substrate and laterally spaced apart from the first alternating stack by a first backside trench that laterally extend along the first horizontal direction; and a third alternating stack {(432, 132, 332), (446, 146, 346)} of second additional insulating layers (432, 132, 332) and second additional electrically conductive layers (446, 146, 346) located over the substrate (9, 10) and laterally spaced apart from the first alternating sack {(432, 132, 332), (446, 146, 346)} by a second backside trench 79 that laterally extend along the first horizontal direction hd1.

In one embodiment, the three-dimensional memory device comprises a nonconformal insulating layer 74 including horizontal portions that overlie a respective one of the first alternating stack {(432, 132, 332), (446, 146, 346)}, the second alternating stack {(432, 132, 332), (446, 146, 346)}, and the third alternating stack {(432, 132, 332), (446, 146, 346)} and vertically-extending portions that extend into a respective one of the first backside trench 79 and the second backside trench 79, wherein each of the vertically-extending portions has a variable lateral thickness that decreases with a vertical distance from the horizontal portions.

In one embodiment, each of the electrically conductive layers (446, 146, 346) are laterally offset from a most proximal one of the vertically-extending portions of the of the nonconformal insulating layer 74 by a same lateral offset distance.

In one embodiment, the three-dimensional memory device comprises pocket cavities 73 located between each of the electrically conductive layers and a respective most proximal one of the vertically-extending portions and is free of any solid material therein.

In one embodiment, each of the insulating layers (432, 132, 332) contacts a respective sidewall of the nonconformal insulating layer 74.

In one embodiment, the three-dimensional memory device comprises: a source region 61 located in an upper portion of the substrate (9, 10) underneath the first backside trench 79; and a backside contact via structure 76 located within the first backside trench 79 and contacting a sidewall of the nonconformal insulating layer 74 and a top surface of the source region 61.

Figure 17:
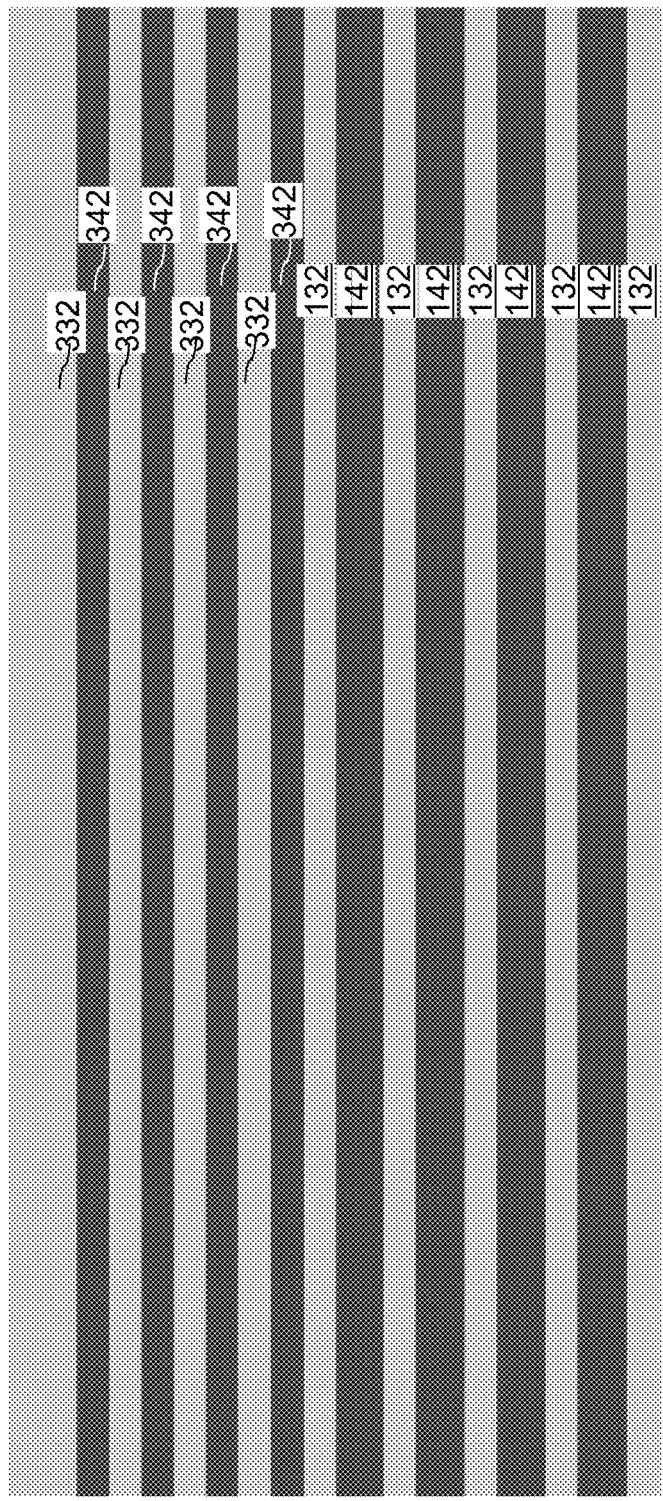
FIG. 17 is a schematic vertical cross-sectional view of a second exemplary structure after formation of an alternating stack of insulating layers and sacrificial material layers according to a second embodiment of the present disclosure.

Referring to FIG. 17, a second exemplary structure according to a second embodiment of the present disclosure may be derived from the first exemplary structure illustrated in FIG. 2 by modifying the ratio of the thickness of each drain-select-level sacrificial material layer 342 to the thickness of each word-line-level sacrificial material layer 142. The drain-select-level sacrificial material layers 342 overlie the word-line-level sacrificial material layers 142, and have a lesser thickness than the word-line-level sacrificial material layers 142. In one embodiment, the source-select-level sacrificial material layer 442 and the word-line-level sacrificial material layers 142 may have a thickness in a range from 20 nm to 60 nm, and the drain-select-level sacrificial material layer 342 may have a thickness in a range from 20% to 80% of the minimum thickness of the source-select-level sacrificial material layer 442 and the word-line-level sacrificial material layers 142. In one embodiment, the drain-select-level sacrificial material layer 342 may have a thickness in a range from 8 nm to 48 nm, such as from 12 nm to 30 nm, although lesser and greater thicknesses may also be used.

Figure 18:
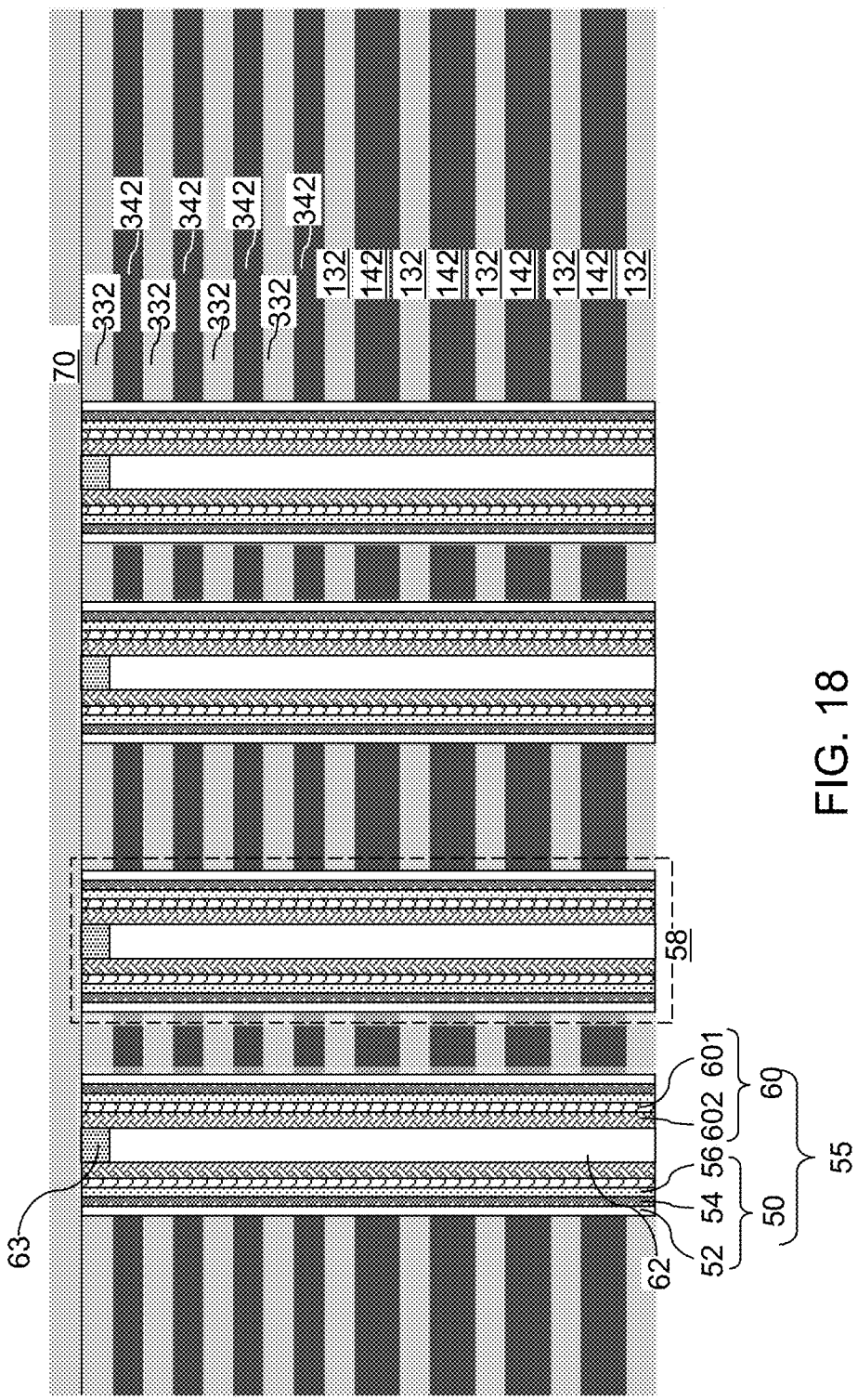
FIG. 18 is a schematic vertical cross-sectional view of the second exemplary structure after formation of a contact-level dielectric layer according to an embodiment of the present disclosure.

Referring to FIG. 18, the processing steps of FIGS. 3, 4A and 4B, 5A-5H, 6A and 6B, and 7 may be performed to form stepped surfaces, a retro-stepped dielectric material portion 65, memory openings 49 and support openings 19, memory opening fill structures 58 and support pillar structures 20, and the contact-level dielectric layer 70. The processing parameters may be adjusted at various steps to accommodate the thickness changes in the drain-select-level sacrificial material layers 342 and/or the word-line-level sacrificial material layers 142.

Figure 19A:
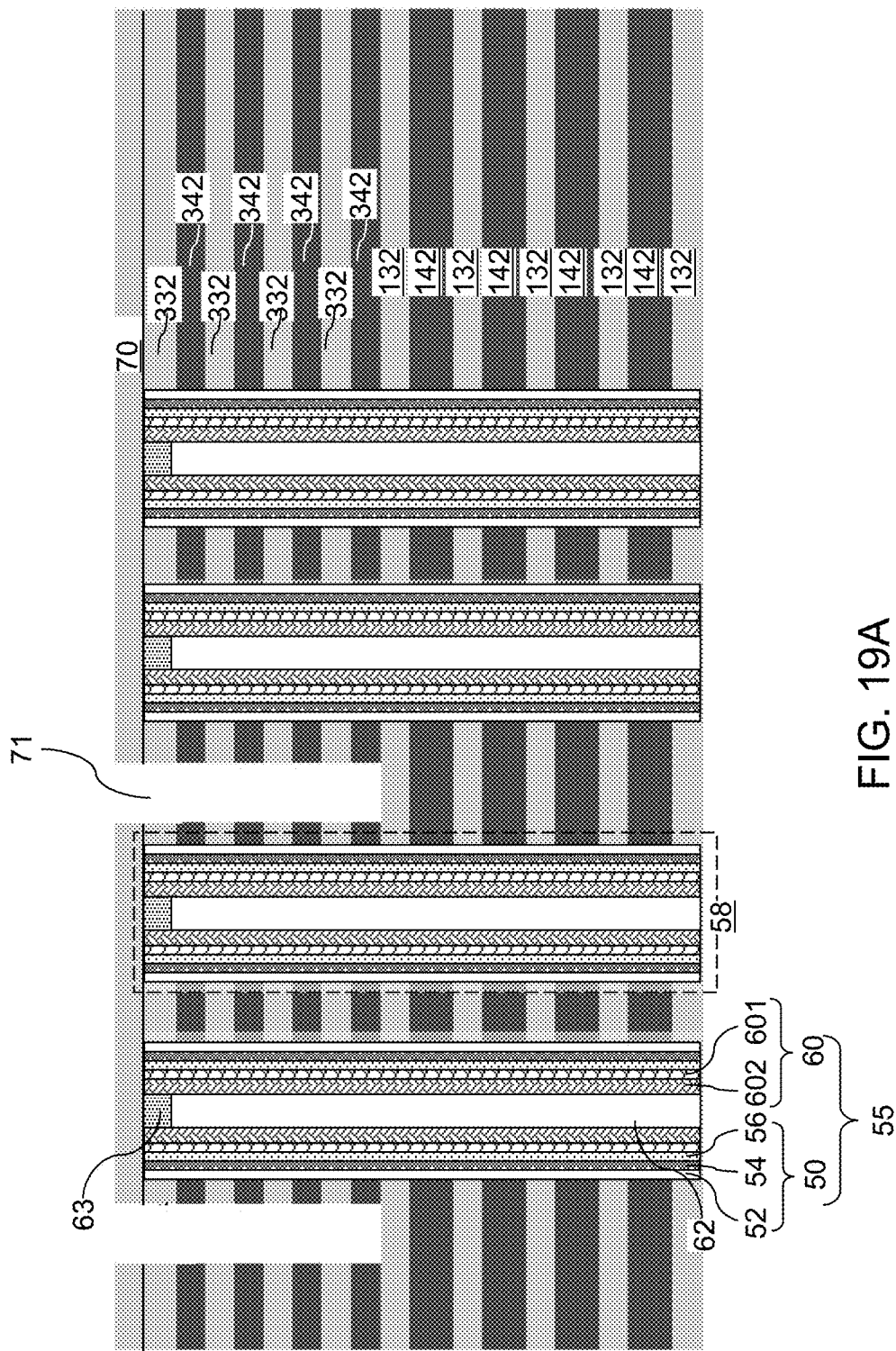
FIG. 19A is a schematic vertical cross-sectional view of the second exemplary structure after formation of drain-select-level trenches according to an embodiment of the present disclosure.
Figure 19B:
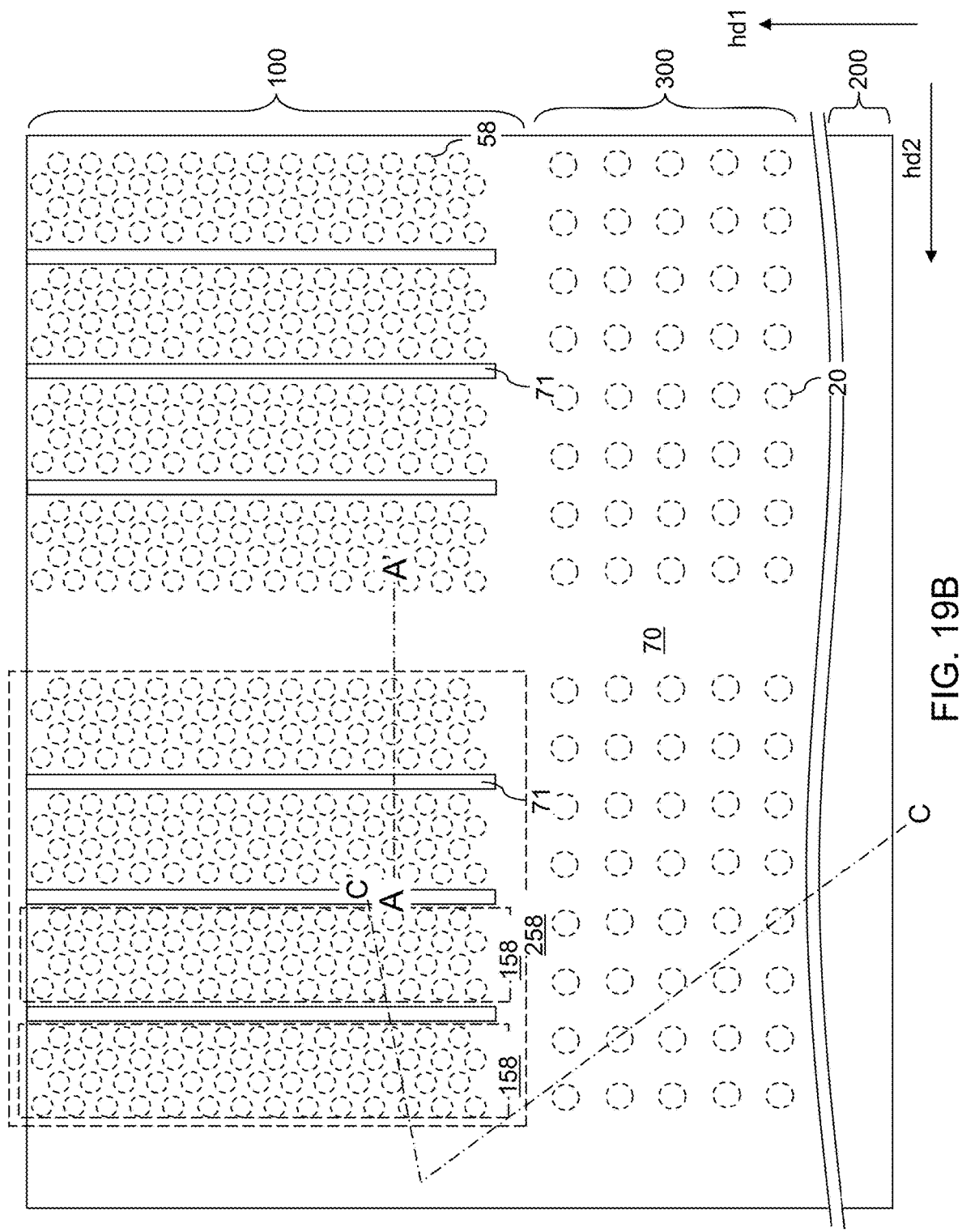
FIG. 19B is a partial see-through top-down view of the first exemplary structure of FIG. 19A. The vertical plane A-A' is the plane of the schematic vertical cross-sectional view of FIG. 19A.
Figure 19C:
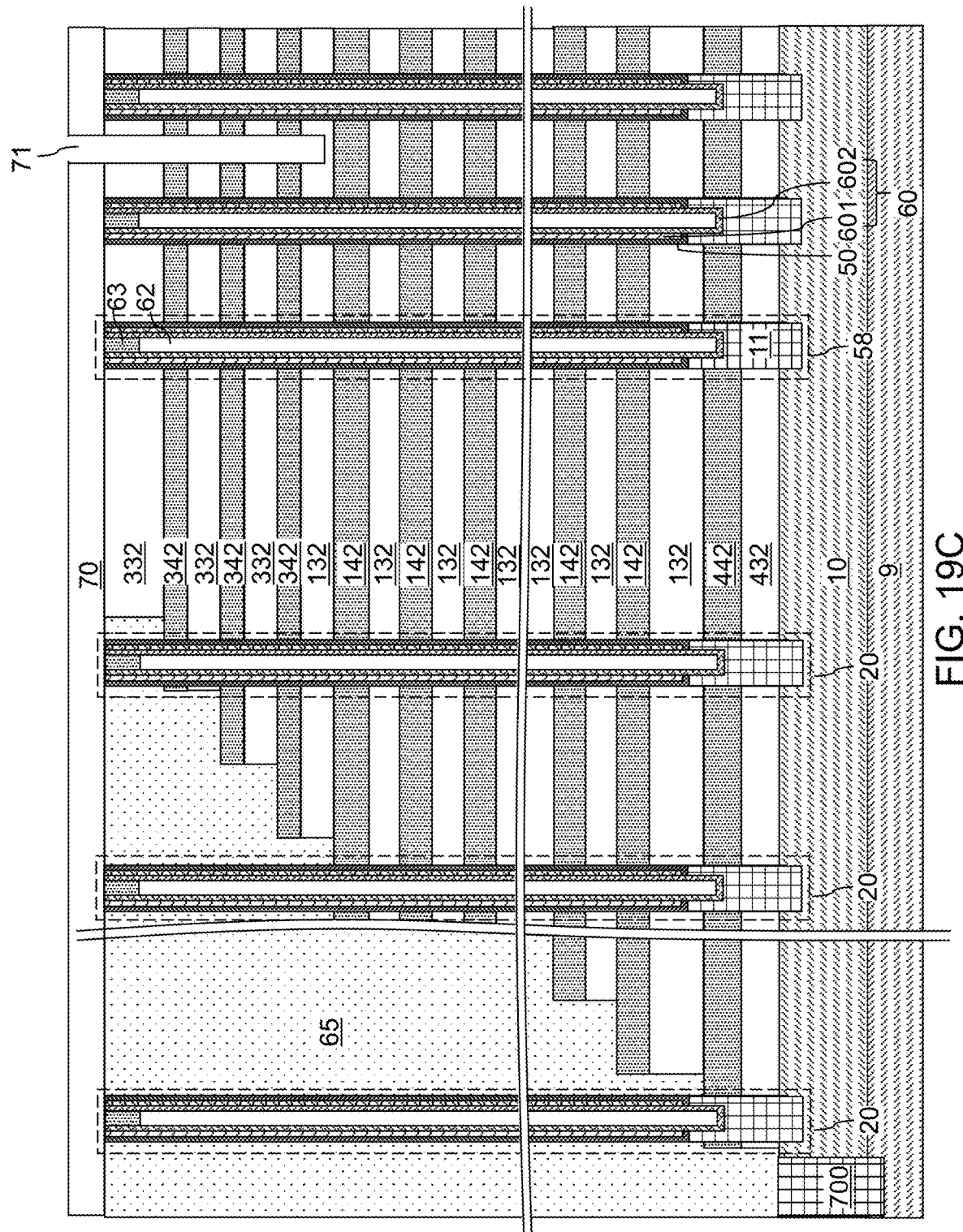
FIG. 19C is a schematic vertical cross-sectional view of the first exemplary structure along the hinged vertical plane C-C' of FIG. 19B.

Referring to FIGS. 19A and 19B, the processing steps of FIGS. 8A and 8B may be performed. Specifically, a first photoresist layer (not shown) may be applied over the contact-level dielectric layer 70, and may be lithographically patterned to form narrow openings that extend along the first horizontal direction hd1 between clusters 158 of memory stack structures 55. Multiple clusters 158 of memory stack structures 55 may be positioned in proximity from one another to define a group 258 of memory stack structures 55. The groups 258 of memory stack structures 55 may be laterally spaced from one another by a respective strip-shaped space that is free of memory stack structures 55 and support pillar structures 20.

An anisotropic etch process is performed to transfer the pattern of the openings in the photoresist layer through the contact-level dielectric layer 70, each drain-select-level insulating layer 332, and each drain-select-level sacrificial material layer 342 of the alternating stack {(432, 132, 332), (442, 142, 342)}. Drain-select-level trenches 71 are formed through the drain-select-level layers (332, 342) of the alternating stack {(432, 132, 332), (442, 142, 342)}. Each drain-select-level trench 71 may be formed between a neighboring pair of clusters 158 of memory stack structures 55. Each drain-select-level trench 71 may laterally extend along the first horizontal direction hd1 with a uniform width along the second horizontal direction. In one embodiment, each drain-select-level trench 71 may be laterally spaced from the memory stack structures 55 to avoid cutting through portions of the memory stack structures 55. Each drain-select-level trench 71 may include a pair of lengthwise sidewalls that are parallel to the first horizontal direction hd1. Each sidewall of the drain-select-level trenches 71 may be straight sidewalls. The first photoresist layer may be subsequently removed, for example, by ashing.

Figure 20:
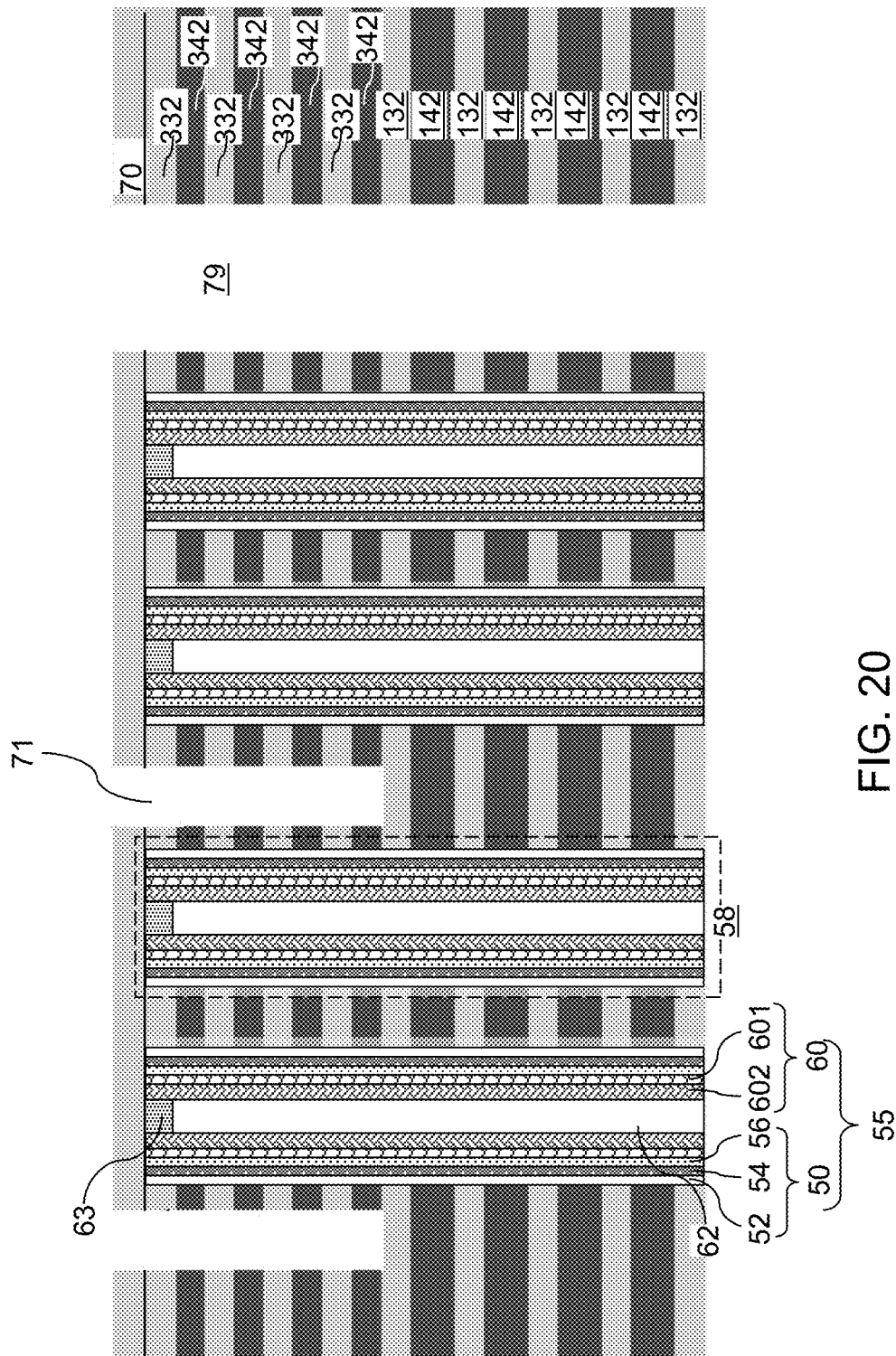
FIG. 20 is a schematic vertical cross-sectional view of the second exemplary structure after formation of backside trenches according to an embodiment of the present disclosure.

Referring to FIG. 20, a second photoresist layer (not shown) may be applied over the contact-level dielectric layer 70, and may be lithographically patterned to form openings in areas between groups 258 of memory stack structures 55. The openings in the photoresist layer may be elongated openings that laterally extend along the first horizontal direction hd1. The pattern in the photoresist layer may be transferred through the contact-level dielectric layer 70, the alternating stack {(432, 132, 332), (442, 142, 342)} and/or the retro-stepped dielectric material portion 65 using an anisotropic etch to form backside trenches 79, which vertically extend from the top surface of the contact-level dielectric layer 70 at least to the top surface of the substrate (9, 10), and laterally extend through the memory array region 100 and the staircase region 300.

In one embodiment, the backside trenches 79 may laterally extend along a first horizontal direction hd1 and may be laterally spaced apart from one another along a second horizontal direction hd2 that is perpendicular to the first horizontal direction hd1. The memory stack structures 55 may be arranged in rows that extend along the first horizontal direction hd1. The drain-select-level trenches 71 may laterally extend along the first horizontal direction hd1. Each backside trench 79 may have a uniform width that is invariant along the lengthwise direction (i.e., along the first horizontal direction hd1). The width of the backside trenches 79 may be greater than the width of the drain-select-level trenches 71. Each drain select level isolation structure 72 may have a uniform vertical cross-sectional profile along vertical planes that are perpendicular to the first horizontal direction hd1 that is invariant with translation along the first horizontal direction hd1. Multiple rows of memory stack structures 55 may be located between a neighboring pair of a backside trench 79 and a drain select level isolation structure 72, or between a neighboring pair of drain-select-level trenches 71. In one embodiment, the backside trenches 79 may include a source contact opening in which a source contact via structure may be subsequently formed. The second photoresist layer may be removed, for example, by ashing.

Figure 21A:
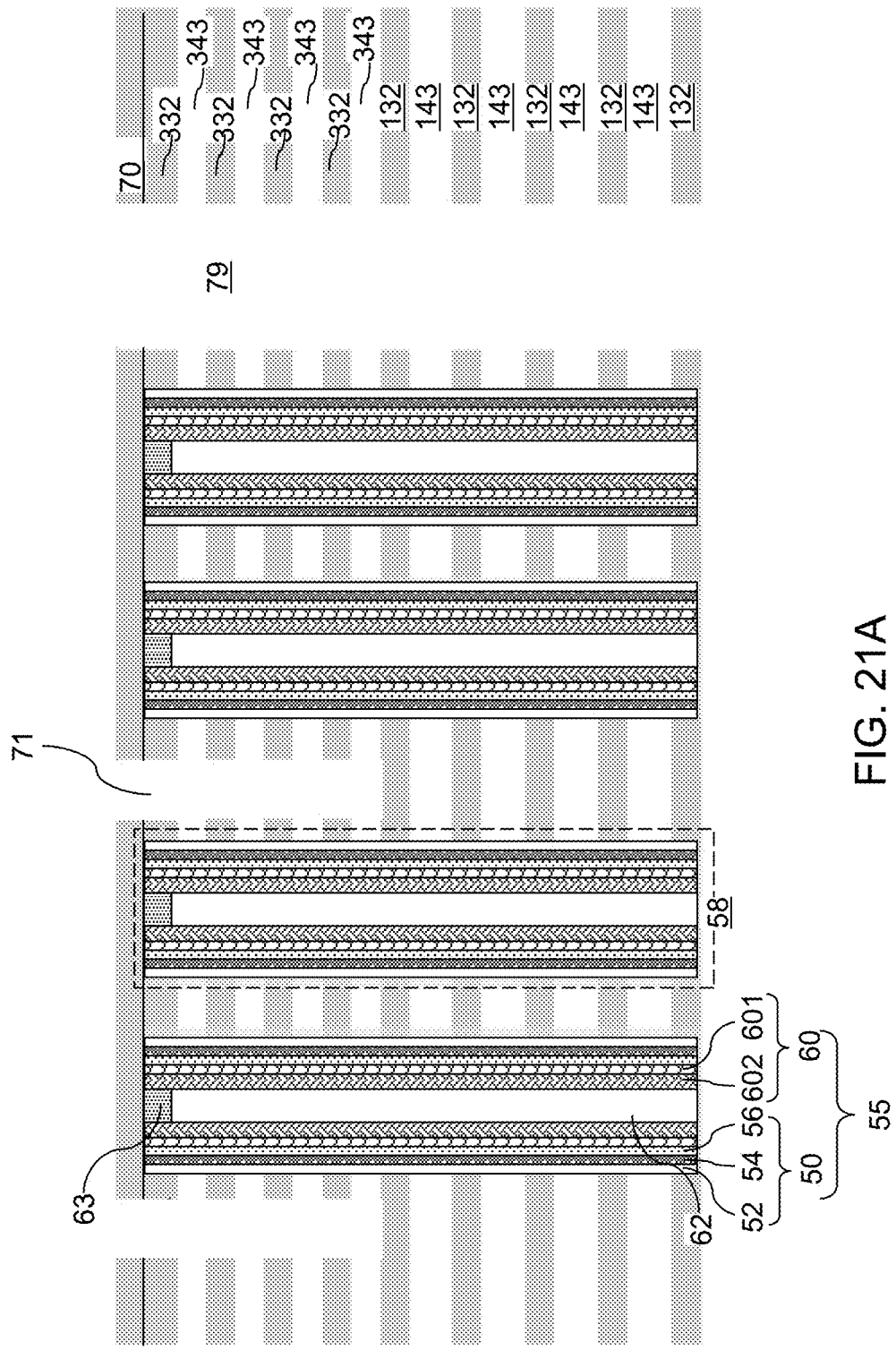
FIG. 21A is a schematic vertical cross-sectional view of the second exemplary structure after formation of backside recesses according to an embodiment of the present disclosure.
Figure 21B:
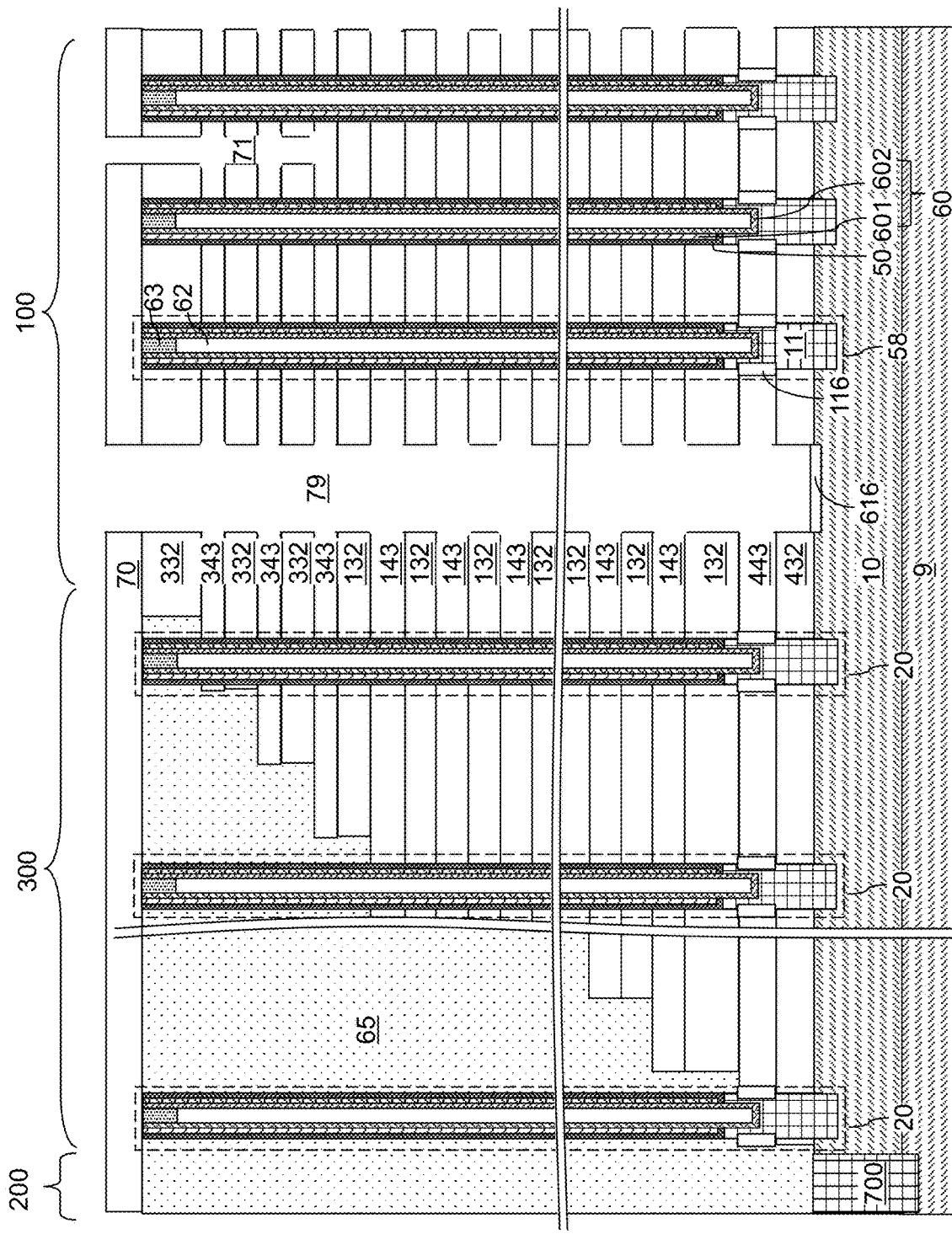
FIG. 21B is another schematic vertical cross-sectional view of the second exemplary structure of FIG. 21A.

Referring to FIGS. 21A and 21B, an etchant that selectively etches the second material of the sacrificial material layers (442, 142, 342) with respect to the first material of the insulating layers (432, 132, 332) may be introduced into the backside trenches 79, for example, using an etch process. Backside recesses may be formed in volumes from which the sacrificial material layers (442, 142, 342) are removed. The backside recesses include word-line-level backside recesses 143 that may be formed in volumes from which the word-line-level sacrificial material layers 142 are removed, drain-select-level backside recesses 343 that may be formed in volumes from which the drain-select-level sacrificial material layers 342 are removed, and source-select-level backside recesses 443 that may be formed in volumes from which the source-select-level sacrificial material layer 442 is removed. The removal of the second material of the sacrificial material layers (442, 142, 342) may be selective to the first material of the insulating layers (432, 132, 332), the material of the retro-stepped dielectric material portion 65, the semiconductor material of the semiconductor material layer 10, and the material of the outermost layer of the memory films 50. In one embodiment, the sacrificial material layers (442, 142, 342) may include silicon nitride, and the materials of the insulating layers (432, 132, 332) and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers (442, 142, 342) include silicon nitride, the etch process may be a wet etch process in which the first exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses (443, 143, 343) are present within volumes previously occupied by the sacrificial material layers (442, 142, 342).

Each backside recess (443, 143, 343) may be a laterally extending cavity having a lateral dimension that is greater than the vertical extent of the cavity. In other words, the lateral dimension of each backside recess (443, 143, 343) may be greater than the height of the backside recess (443, 143, 343). A plurality of backside recesses (443, 143, 343) may be formed in the volumes from which the second material of the sacrificial material layers (442, 142, 342) is removed. The memory openings in which the memory stack structures 55 are formed are herein referred to as front side openings or front side cavities in contrast with the backside recesses (443, 143, 343). In one embodiment, the memory array region 100 comprises an array of monolithic three-dimensional NAND strings having a plurality of device levels disposed above the substrate (9, 10). In this case, each backside recess (443, 143, 343) may define a space for receiving a respective word line of the array of monolithic three-dimensional NAND strings.

The drain-select-level backside recesses 343 may be connected to the drain-select-level trenches 71. Each of the plurality of backside recesses (443, 143, 343) may extend substantially parallel to the top surface of the substrate (9, 10). A backside recess (443, 143, 343) may be vertically bounded by a top surface of an underlying insulating layer (432, 132, 332) and a bottom surface of an overlying insulating layer (132, 332). In one embodiment, each backside recess (443, 143, 343) may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Figure 22:
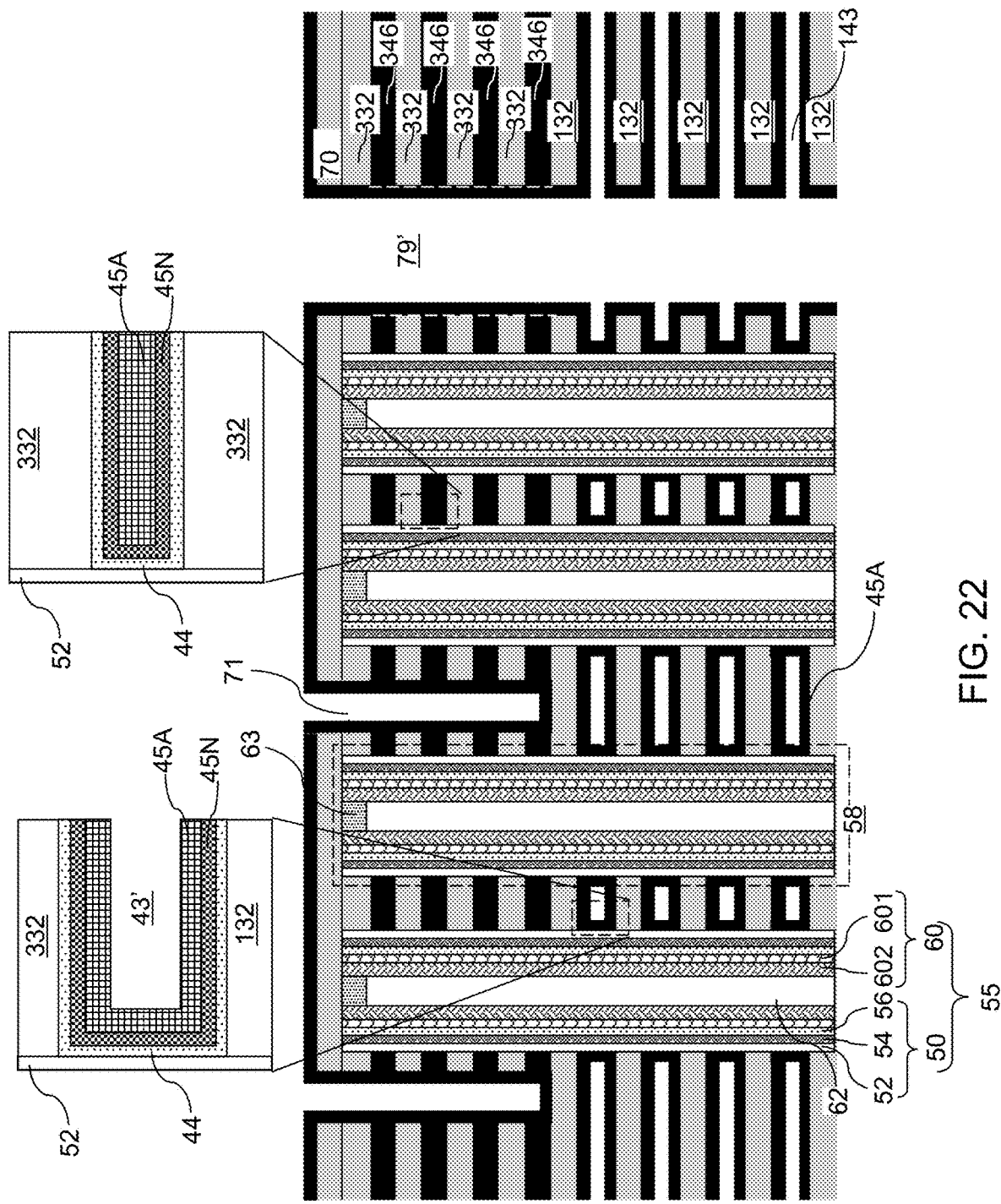
FIG. 22 is a schematic vertical cross-sectional view of the second exemplary structure after formation of a first continuous electrically conductive material layer according to the second embodiment of the present disclosure.

Referring to FIG. 22, a backside blocking dielectric layer 44 may be optionally formed. The backside blocking dielectric layer 44, if present, comprises a dielectric material that functions as a control gate dielectric for the control gates to be subsequently formed in the backside recesses (443, 143, 343). The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. In embodiments in which the blocking dielectric layer 52 is present within each memory opening, the backside blocking dielectric layer 44 is optional. In embodiments in which the blocking dielectric layer 52 is omitted, the backside blocking dielectric layer 44 is present. The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

A continuous metallic barrier layer 45N may be deposited in the backside recesses (443, 143, 343). The continuous metallic barrier layer 45N may include an electrically conductive metallic material that may function as a diffusion barrier layer and/or adhesion promotion layer for a metallic fill material to be subsequently deposited. The continuous metallic barrier layer 45N may include a conductive metallic nitride material such as TiN, TaN, WN, or a stack thereof, or may include a conductive metallic carbide material such as TiC, TaC, WC, or a stack thereof. In one embodiment, the continuous metallic barrier layer 45N may be deposited by a conformal deposition process such as chemical vapor deposition (CVD) or atomic layer deposition (ALD). The thickness of the continuous metallic barrier layer 45N may be in a range from 2 nm to 8 nm, such as from 3 nm to 6 nm, although lesser and greater thicknesses may also be used. In one embodiment, the continuous metallic barrier layer 45N may consist essentially of a conductive metal nitride such as TiN.

A first metal fill material is deposited in the backside recesses (443, 143, 343), in the drain-select-level trenches 71, on the sidewalls of the backside trenches 79, and over the top surface of the contact-level dielectric layer 70 to form a first continuous electrically conductive material layer 45A. The first continuous electrically conductive material layer 45A may be deposited by a conformal deposition method, which may be, for example, chemical vapor deposition (CVD), atomic layer deposition (ALD), electroless plating, electroplating, or a combination thereof. In one embodiment, the first continuous electrically conductive material layer 45A may consist essentially of at least one elemental metal. The at least one elemental metal of the first continuous electrically conductive material layer 45A may be selected, for example, from tungsten, cobalt, ruthenium, titanium, and tantalum. In one embodiment, the first continuous electrically conductive material layer 45A may consist essentially of a single elemental metal. In one embodiment, the first continuous electrically conductive material layer 45A may be deposited using a fluorine-containing precursor gas such as $WF_6$. In one embodiment, the first continuous electrically conductive material layer 45A may be a tungsten layer including a residual level of fluorine atoms as impurities.

The thicknesses of the optional backside blocking dielectric layer 44, the continuous metallic barrier layer 45N, and the first continuous electrically conductive material layer 45A may be selected such that the sum of the thicknesses of the optional backside blocking dielectric layer 44, the continuous metallic barrier layer 45N, and the first continuous electrically conductive material layer 45A is greater than one half of the maximum height of the drain-select-level backside recesses 343, and is less than one half of the minimum height of the word-line-level backside recesses 143 and the source-select-level backside recess 443. In one embodiment, each of the word-line-level backside recesses 143 may have a first height, and each of the drain-select-level backside recesses 343 may have a second height that is in a range from 20% to 80%, such as from 30% to 70%, of the first height. The sum of the thicknesses of the optional backside blocking dielectric layer 44, the continuous metallic barrier layer 45N, and the first continuous electrically conductive material layer 45A may be greater than one half of the second height, and may be less than one half of the first height. The first continuous electrically conductive material layer 45A may fill all remaining volumes of the drain-select-level backside recesses 343, and does not completely fill any of the word-line-level backside recesses 143. Thus, the combination of the optional backside blocking dielectric layer 44, the continuous metallic barrier layer 45N, and the first continuous electrically conductive material layer 45A may fill all volumes of the drain-select-level backside recesses 343, and partially fills volumes of the drain-select-level backside recesses 343. In other words, the first continuous electrically conductive material layer 45A completely fills each of the drain-select-level backside recesses 343, and does not completely fill any of the word-line-level backside recesses 143 upon completion of deposition of the first continuous electrically conductive material layer 45A. An unfilled volume 43' is present within each volume of the word-line-level backside recesses 143.

Figure 23:
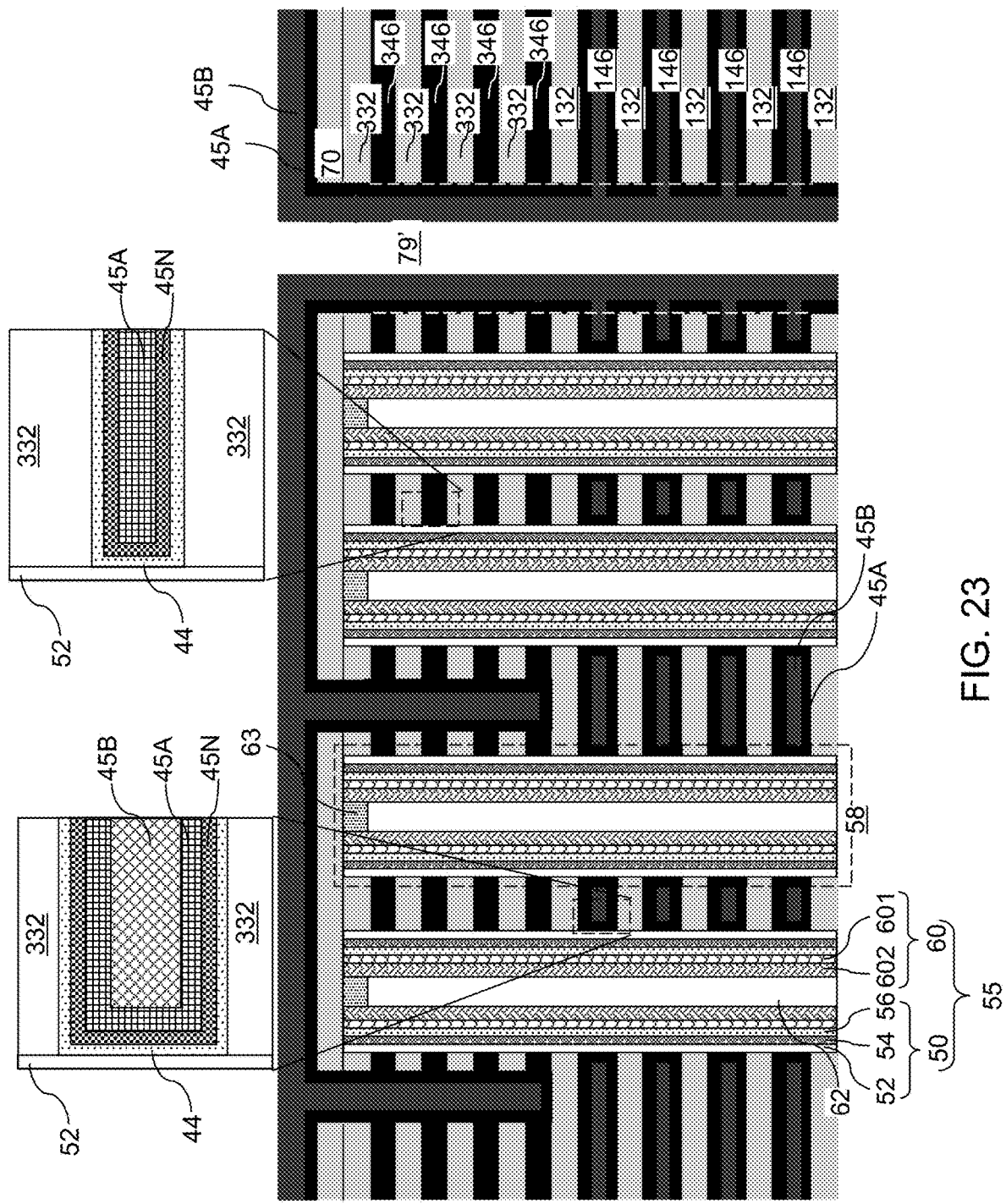
FIG. 23 is a schematic vertical cross-sectional view of the second exemplary structure after formation of a second continuous electrically conductive material layer according to the second embodiment of the present disclosure.

Referring to FIG. 23, a second metal fill material is deposited in remaining unfilled volumes of the source-select-level backside recesses 443, the word-line-level backside recesses 143, the drain-select-level trenches 71, at a peripheral portion of each backside trench 79, and over the horizontal portion of the first continuous electrically conductive material layer 45A overlying the contact-level dielectric layer 70. A second continuous electrically conductive material layer 45B may be formed on the physically exposed surfaces of the first continuous electrically conductive material layer 45A. The second continuous electrically conductive material layer 45B may be deposited by a conformal deposition method, which may be, for example, chemical vapor deposition (CVD), atomic layer deposition (ALD), electroless plating, electroplating, or a combination thereof. The second continuous electrically conductive material layer 45B may consist essentially of at least one elemental metal. The at least one elemental metal of the second continuous electrically conductive material layer 45B is different from the at least one elemental metal of the first continuous electrically conductive material layer 45A, and may be selected, for example, from tungsten, cobalt, ruthenium, molybdenum, titanium, and tantalum. For example, the first continuous electrically conductive material layer 45A may include tungsten, and the second continuous electrically conductive material layer 45B may consist essentially of a single elemental metal selected from cobalt, ruthenium, and molybdenum. The second continuous electrically conductive material layer 45B may completely fill the backside recesses (443, 143, 343).

The width of each drain-select-level trench 71 and the thicknesses of the backside blocking dielectric layer 44, the continuous metallic barrier layer 45N, and the first continuous electrically conductive material layer 45A may be selected such that a vertically extending unfilled volume exists within each drain-select-level trench 71 after deposition of the first continuous electrically conductive material layer 45A. The vertically extending unfilled volumes of the drain-select-level trenches 71 may be filled by the second continuous electrically conductive material layer 45B. A backside cavity 79' is present within each backside trench 79.

Figure 24:
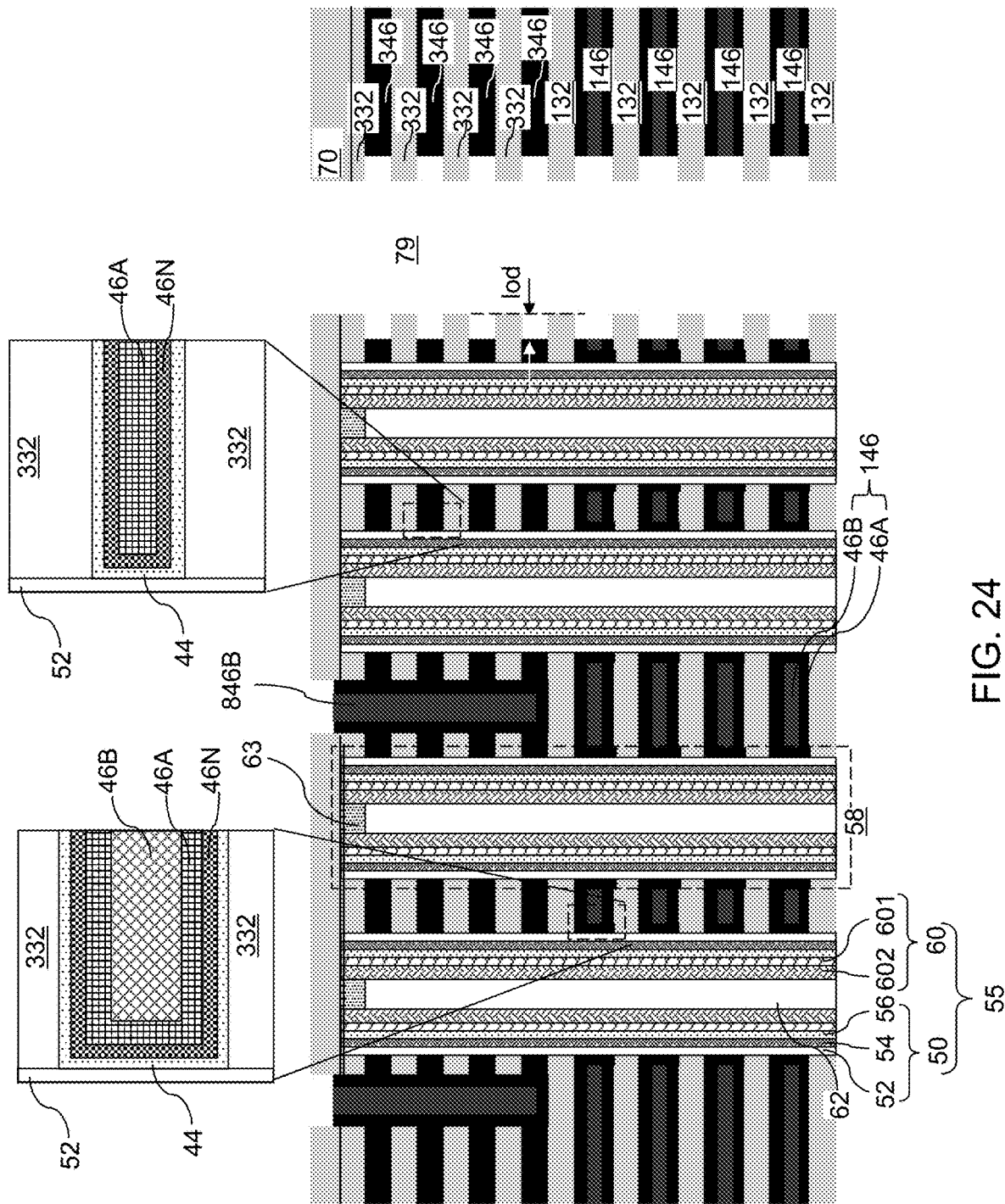
FIG. 24 is a schematic vertical cross-sectional view of the second exemplary structure after isotropically recessing the materials of the second electrically conductive layer and the first electrically conductive layer according to the second embodiment of the present disclosure.

Referring to FIG. 24, an isotropic recess etch process is performed to etch back the materials of the continuous metallic barrier layer 45N, the first continuous electrically conductive material layer 45A, and the second continuous electrically conductive material layer 45B selective to the material of the optional backside blocking dielectric layer 44 (if present) and/or selective to the material of the insulating layers (432, 132, 332) and the contact-level dielectric layer 70. A wet etch process that etches metallic materials selective to dielectric materials may be used. The metallic barrier material of the continuous metallic barrier layer 45N, the first electrically conductive material of the first continuous electrically conductive material layer 45A, and the second electrically conductive material of the second continuous electrically conductive material layer 45B may be etched back from the backside trenches 79 and from above the contact-level dielectric layer 70 by the isotropic recess etch process.

Further, the isotropic recess etch process may laterally recess the metallic barrier material, the first electrically conductive material, and the second electrically conductive material in volumes of the backside recesses (443, 143, 343) relative to sidewalls of the insulating layers (432, 132, 332) that are exposed to the backside trenches 79. Thus, each sidewall of the electrically conductive layers (146, 346) may be laterally recessed relative to sidewalls of the insulating layers (432, 132, 332) by a lateral offset distance lod, which may be in a range from 5 nm to 100 nm, although lesser and greater distances may also be used.

The combination of the continuous metallic barrier layer 45N, the first continuous electrically conductive material layer 45A, and the second continuous electrically conductive material layer 45B is divided into discrete conductive material potions. The discrete material portions include word-line-level electrically conductive layers 146 that fill word-line-level backside recesses 143, drain-select-level electrically conductive layers 346 that fill drain-select-level backside recesses 343, a source-select-level electrically conductive layer (not shown) that fills the source-select-level backside recesses 443. Further, remaining portions of the continuous metallic barrier layer 45N, the first continuous electrically conductive material layer 45A, and the second continuous electrically conductive material layer 45B fill the drain-select-level trenches 71. Each of the electrically conductive layers (146, 346) are formed in the backside recesses (443, 143) and in the drain-select-level trenches 71, and may include remaining portions of the first and second continuous electrically conductive layers (45A, 45B).

Each of the word-line-level electrically conductive layers 146 and the source-select-level electrically conductive layer includes a respective metallic barrier layer 46N that is a patterned remaining portion of the continuous metallic barrier layer 45N, a respective first electrically conductive material layer 46A that is a patterned remaining portion of the first continuous electrically conductive material layer 45A, and a respective second electrically conductive material layers 46B that is a patterned remaining portion of the second continuous electrically conductive material layer 45B. Each of the drain-select-level electrically conductive layers 346 consists of a respective metallic barrier layer 46N that is a patterned remaining portion of the continuous metallic barrier layer 45N and a respective first electrically conductive material layer 46A that is a patterned remaining portion of the first continuous electrically conductive material layer 45A. In other words, the drain-select-level electrically conductive layers 346 do not include any remaining portion of the second continuous electrically conductive material layer 45B.

A first electrically conductive material layer 46A continuously extends through each drain-select-level backside recess 343 and each drain-select-level trench 71 between a pair of backside trenches 79. A second electrically conductive material portion 846B is present within each of the drain-select-level trenches 71. Top surfaces of the first electrically conductive material layer 46A and the second electrically conductive material portions 846B may be vertically recessed relative to the horizontal plane including the top surface of the contact-level dielectric layer 70 by a recess depth, which may be in a range from 3 nm to 100 nm, although lesser and greater recess depths may also be used.

Figure 25:
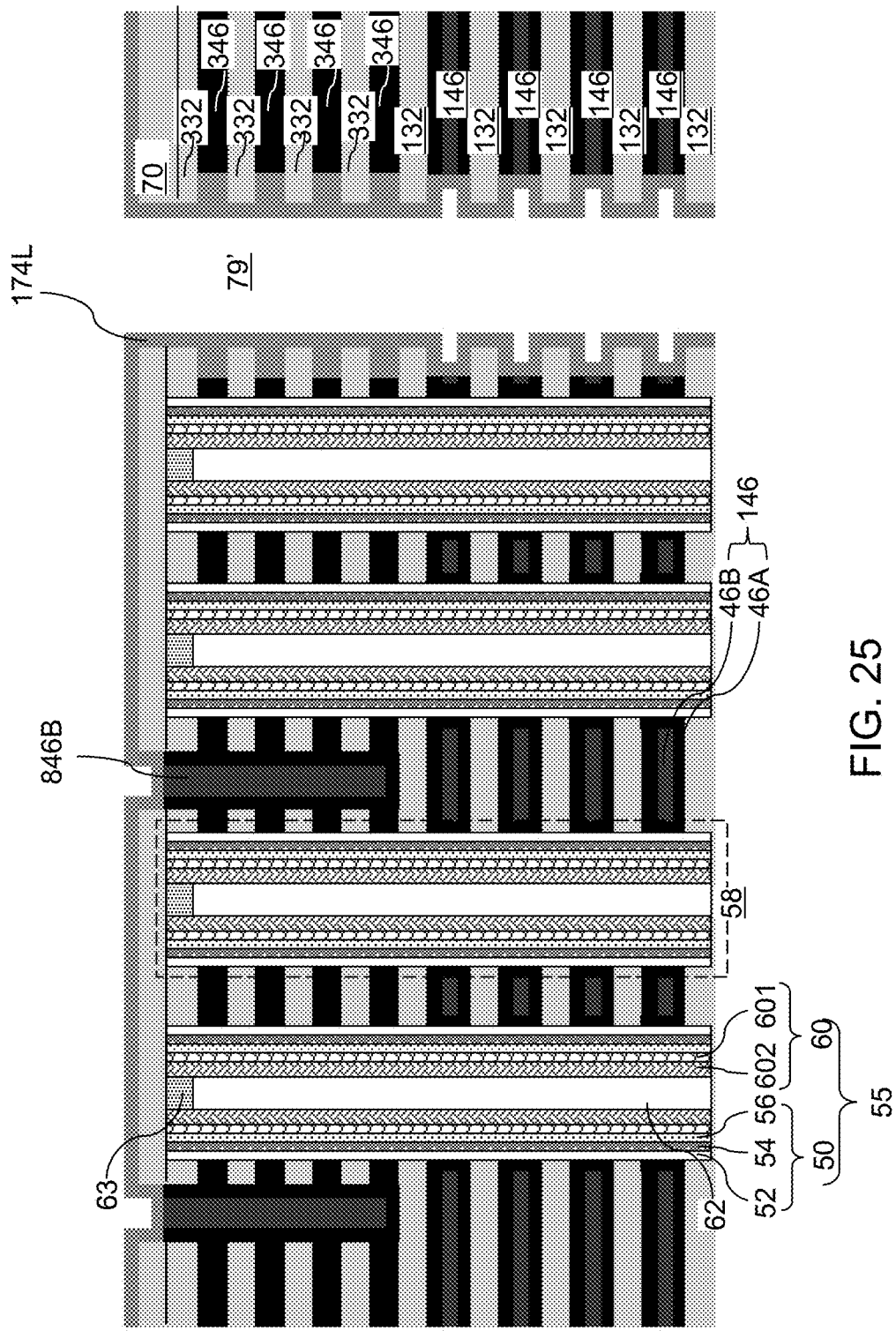
FIG. 25 is a schematic vertical cross-sectional view of the second exemplary structure after deposition of a conformal insulating layer according to the second embodiment of the present disclosure.

Referring to FIG. 25, a conformal insulating layer 174L may be deposited by a conformal deposition method. The conformal insulating layer 174L includes an insulating material such as silicon oxide. In one embodiment, the thickness of the conformal insulating layer 174L may be selected to be less than one half of the first height (i.e., the height of each of the word-line-level backside recesses 143) and greater than one half of the second height (i.e., the height of each of the drain-select-level backside recesses 343). For example, the thickness of the conformal insulating layer 174L may be in a range from 6 nm to 24 nm, although lesser and greater thicknesses may also be used. In this case, the lateral recesses at the levels of the drain-select-level electrically conductive layers 346 may be fully filled with the conformal insulating layer 174L, and the lateral recesses at the levels of the word-line-level electrically conductive layers 146 may be only partially filled with the conformal insulating layer 174L.

Figure 26:
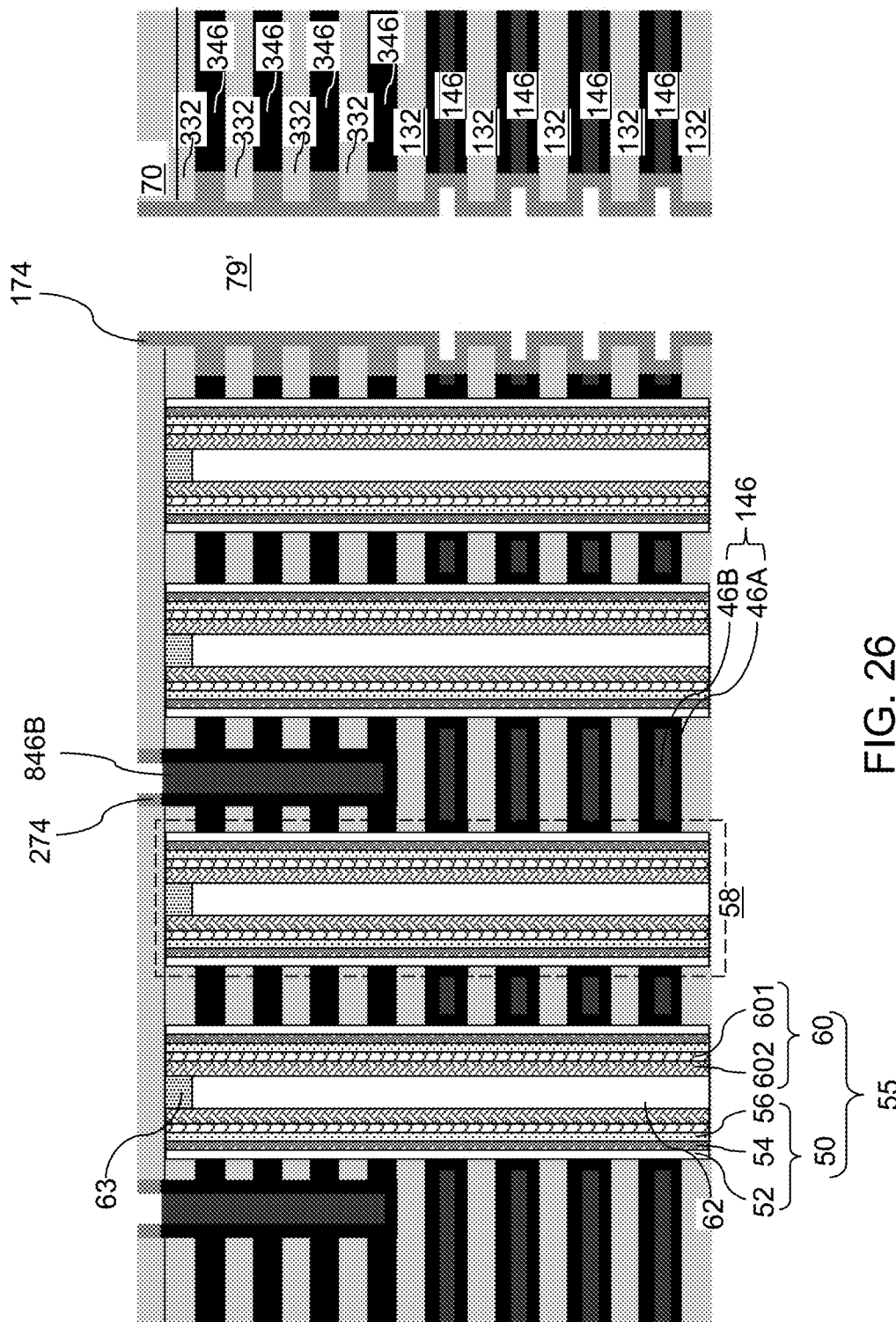
FIG. 26 is a schematic vertical cross-sectional view of the second exemplary structure after anisotropically etching the conformal insulating layer to form a conformal insulating spacer and drain-select-level trench insulating spacers according to the second embodiment of the present disclosure.

Referring to FIG. 26, an anisotropic etch process may be performed to remove horizontal portions of the conformal insulating spacer 174L. Each remaining portion of the conformal insulating spacer 174L in a backside trench 79 constitutes a conformal insulating spacer 174. A backside cavity 79' is present within each backside trench 79. A top surface of the semiconductor material layer 10 may be physically exposed at the bottom of each backside cavity 79'. A remaining portion of the conformal insulating layer 174L in an upper portion of each drain-select-level trench constitutes a drain-select-level trench insulating spacer 274. In one embodiment, the thickness of the first electrically conductive material layers 46A in the drain-select-level trenches 71 may be in a range from 30% to 100%, such as from 50% to 80%, of the lateral thickness of the drain-select-level trench insulating spacers 274.

Figure 27:
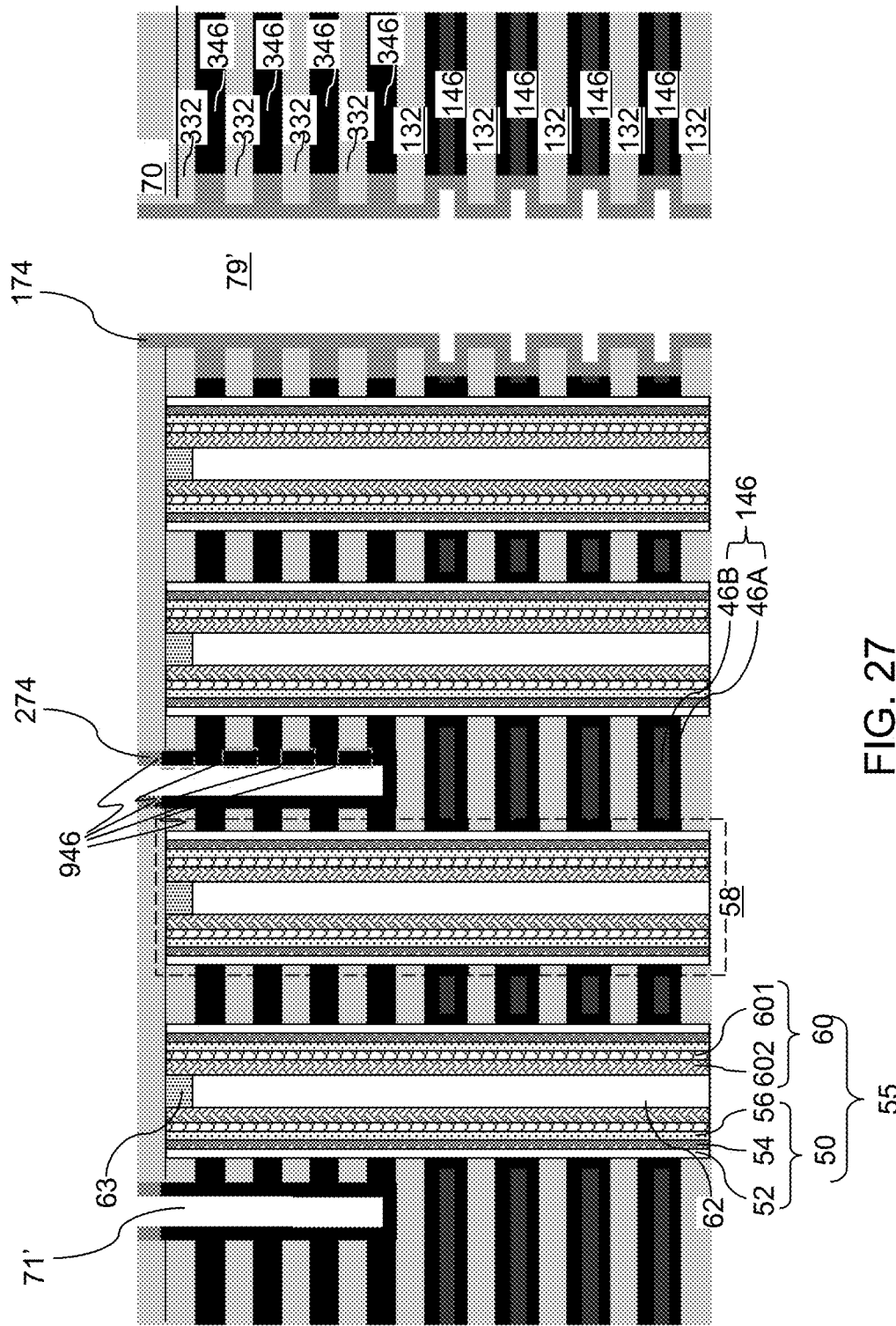
FIG. 27 is a schematic vertical cross-sectional view of the second exemplary structure after anisotropically etching the material of second electrically conductive layers selective to the material of first electrically conductive layers according to the second embodiment of the present disclosure.

Referring to FIG. 27, an anisotropically etch process may be performed to etch the second electrically conductive material of the second electrically conductive material portion 846B. The anisotropic etch may, or may not, be selective to the first electrically conductive material. A cavity 71' is formed in each volume from which the second electrically conductive material portions 846B is removed. A vertical conductive strip 946 including the first electrically conductive material and optionally including the metallic barrier material is present within each drain-select-level trench 71.

If the anisotropic etch process is selective to the first electrically conductive material, the vertical conductive strips 946 may have the same lateral thickness as the thickness of the first continuous electrically conductive material layer 45A as originally deposited. In this case, a top surface of a first electrically conductive material layer 46A may be physically exposed at the bottom of each cavity 71' after removal of the second electrically conductive material portions 846B.

If the anisotropic etch process is not selective to the first electrically conductive material, the vertical conductive strips 946 may have a lesser lateral thickness as the thickness of the first continuous electrically conductive material layer 45A as originally deposited. In this case, the lateral thickness of the vertical conductive strips 946 may be the same as the lateral thickness of an overlying drain-select-level trench insulating spacer 274. In this case, a horizontal portion of a first electrically conductive material layer 46A may be etched through at the bottom of each cavity 71', and a top surface of a topmost word-line-level insulating layer 132 may be physically exposed at the bottom of each cavity 71'.

Figure 28:
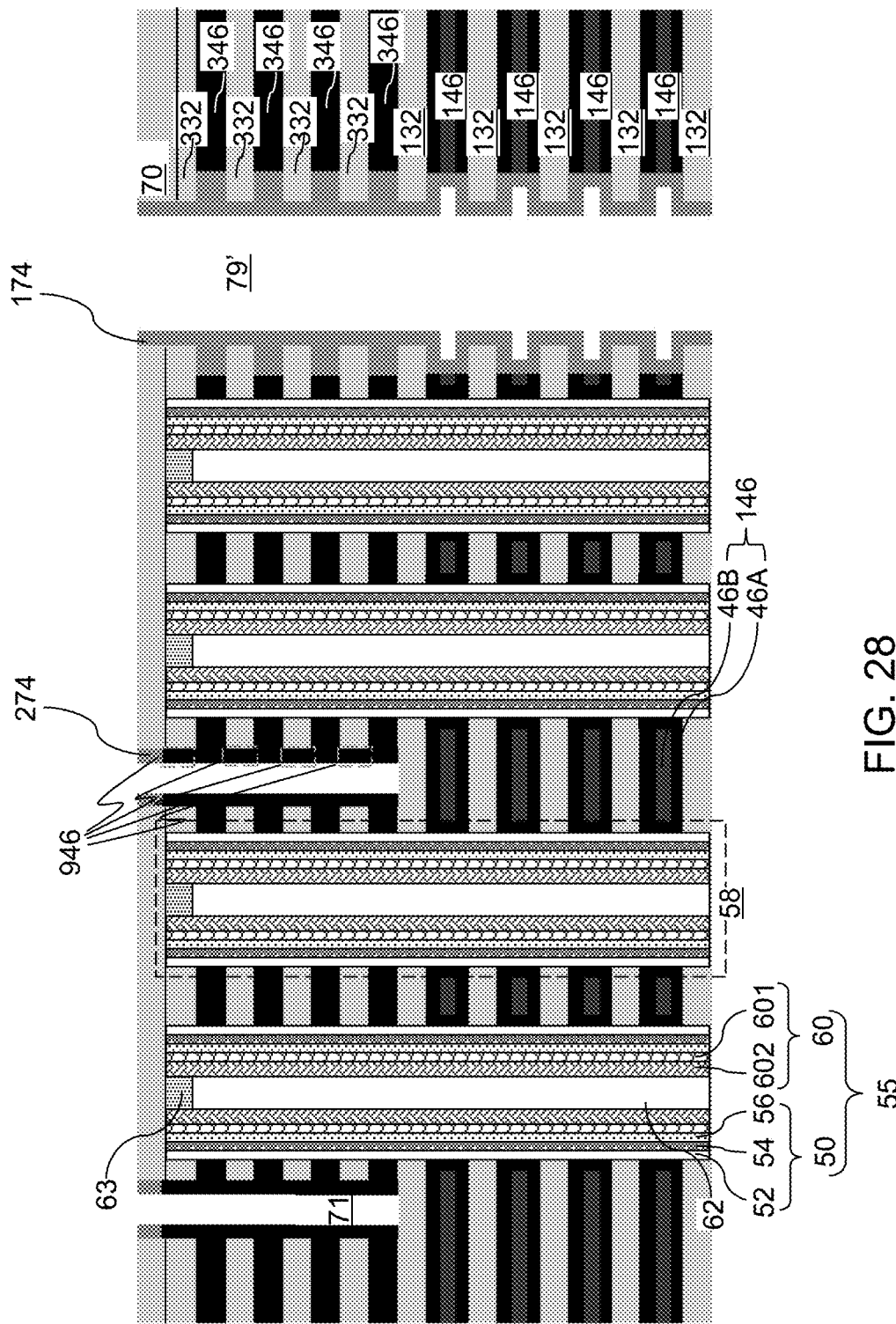
FIG. 28 is a schematic vertical cross-sectional view of the second exemplary structure after anisotropically etching the material of the first electrically conductive layers according to the second embodiment of the present disclosure.

Referring to FIG. 28, in case the anisotropic etch is selective to the first electrically conductive material, another anisotropic etch process may be performed to etch each horizontal portion of the first electrically conductive material layer 46A and metallic barrier layers 46N that underlie the cavities 71' within the drain-select-level trenches 71. Each of the drain-select-level electrically conductive layers 346 is laterally divided at the drain-select-level trenches into laterally disjoined strips. Multiple groups of drain-select-level electrically conductive layers 346 may be laterally spaced apart, and may be electrically isolated from one another. Remaining portions of the first electrically conductive material layers 46A and the metallic barrier layers 46N within the volumes of the drain-select-level trenches 71 constitute vertical conductive strips 946.

End segments of the vertical conductive strips 946 located at lengthwise ends of each drain-select-level trench 71 may be removed, for example, by applying a photoresist layer over the first exemplary structure, lithographically patterning the photoresist layer to form openings that physically expose lengthwise ends of the drain-select-level trenches 71, and by removing the physically exposed end segments of the vertical conductive strips 946. For example, if a drain-select-level trench 71 has an elongated horizontal cross-sectional shape with a pair of lengthwise sidewalls that extend along the first horizontal direction and a pair of widthwise sidewalls that extend along the second horizontal direction, segments of the vertical conductive strips 946 that are located on the widthwise sidewalls of the drain-select-level trenches 71 may be removed. The photoresist layer may be subsequently removed. Upon patterning of the vertical conductive strips 946, each drain-select-level trench 71 may include at least two vertical conductive strips 946 that extend along the first horizontal direction.

Groups of drain-select-level electrically conductive layers 346 are laterally spaced apart by the cavities 71' that are formed in the drain-select-level trenches 71. A top surface of the topmost word-line-level insulating layer 132 may be physically exposed at the bottom of each drain-select-level trench 71. Each drain-select-level electrically conductive layer 346 within each group of drain-select-level electrically conductive layers 346 may be electrically connected to and from each other or one another by at least one vertical conductive strip 946. Each vertical conductive strip 946 may contact a sidewall of a drain-select-level insulating layer 332 and/or a sidewall of the contact-level dielectric layer 70. Drain-select-level electrically conductive layers 346 having sidewalls that are exposed to a backside trench 79 and provided within a same group may be connected to and from one another by a single set of vertical conductive strip 946 located within a same drain-select-level trench 71. Drain-select-level electrically conductive layers 346 including sidewalls that are not exposed to a backside trench 79 and provided within a same group may be connected to and from one another by two sets of vertical conductive strips 946 located within two drain-select-level trenches 79. Each vertical conductive strip 946 includes a first electrically conductive material and a metallic barrier material (if a metallic barrier layer 46N is used). In one embodiment, a plurality of drain-select-level electrically conductive layers 346 may be vertically stacked, and a vertically alternating sequence of at least two drain-select-level electrically conductive layers 346 and at least two vertical conductive strips 946 may be located on each side of a drain-select-level trench 71.

Figure 29:
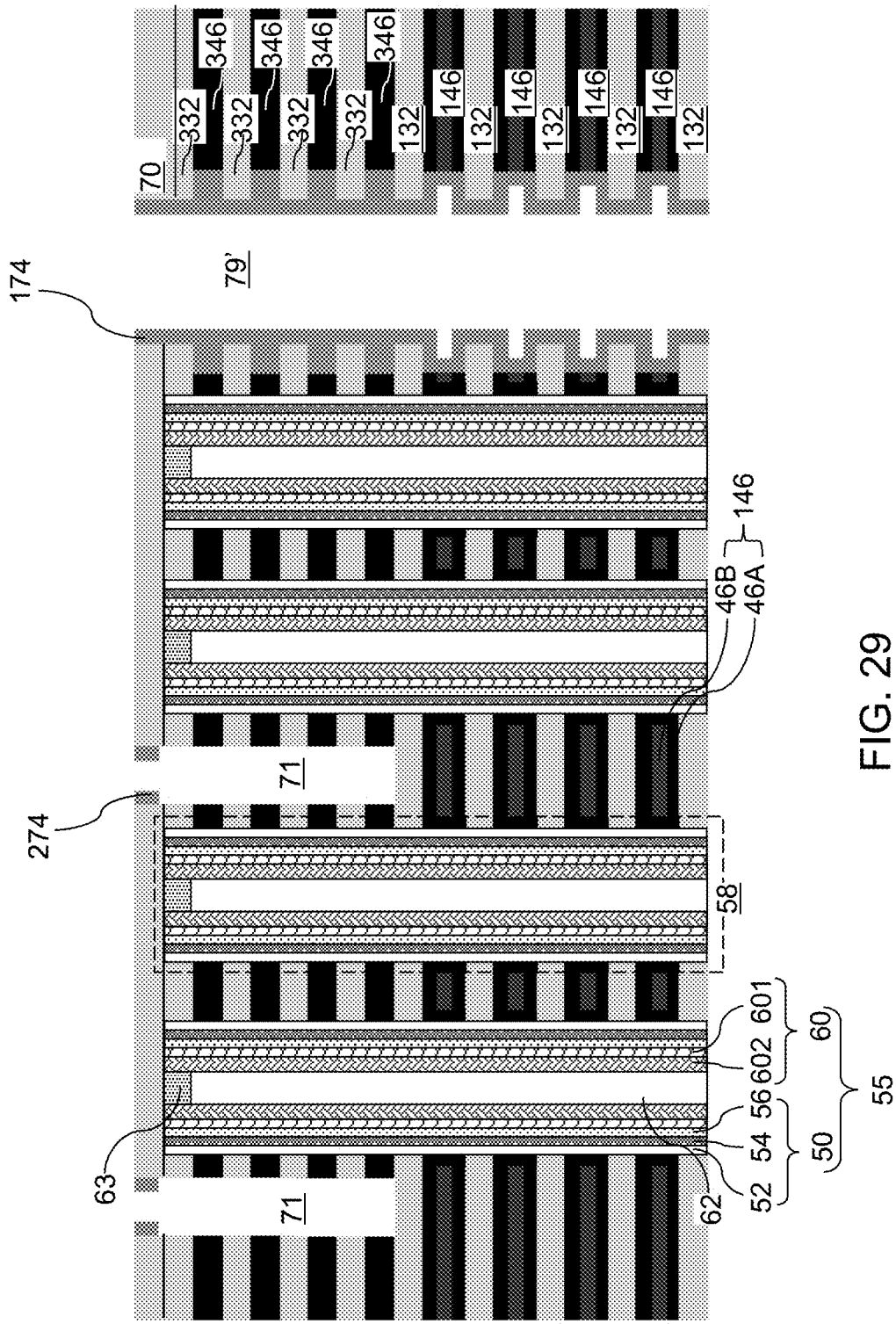
FIG. 29 is a schematic vertical cross-sectional view of the second exemplary structure after an optional step of isotropically etching the material of the first electrically conductive layers according to the second embodiment of the present disclosure.

Referring to FIG. 29, an optional processing step is illustrated, in which the vertical conductive strips 946 may be removed from inside the drain-select-level trenches 71. In this case, each strip of the various drain-select-level electrically conductive layer 346 located at different levels may be independently controlled to activate or deactivate a respective cluster of memory stack structures 55 during operation of the three-dimensional array of memory elements. Alternatively, the processing steps of FIG. 29 may be omitted.

Figure 30:
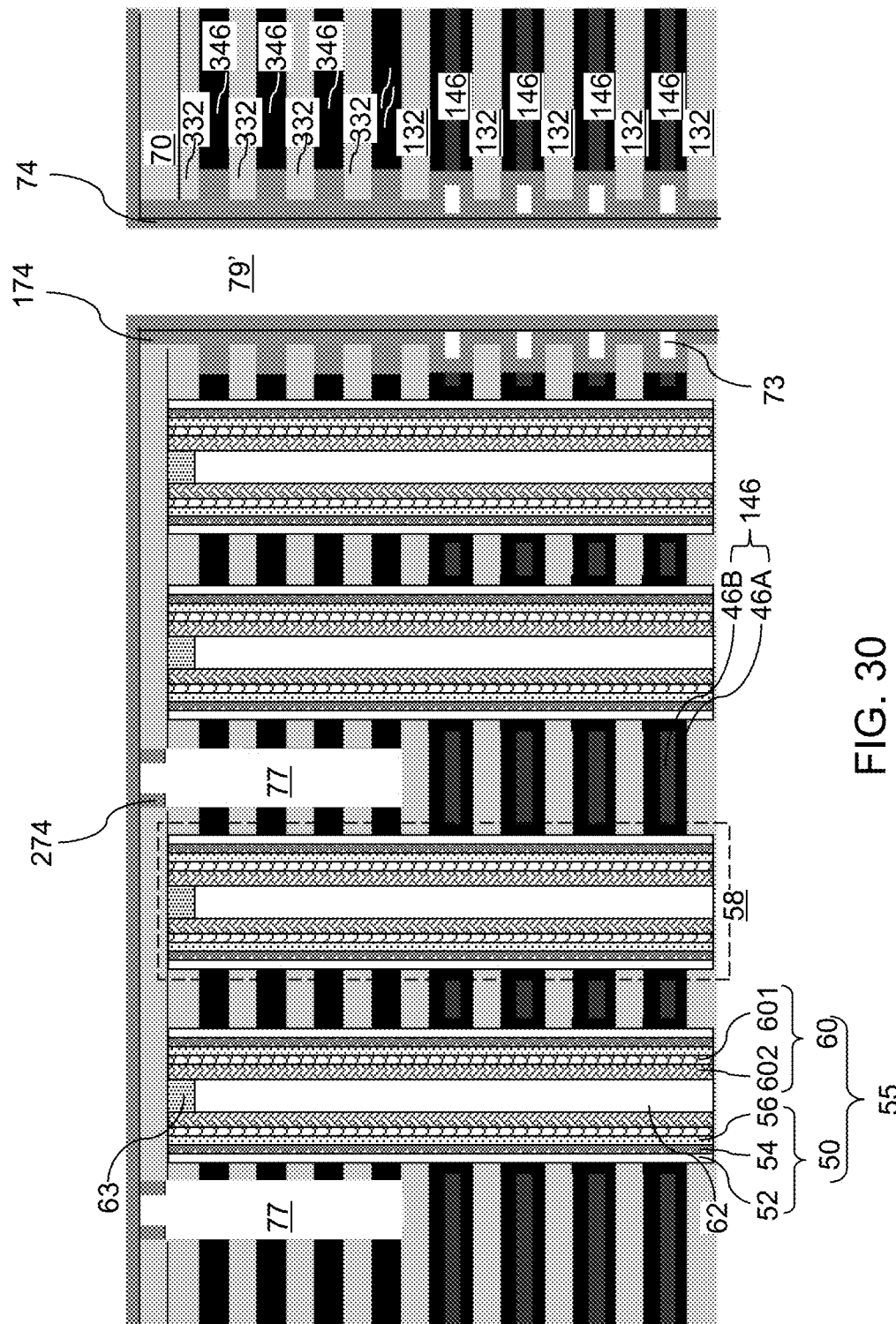
FIG. 30 is a schematic vertical cross-sectional view of the second exemplary structure after anisotropically depositing a nonconformal insulating layer according to the second embodiment of the present disclosure.

Referring to FIG. 30, a nonconformal insulating layer 74 may be anisotropically deposited. The nonconformal insulating layer 74 includes an insulating material such as silicon oxide, and may be deposited by an anisotropic deposition method such as plasma-enhanced chemical vapor deposition. The nonconformal insulating layer 74 may be deposited over the sidewalls of the insulating layers (432, 132, 332) that are exposed to the backside trenches 79 and over the drain-select-level trenches 71. The vertical thickness of the horizontal portion of the nonconformal insulating layer 74 that overlies the contact-level dielectric layer 70 may be greater than the maximum of the lateral thickness of the nonconformal insulating layer 74 in the backside trenches 79. The lateral thickness of the nonconformal insulating layer 74 in the backside trenches 79 may decrease with a vertical distance from the horizontal plane between the top surface of the contact-level dielectric layer 70 and a bottom surface of the horizontal portion of the nonconformal insulating layer 74 that overlies the contact-level dielectric layer 70.

An encapsulated cavity 77 that is free of any solid material therein and bounded by a bottom surface of the nonconformal insulating layer 74 may be formed in the volume(s) of one or more of the drain-select-level trenches 71. In one embodiment, an encapsulated cavity 77 may be vertically bounded by a concave bottom surface of the nonconformal insulating layer 74.

Encapsulated cavities may be formed between laterally recessed sidewalls of the electrically conductive layers 146 and the vertically extending portions of the nonconformal insulating layer 74. The electrically conductive layers (146, 346) include the source-select-level electrically conductive layer (not shown), the word-line-level electrically conductive layers 146, and the drain-select-level electrically conductive layers 346. The encapsulated cavities are herein referred to as pocket cavities 73. The pocket cavities 73 may be formed between each of the word-line-level electrically conductive layers 146 and the source-select-level electrically conductive layer and a respective most proximal one of vertically-extending portions of the nonconformal insulating layer 74 within the backside trenches 79. Each of the pocket cavities 73 is free of any solid material therein. Each pocket cavity 73 may be encapsulated by the conformal insulating spacer 174 and the nonconformal insulating layer 74. Each pocket cavity 79 may laterally extend along the lengthwise direction of an adjacent backside trench 79, and thus, are also referred to rail cavities, i.e., a cavity having a vertical cross-sectional shape that is invariant upon translation along the lengthwise direction of the backside trenches 79.

Figure 15A:
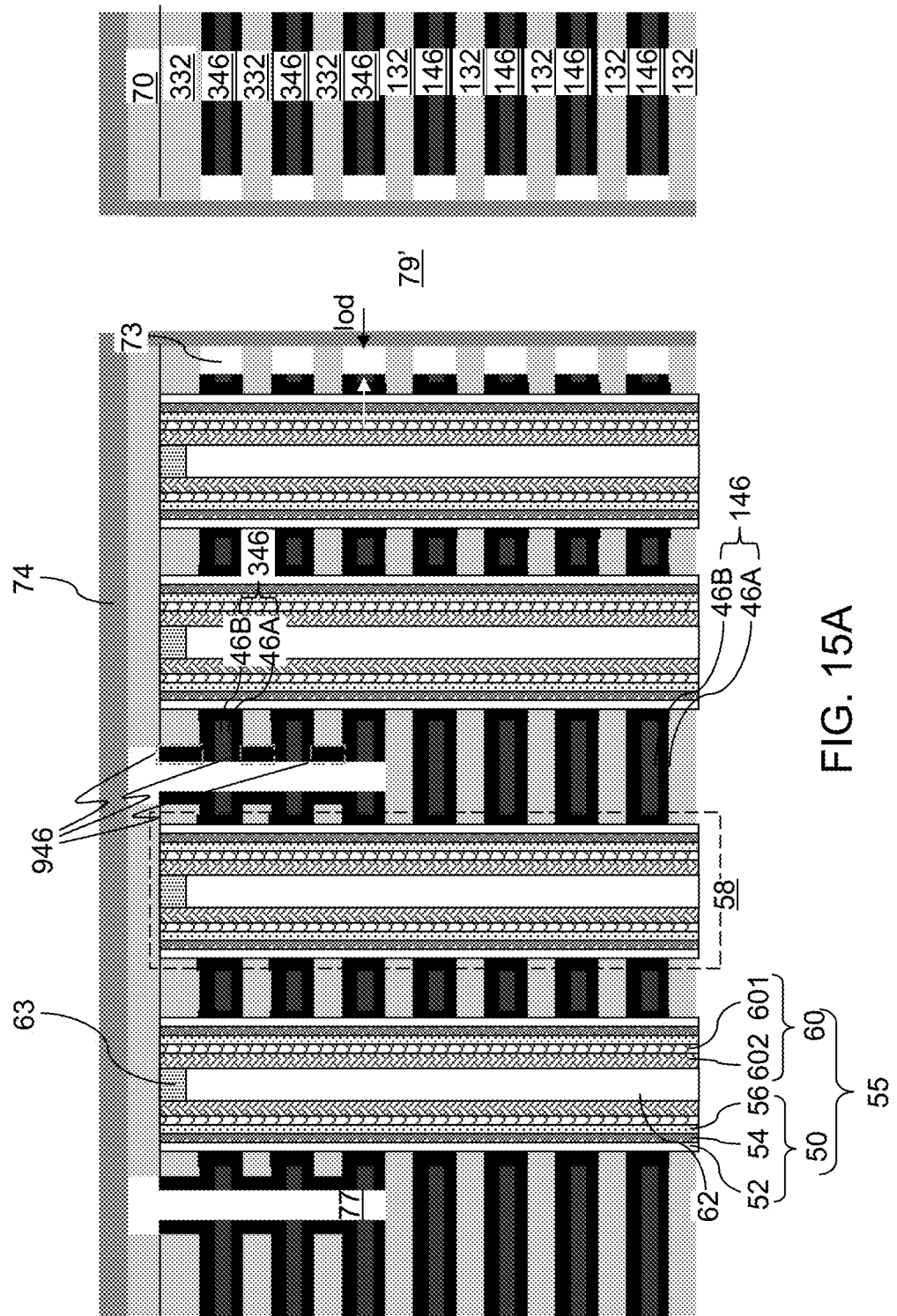
FIG. 15A is a schematic vertical cross-sectional view of the first exemplary structure after anisotropically depositing a nonconformal insulating layer according to the first embodiment of the present disclosure.
Figure 15B:
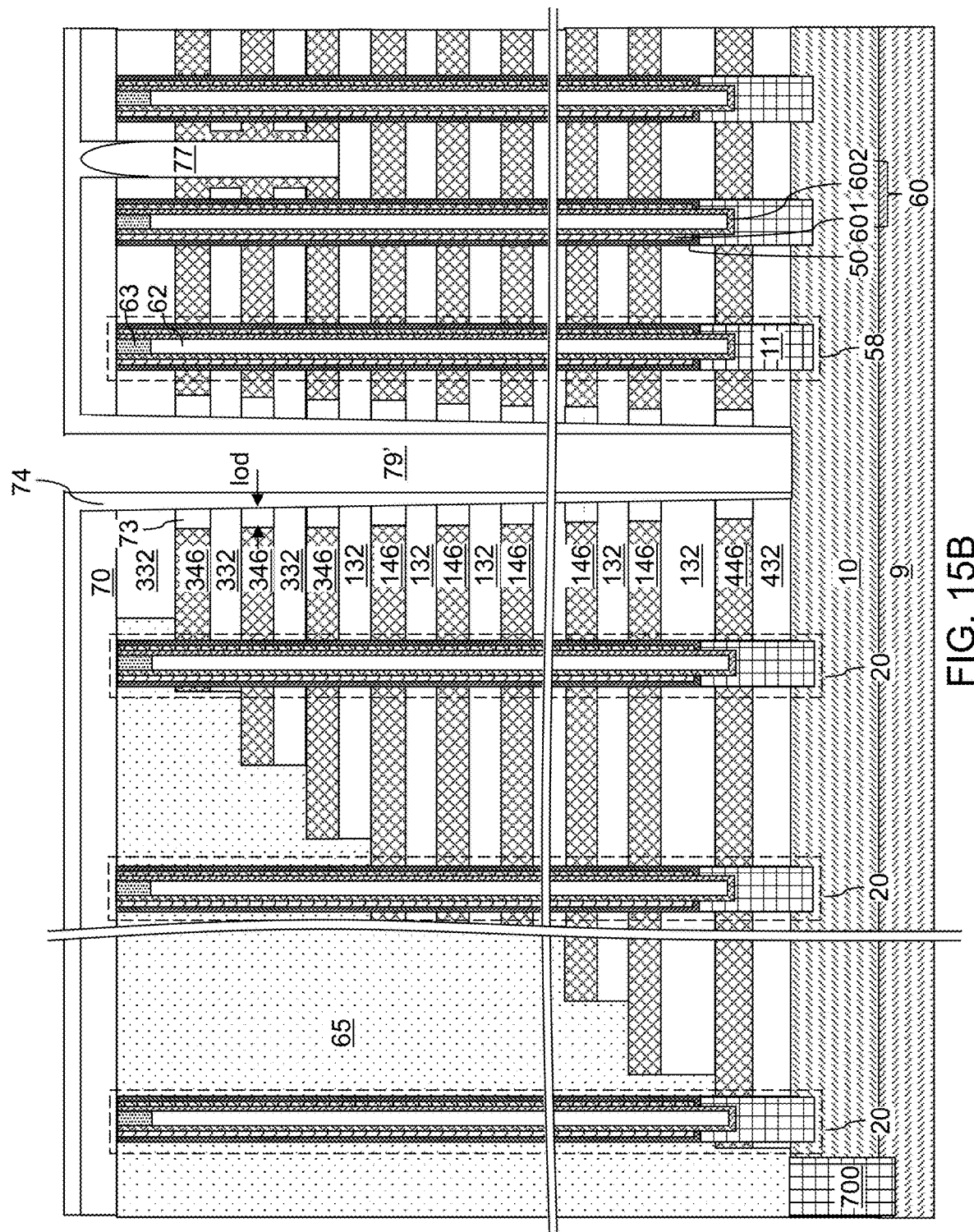
FIG. 15B is another schematic vertical cross-sectional view of the first exemplary structure of FIG. 15A.
Figure 15D:
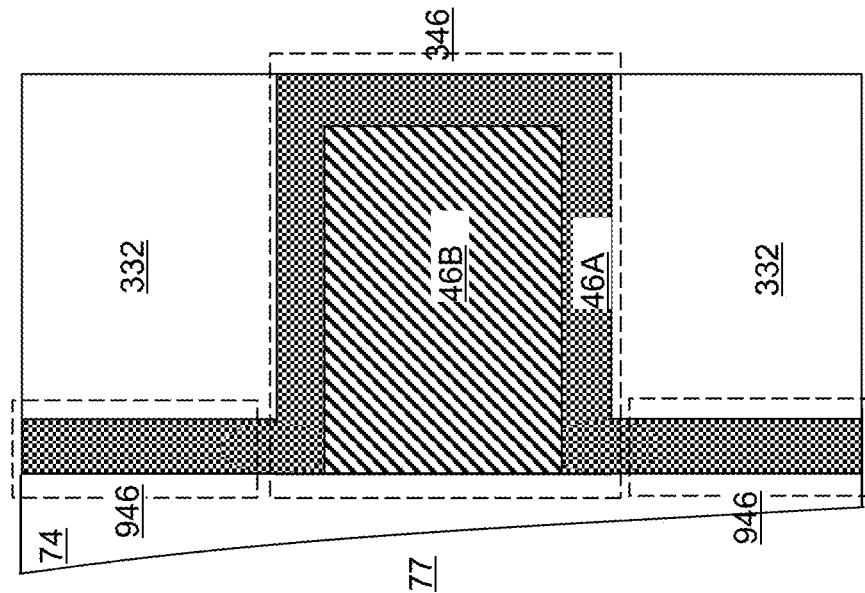
FIG. 15D is a magnified view of a second configuration of the first exemplary structure of FIGS. 15A and 15B around an encapsulated cavity.
Figure 15C:
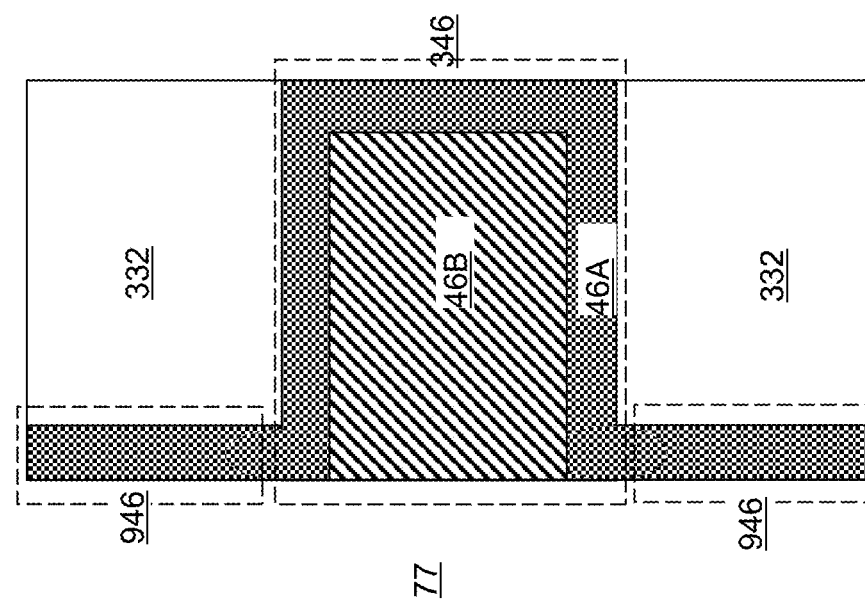
FIG. 15C is a magnified view of a first configuration of the first exemplary structure of FIGS. 15A and 15B around an encapsulated cavity.

An isotropic etch process or an anisotropic etch process may be performed to remove bottom horizontal portions of the nonconformal insulating layer 74 at the bottom of each backside trench 79 and any planar dielectric portion 616 in the same manner as in the processing steps of FIGS. 15A-15C. A top surface of the semiconductor material layer 10 may be physically exposed at the bottom of each backside trench 79. A backside cavity 79' is present within each backside trench 79.

Figure 31A:
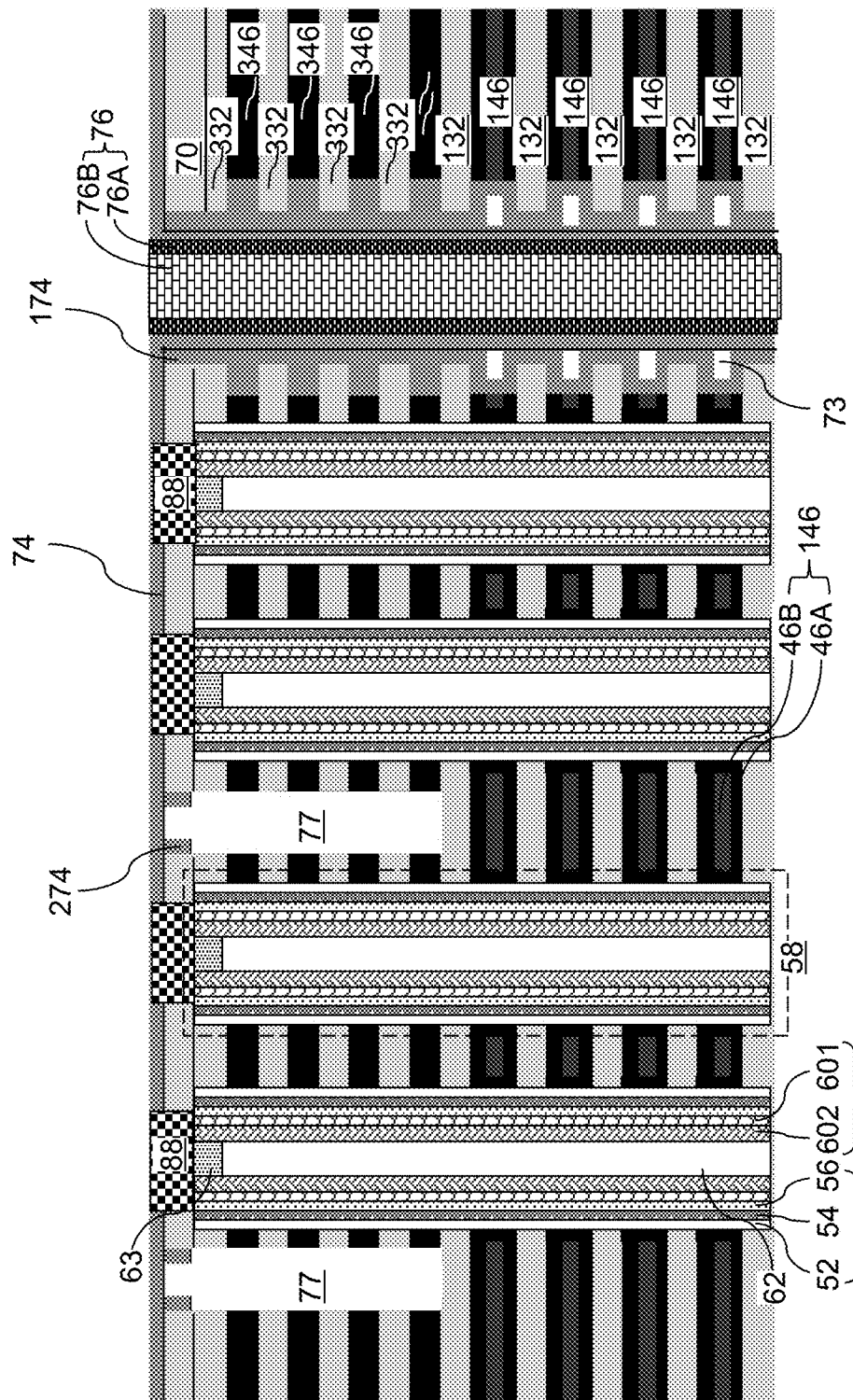
FIG. 31A is a schematic vertical cross-sectional view of the second exemplary structure after formation of various contact via structures according to the second embodiment of the present disclosure.
Figure 31C:
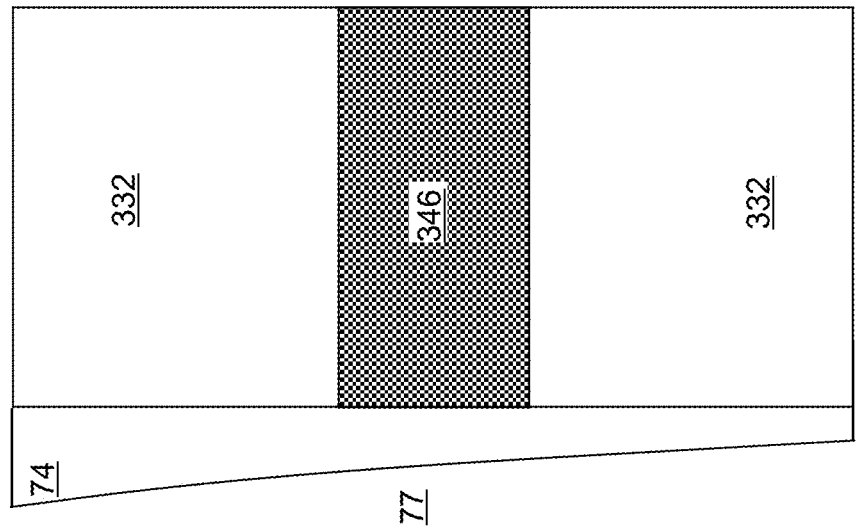
FIG. 31C is a magnified view of a second configuration of the second exemplary structure of FIG. 31A around an encapsulated cavity.
Figure 31B:
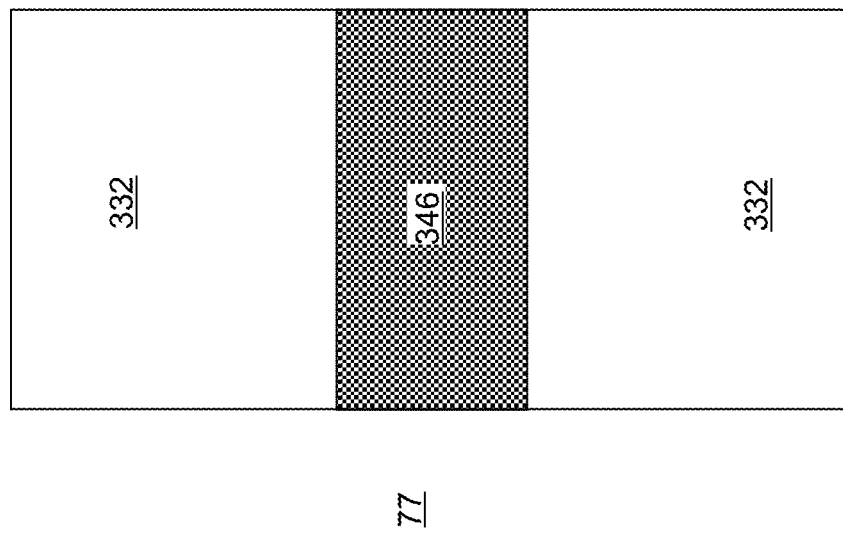
FIG. 31B is a magnified view of a first configuration of the second exemplary structure of FIG. 31A around an encapsulated cavity.

Referring to FIGS. 31A-31C, the processing steps of FIGS. 15A and 15B may be performed to form a source region 61 at a surface portion of the semiconductor material layer 10 under each backside cavity 79'. An upper portion of the semiconductor material layer 10 that extends between the source region 61 and the plurality of pedestal channel portions 11 constitutes a horizontal semiconductor channel 59 for a plurality of field effect transistors. A backside contact via structure 76 may be formed within each backside cavity 79'. Each contact via structure 76 may fill a respective backside cavity 79'. The contact via structures 76 may be formed by depositing at least one conductive material in the remaining unfilled volume (i.e., the backside cavity 79') of the backside trench 79. For example, the at least one conductive material may include a conductive liner 76A and a conductive fill material portion 76B. The at least one conductive material may be planarized using the contact-level dielectric layer 70 overlying the alternating stack {(432, 132, 332), (446, 146, 346)} as a stopping layer. If chemical mechanical planarization (CMP) process is used, the contact-level dielectric layer 70 may be used as a CMP stopping layer. Each remaining continuous portion of the at least one conductive material in the backside trenches 79 constitutes a backside contact via structure 76.

The backside contact via structure 76 extends through the alternating stack {(432, 132, 332), (446, 146, 346)}, and contacts a top surface of the source region 61. If a backside blocking dielectric layer 44 is used, the backside contact via structure 76 may contact a sidewall of the backside blocking dielectric layer 44. Additional contact via structures (88, 86, 8P) may be formed through the contact-level dielectric layer 70, and optionally through the retro-stepped dielectric material portion 65 by performing the processing steps of FIGS. 15A and 15B.

An encapsulated cavity 77 may be provided in each drain-select-level trench 71. An encapsulated cavity 77 may be laterally bounded by the drain-select-level insulating layers 332 and the drain-select-level electrically conductive layers 346 in case a highly anisotropic deposition process is used to form the nonconformal insulating layer 74 as illustrated in FIG. 31B. Alternatively, an encapsulated cavity 77 may be laterally bounded by a vertically extending portion of the nonconformal insulating layer 74 in case a less anisotropic deposition process is used to form the nonconformal insulating layer 74 as illustrated in FIG. 31C.

Figure 32A:
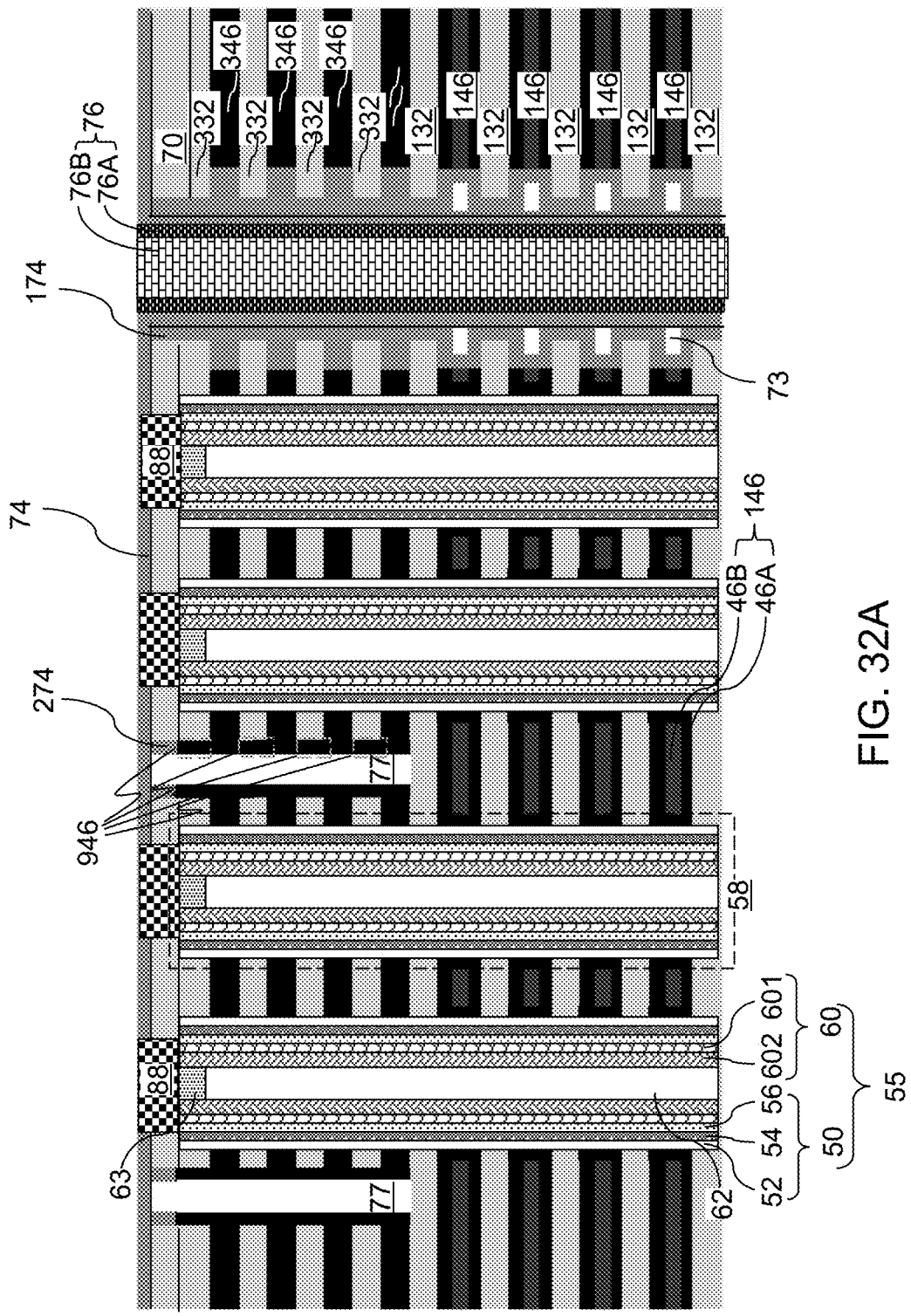
FIG. 32A is a schematic vertical cross-sectional view of an alternative second exemplary structure after formation of various contact via structures according to the second embodiment of the present disclosure.
Figure 32C:
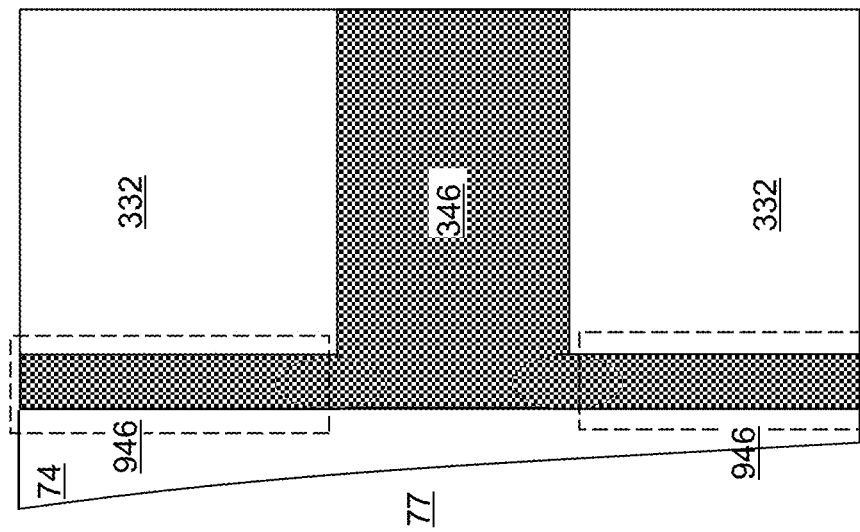
FIG. 32C is a magnified view of a second configuration of the alternative second exemplary structure of FIG. 32A around an encapsulated cavity.
Figure 32B:
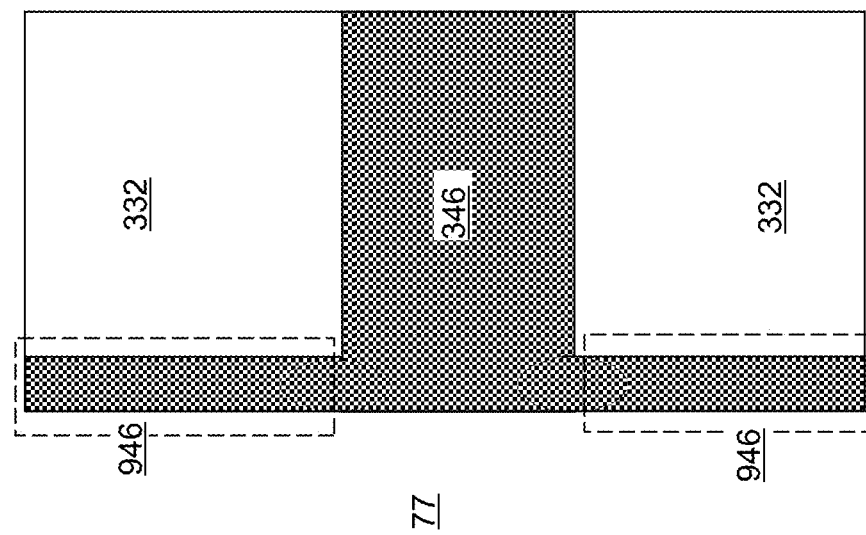
FIG. 32B is a magnified view of a first configuration of the alternative second exemplary structure of FIG. 32A around an encapsulated cavity.

FIGS. 32A-32C is an alternative second exemplary structure, which may be derived from the second exemplary structure of FIGS. 31A-31C by omitting the processing steps of FIG. 29. In this case, each drain-select-level electrically conductive layer 346 within each group selected from the multiple groups of drain-select-level electrically conductive layers 346 are electrically connected to and from each other or one another by at least one vertical conductive strip 946 comprising the first electrically conductive material within a respective one of the drain-select-level trenches 71. Each vertical conductive strip 946 may consist of a respective metallic barrier layer and a respective first electrically conductive material portion, and may continuously extend between a top surface of a topmost word-line-level insulating layer 332 and a drain-select-level trench insulating spacer 274.

An encapsulated cavity 77 may be provided in each drain-select-level trench 71. An encapsulated cavity 77 may be laterally bounded by the drain-select-level electrically conductive layers 346 and the vertical conductive strips 946 in case a highly anisotropic deposition process is used to form the nonconformal insulating layer 74 as illustrated in FIG. 31B. Alternatively, an encapsulated cavity 77 may be laterally bounded by a vertically extending portion of the nonconformal insulating layer 74 in case a less anisotropic deposition process is used to form the nonconformal insulating layer 74 as illustrated in FIG. 31C.

Figure 33A:
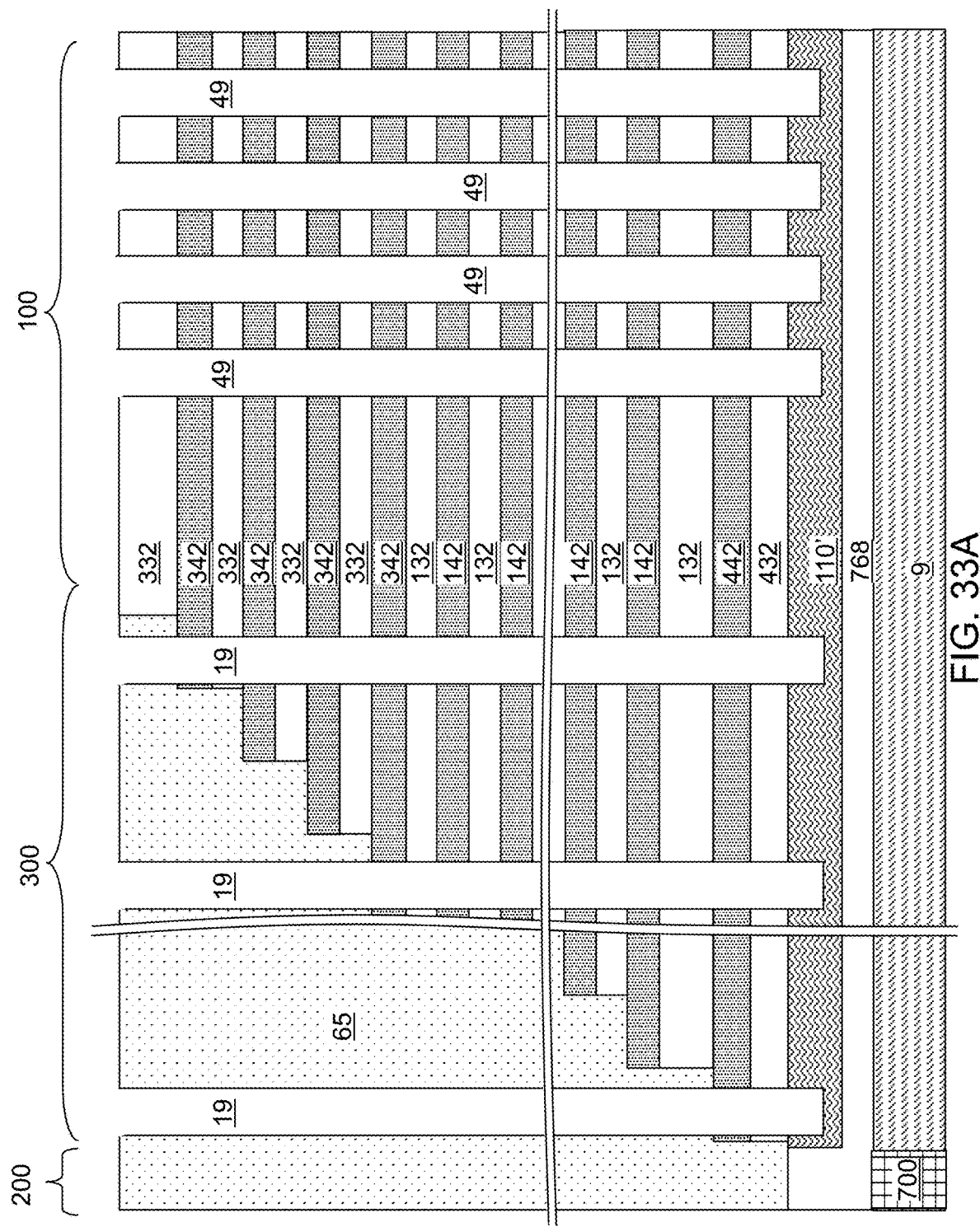
FIG. 33A is a vertical cross-sectional view of an alternative configuration of the exemplary structure at the processing steps of FIGS. 4A and 4B according to an embodiment of the present disclosure.
Figure 33B:
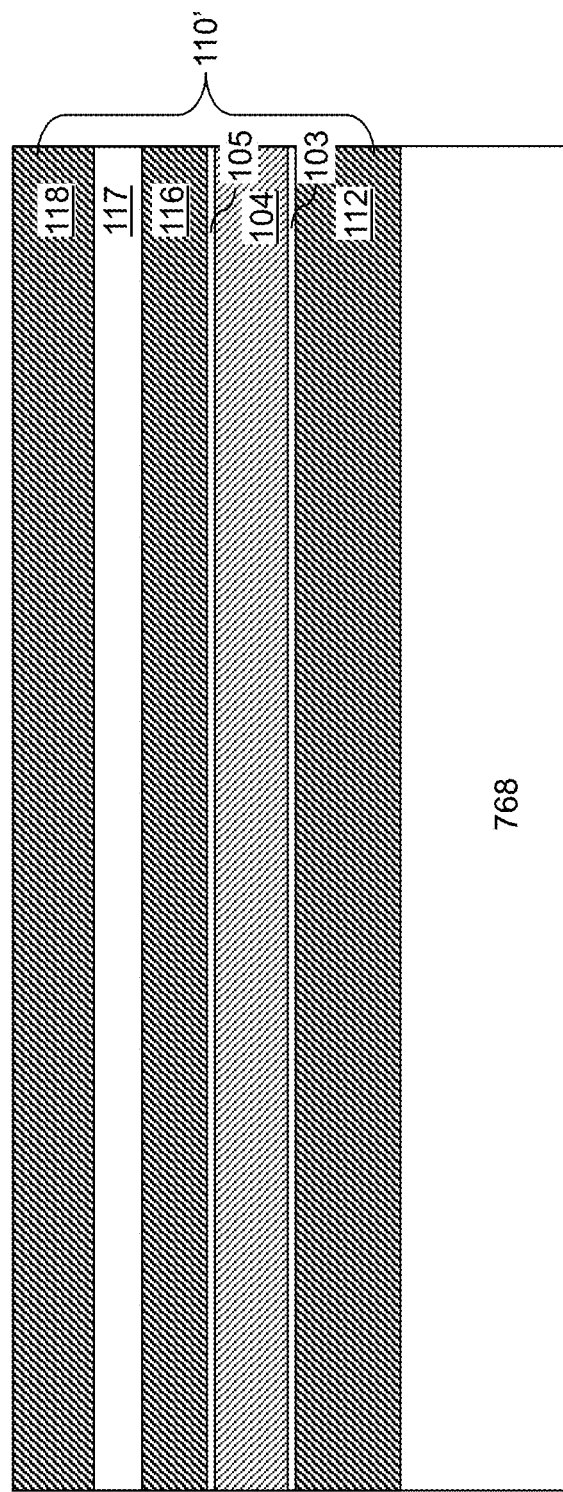
FIG. 33B is a magnified view of in-process source-level material layers at the processing steps of FIG. 33A.

Referring to FIGS. 33A and 33B, an alternative configuration for the exemplary structure is illustrated, which is derived from the exemplary structure of FIGS. 4A and 4B by employing a combination of a dielectric material layer 768 and in-process source-level material layers 110' in lieu of a semiconductor material layer 10. The dielectric material layer 768 may be a single dielectric material layer or a plurality of dielectric material layers having different material compositions and/or formed at different processing steps. Optionally, lower-level metal interconnect structures (not shown) may be formed in the dielectric material layer 768. The dielectric material layer 768 can include silicon oxide and/or silicon nitride. The thickness of the dielectric material layer 768 may be in a range from 100 nm to 3,000 nm, although lesser and greater thicknesses can also be employed.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The processing steps of FIG. 2-FIG. 4B can be subsequently performed to provide the alternative configuration of the exemplary structure illustrated in FIGS. 33A and 33B. Subsequently, the processing steps of FIGS. 5C, 5G, and 5H can be performed with the modification that the thickness and the material of the first semiconductor channel layer 601 are selected to be the thickness and the material of vertical semiconductor channels 60 to be formed.

Figure 34A:
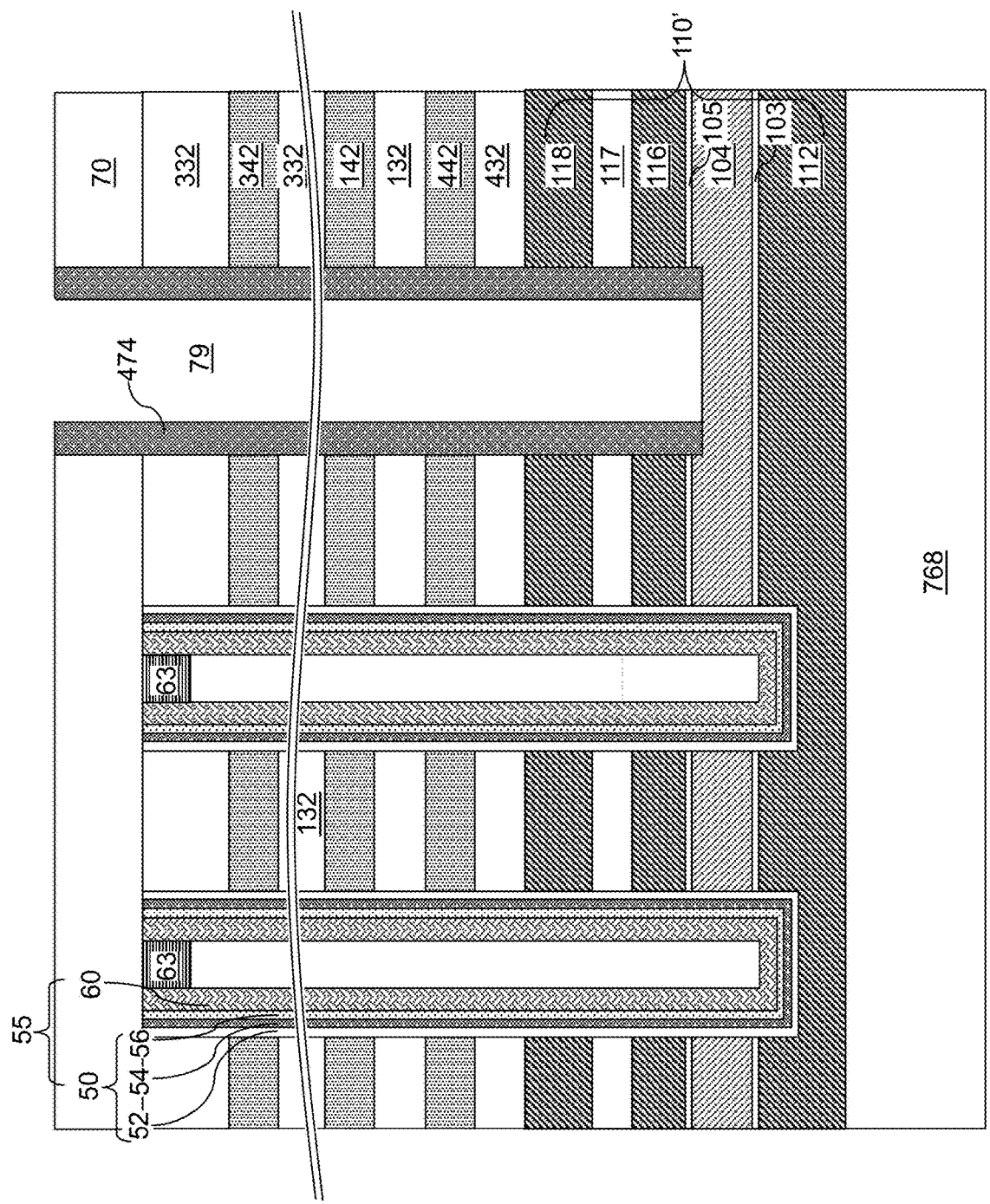
FIGS. 34A-34E illustrate sequential vertical cross-sectional views of memory opening fill structures and a backside trench during formation of source-level material layers in the alternative configuration of the exemplary structure according to an embodiment of the present disclosure.

Referring to FIG. 34A, the processing steps of FIGS. 7A-7C can be performed to form an insulating cap layer 70. The processing steps of FIGS. 8A and 8B can be performed to form drain-select-level trenches 71. The processing steps of FIGS. 9A and 9B can be performed with the modification that the bottom of each backside trench 79 extends into the in-process source-level material layers.

A backside trench spacer 474 may be formed on sidewalls of each backside trench 79. For example, a conformal spacer material layer may be deposited in the backside trenches 79 and over the insulating cap layer 70, and may be anisotropically etched to form the backside trench spacers 474. The backside trench spacers 474 include a material that is different from the material of the source-level sacrificial layer 104. For example, the backside trench spacers 474 may include silicon nitride.

Figure 34B:
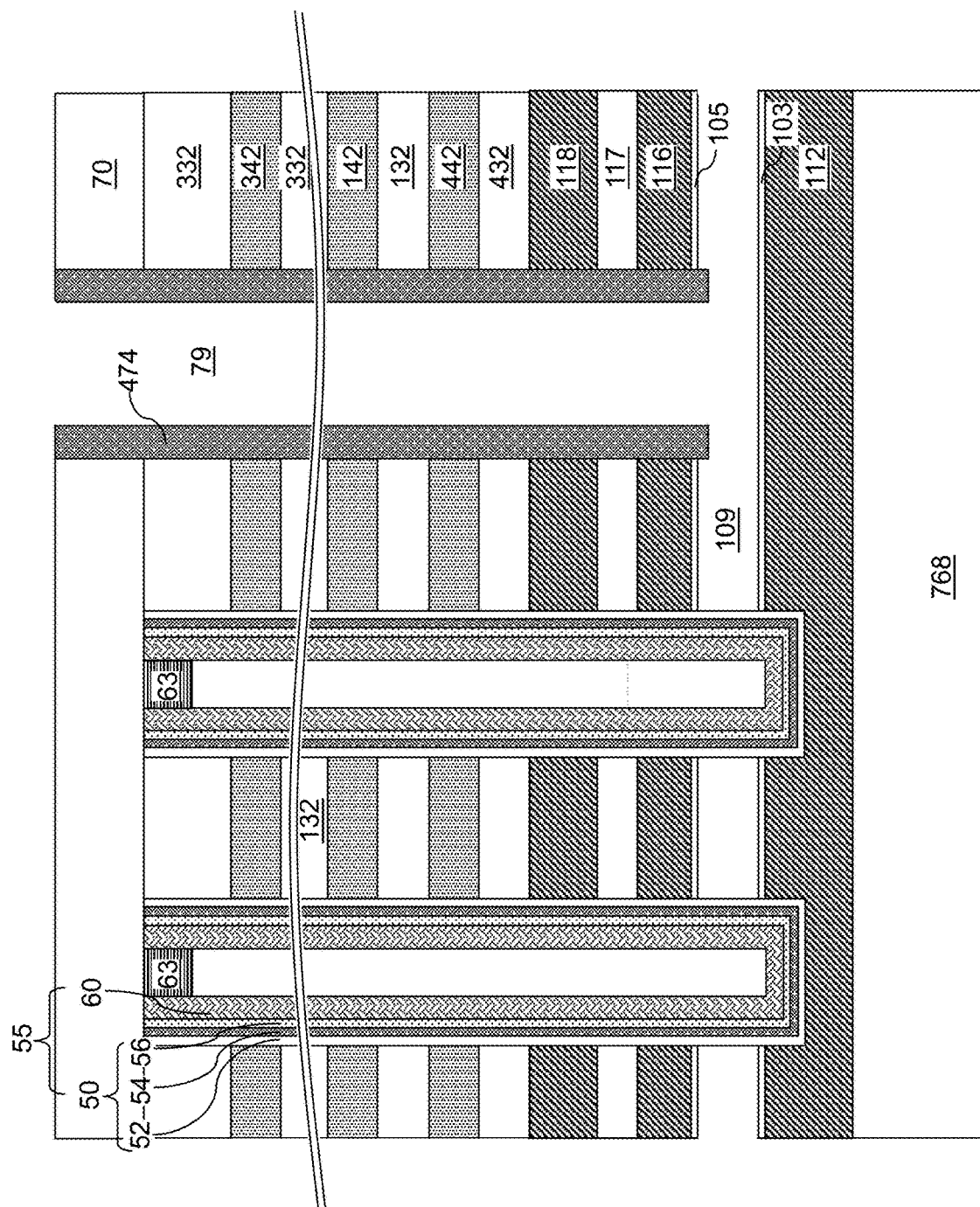

Referring to FIG. 34B, an etchant that etches the material of the source-level sacrificial layer 104 selective to the materials of the alternating stack {(432, 132, 332), (442, 142, 342)}, the insulating cap layers 70, the insulating cap layer 70, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 474 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 474 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 474, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 and memory stack structures 55 is physically exposed to the source cavity 109. Specifically, each of the memory opening fill structures 58 includes a sidewall and that are physically exposed to the source cavity 109.

Figure 34C:
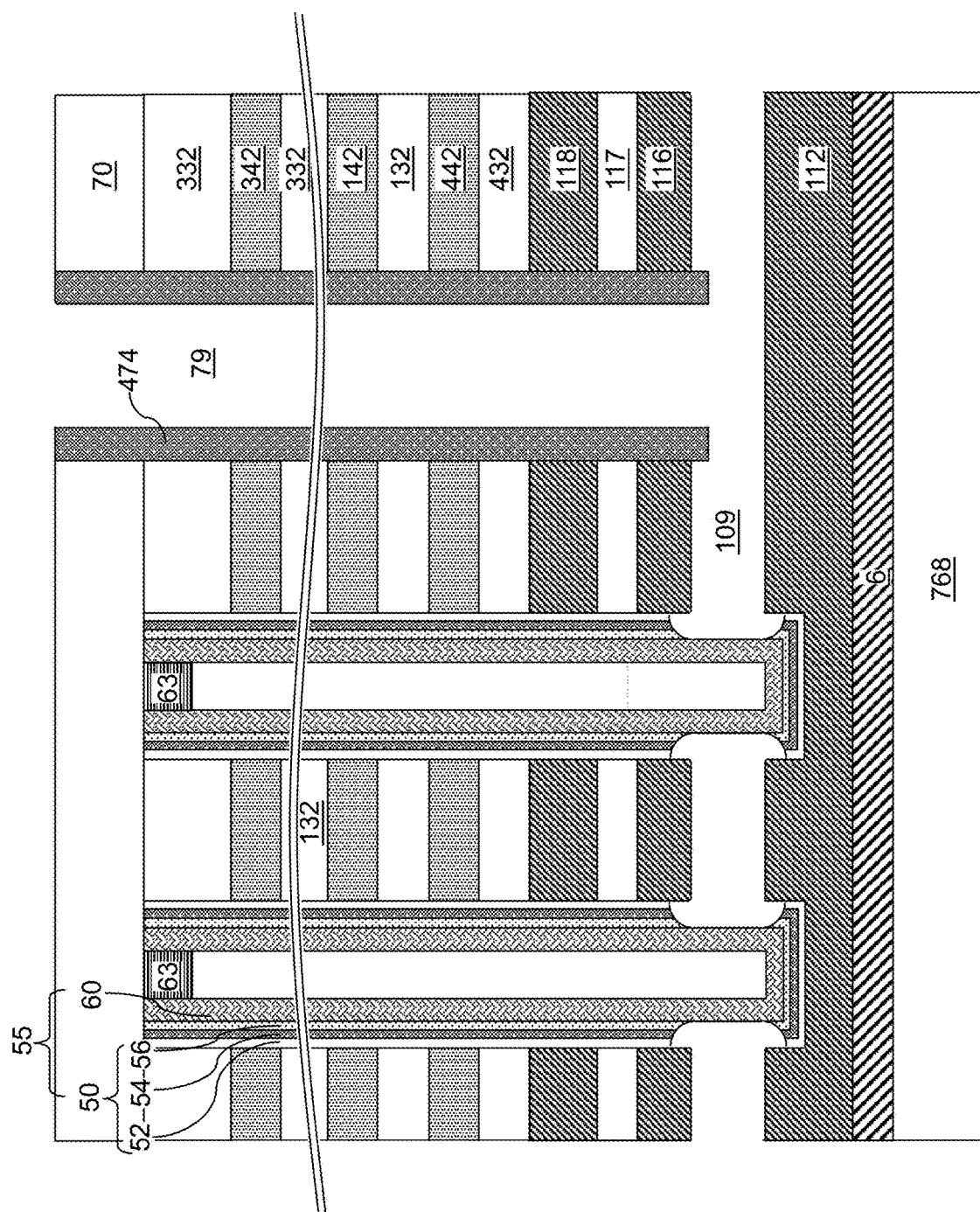

Referring to FIG. 34C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 34D:
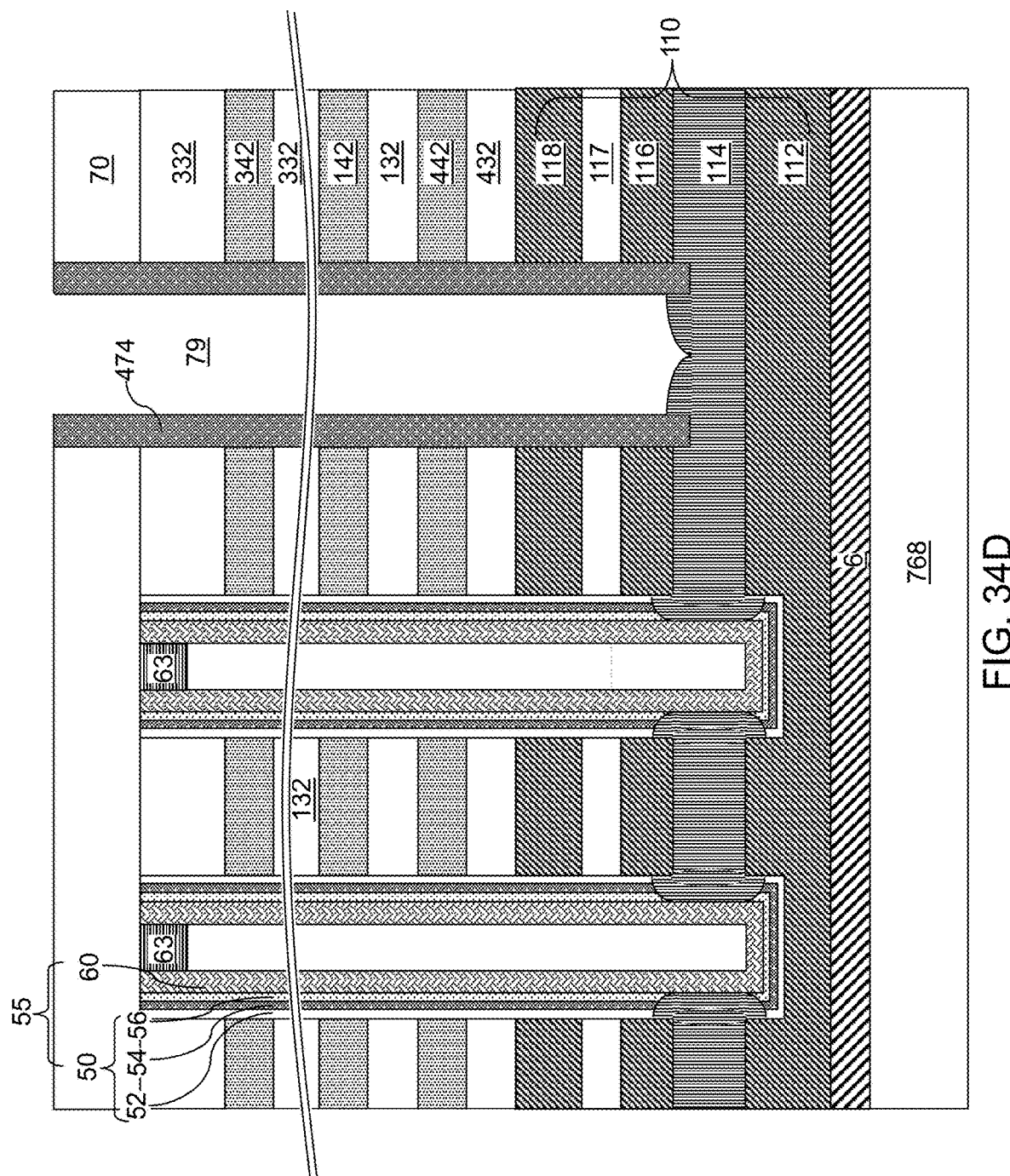

Referring to FIG. 34D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 474. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 34E:
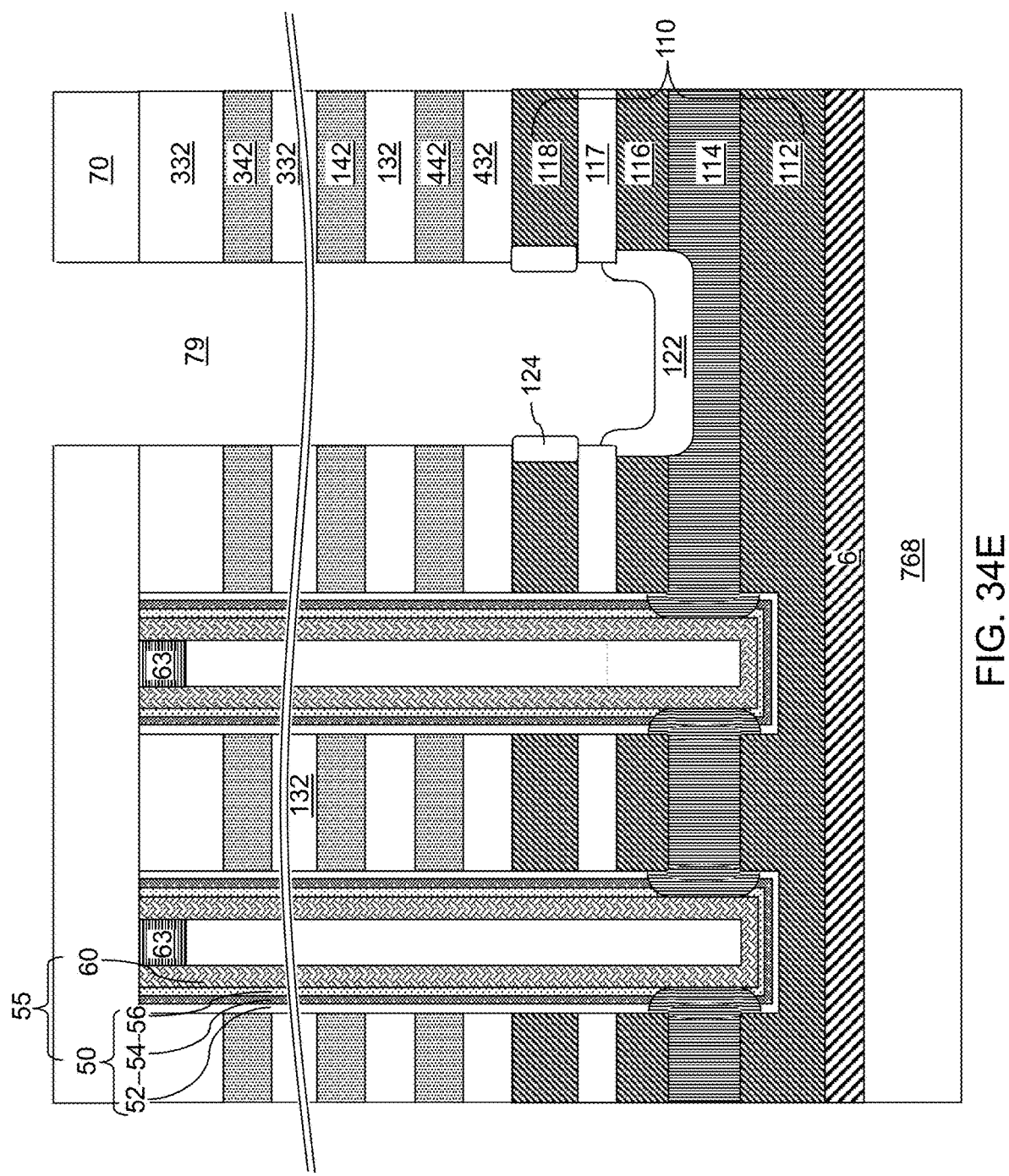

Referring to FIG. 34E, the backside trench spacers 474 may be removed selective to the insulating layers (132, 232), the first and second insulating cap layers (170, 270), the insulating cap layer 70, and the source contact layer 114 using an isotropic etch process. For example, if the backside trench spacers 474 include silicon nitride, a wet etch process using hot phosphoric acid may be performed to remove the backside trench spacers 474. In one embodiment, the isotropic etch process that removes the backside trench spacers 474 may be combined with a subsequent isotropic etch process that etches the sacrificial material layers (142, 242) selective to the insulating layers (132, 232), the first and second insulating cap layers (170, 270), the insulating cap layer 70, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 35:
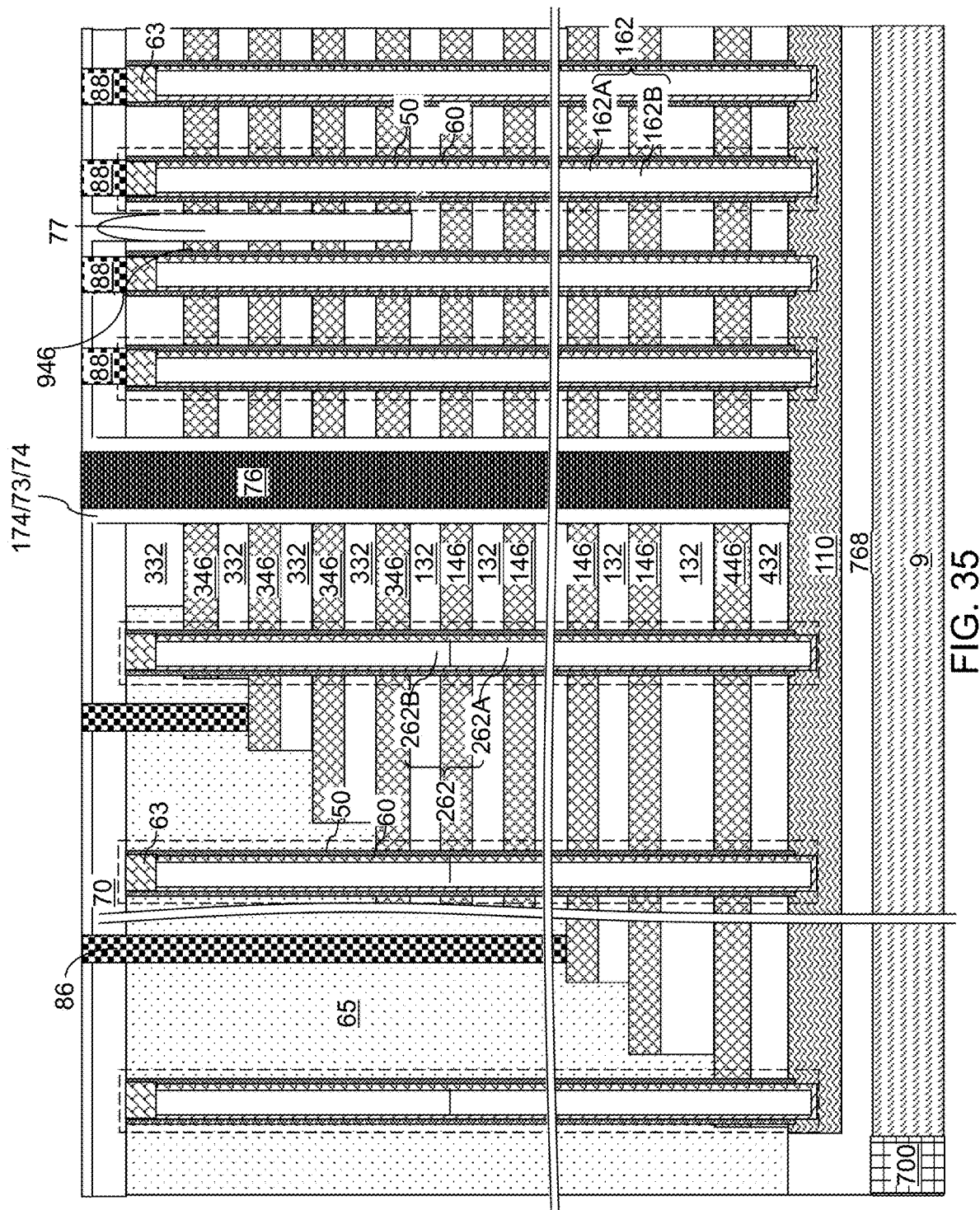
FIG. 35 illustrates a vertical cross-sectional view of the alternative configuration of the exemplary structure at the processing steps of FIGS. 31A-31C according to an embodiment of the present disclosure.

Referring to FIG. 35, the processing steps of FIGS. 21A and 21B through the processing steps of FIG. 32A-32C can be subsequently performed to provide the alternative configuration of the exemplary structure illustrated in FIG. 35.

Referring to all drawings of the second exemplary structure and related drawings and according to various embodiments of the present disclosure, a three-dimensional memory device is provided, which comprises: a first alternating stack of insulating layers (432, 132, 332) and electrically conductive layers (446, 146, 346) located over a substrate (9, 10); and memory stack structures 55 extending through the first alternating stack {(432, 132, 332), (446, 146, 346)}; wherein: the electrically conductive layers (446, 146, 346) comprise drain-select-level electrically conductive layers 346 located in at least two different levels having different vertical distances from the substrate (9, 10) and laterally spaced apart as multiple groups that are electrically isolated from one another; the electrically conductive layers (446, 146, 346) further comprise word-line-level electrically conductive layers 146 that underlie the drain-select-level electrically conductive layers 346 and have a respective pair of sidewalls that laterally extend along a first horizontal direction hd1; each of the word-line-level electrically conductive layers 146 comprises a respective first electrically conductive material layer 46A including a first electrically conductive material and a respective second electrically conductive material layer 46B comprising a second electrically conductive material that is different from the first electrically conductive material and formed within the respective first electrically conductive material layer 46A; and each of the drain-select-level electrically conductive layers consists essentially of the first electrically conductive material.

In one embodiment, the drain-select-level electrically conductive layers 346 do not contact any of the second electrically conductive material. In one embodiment, each laterally neighboring pair of groups selected from the multiple groups is laterally spaced apart by a respective encapsulated cavity that is free of any solid material therein. In one embodiment, the word-line-level electrically conductive layers 146 have a uniform word-line-level width along a second horizontal direction hd2 that is perpendicular to the first horizontal direction hd1; and each of the drain-select-level electrically conductive layers 346 laterally extends along the first horizontal direction hd1 and has a respective uniform drain-select-level width along the second horizontal direction hd2 that is less than one third of the uniform word-line-level width.

In one embodiment, the first electrically conductive material consists essentially of a first elemental metal; and the second electrically conductive material consists essentially of a second elemental metal. In one embodiment, the first elemental metal comprises tungsten; and the second elemental metal comprises a metal selected from molybdenum, cobalt, and ruthenium.

In one embodiment, each horizontal surface of the second electrically conductive material layers 46B contacts a horizontal surface of the first electrically conductive material layers 46A. In one embodiment, the three-dimensional memory device comprises conformal insulating spacers 174 contacting sidewalls of the insulating layers 32 and sidewalls of the electrically conductive layers (446, 146, 346), wherein each sidewall of the second electrically conductive material layers 46B contacts a sidewall of the first electrically conductive material layers 46A or a sidewall of the conformal insulating spacers 174.

In one embodiment, drain-select-level electrically conductive layers 346 within each group selected from the multiple groups may be electrically isolated from each other or one another as illustrated in FIGS. 31A-31C. In one embodiment, each of the drain-select-level electrically conductive layers 346 within each group comprise a sidewall that contacts an element selected from: a cavity 77 that is free of any solid material; and a vertically extending portion of an insulating material that overlies and surrounds a cavity 77 such as a vertically protruding portion of the nonconformal insulating layer 74.

In one embodiment, drain-select-level electrically conductive layers 346 within each group selected from the multiple groups are electrically connected by at least one vertical conductive strip 946 comprising the first electrically conductive material, wherein each of the at least one vertical conductive strip 946 is not in direct contact with any surface of the second electrically conductive material as illustrated in FIGS. 32A-32C. In one embodiment, each sidewall of the at least one vertical conductive strip 946 contacts an element selected from: one of the insulating layers 332; a cavity 77 that is free of any solid material; and a vertically extending portion of an insulating material that overlies and surrounds a cavity 77 such as a vertically-protruding portion of the nonconformal insulating layer 74. In one embodiment, each of the at least one vertical conductive strip 946 has a lateral thickness that is the same as a vertical thickness of horizontal portions of the first electrically conductive material layers 46A.

In one embodiment, each of the drain-select-level electrically conductive layers 346 has a respective vertical thickness that is less than twice a vertical thickness of horizontal portions of the first electrically conductive material layers 46A within the word-line-level electrically conductive layers 146.

In one embodiment, each of the electrically conductive layers (446, 146, 346) includes a sidewall that is laterally offset from a sidewall of a most proximal one of the insulating layers (432, 132, 332) by a same lateral offset distance lod.

Each of the exemplary structures may include a three-dimensional memory device. In one embodiment, the three-dimensional memory device comprises a monolithic three-dimensional NAND memory device. The word-line-level electrically conductive layers 146 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (comprising a portion of a charge storage layer 54 at a level of an word-line-level electrically conductive layer 46) in a first device level of the array of monolithic three-dimensional NAND strings may be located over another memory cell (comprising another portion of the charge storage layer 54 at a level of another word-line-level electrically conductive layer 46) in a second device level of the array of monolithic three-dimensional NAND strings. The silicon substrate may contain an integrated circuit comprising a driver circuit (comprising a subset of the least one semiconductor device 700) for the memory device located thereon. The word-line-level electrically conductive layers 146 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the charge storage layer 54). Each charge storage element may be located adjacent to a respective one of the plurality of semiconductor channels (59, 11, 60).

The various embodiments of the present disclosure provide more than two strips of drain-select-level electrically conductive layers 346 between each laterally neighboring pair of backside trenches 79. The drain-select-level trenches 71 may function as a conduit for providing an etchant for etching the sacrificial material of the drain-select-level sacrificial material layers 342 that are not directly exposed to backside trenches during formation of the drain-select-level backside recesses 343. Further, the drain-select-level trenches 71 may function as a conduit for providing a reactant for depositing the backside blocking dielectric layer 44, the optional continuous metallic barrier layer 45N, the first continuous electrically conductive material layer 45A, and optionally the second continuous electrically conductive material layer 45B. Thus, more than two clusters of memory stack structures 55 may be provided with electrical isolation at the drain select levels between each neighboring pair of backside trenches 79 using the methods of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
a first alternating stack of insulating layers and electrically conductive layers located over a substrate; and
memory stack structures extending through the first alternating stack;
wherein:
the electrically conductive layers comprise drain-select-level electrically conductive layers located in at least two different levels having different vertical distances from the substrate and laterally spaced apart as multiple groups that are electrically isolated from one another;
the electrically conductive layers further comprise word-line-level electrically conductive layers that underlie the drain-select-level electrically conductive layers and comprise a respective pair of sidewalls that laterally extend along a first horizontal direction;
each of the word-line-level electrically conductive layers comprises a respective first electrically conductive material layer including a first electrically conductive material and a respective second electrically conductive material layer comprising a second electrically conductive material that is different from the first electrically conductive material and formed within the respective first electrically conductive material layer;
each of the drain-select-level electrically conductive layers consists essentially of the first electrically conductive material; and
wherein the three dimensional memory device includes a feature selected from the following features:
a first feature wherein the drain-select-level electrically conductive layers do not contact any of the second electrically conductive material; or
a second features wherein each laterally neighboring pair of groups selected from the multiple groups is laterally spaced apart by a respective encapsulated cavity that is free of any solid material therein; or
a third feature wherein drain-select-level electrically conductive layers within each group selected from the multiple groups are electrically isolated from each other or one another and each of the drain-select-level electrically conductive layers within each group comprise a sidewall that contacts an element selected from: a cavity that is free of any solid material; and a vertically extending portion of an insulating material that overlies and surrounds a cavity; or a fourth feature wherein drain-select-level electrically conductive layers within each group selected from the multiple groups are electrically connected by at least one vertical conductive strip comprising the first electrically conductive material, wherein each of the at least one vertical conductive strip is not in direct contact with any surface of the second electrically conductive material; or a fifth feature wherein each of the drain-select-level electrically conductive layers has a respective vertical thickness that is less than twice a vertical thickness of horizontal portions of the first electrically conductive material layers within the word-line-level electrically conductive layers.

2. The three-dimensional memory device of claim 1, wherein the feature is the first feature.

3. The three-dimensional memory device of claim 1, wherein the feature is the second feature.

4. The three-dimensional memory device of claim 3, wherein:
the word-line-level electrically conductive layers have a uniform word-line-level width along a second horizontal direction that is perpendicular to the first horizontal direction; and
each of the drain-select-level electrically conductive layers laterally extends along the first horizontal direction and has a respective uniform drain-select-level width along the second horizontal direction that is less than one third of the uniform word-line-level width.

5. The three-dimensional memory device of claim 1, wherein:
the first electrically conductive material consists essentially of a first elemental metal; and
the second electrically conductive material consists essentially of a second elemental metal.

6. The three-dimensional memory device of claim 5, wherein:
the first elemental metal comprises tungsten; and
the second elemental metal comprises a metal selected from molybdenum, cobalt, or ruthenium.

7. The three-dimensional memory device of claim 1, wherein each horizontal surface of the second electrically conductive material layers contacts a horizontal surface of the first electrically conductive material layers.

8. The three-dimensional memory device of claim 7, further comprising conformal insulating spacers contacting sidewalls of the insulating layers and sidewalls of the electrically conductive layers, wherein each sidewall of the second electrically conductive material layers contacts a sidewall of the first electrically conductive material layers or a sidewall of the conformal insulating spacers.

9. The three-dimensional memory device of claim 1, wherein the feature is the third feature.

10. The three-dimensional memory device of claim 1, wherein the feature is the fourth feature.

11. The three-dimensional memory device of claim 10, wherein each sidewall of the at least one vertical conductive strip contacts an element selected from:
one of the insulating layers;
a cavity that is free of any solid material; and
a vertically extending portion of an insulating material that overlies and surrounds a cavity.

12. The three-dimensional memory device of claim 10, wherein each of the at least one vertical conductive strip has a lateral thickness that is the same as a vertical thickness of horizontal portions of the first electrically conductive material layers.

13. The three-dimensional memory device of claim 1, wherein the feature is the fifth feature.

14. The three-dimensional memory device of claim 1, each of the electrically conductive layers includes a sidewall that is laterally offset from a sidewall of a most proximal one of the insulating layers by a same lateral offset distance.

15. A method of forming a semiconductor structure comprising:
forming an alternating stack of insulating layers and sacrificial material layers over a substrate, wherein the sacrificial material layers comprise word-line-level sacrificial material layers and drain-select-level sacrificial material layers that overlie the word-line-level sacrificial material layers and have a lesser thickness than the word-line-level sacrificial material layers;
forming memory stack structures through the alternating stack;
forming drain-select-level trenches through an upper subset of the sacrificial material layers;
forming backside trenches through each layer of the alternating stack;
forming word-line-level backside recesses and drain-select-level backside recesses by removing the word-line-level sacrificial material layers and the drain-select-level sacrificial material layers, respectively;
depositing a first continuous electrically conductive material layer including a first electrically conductive material to fill all volumes of the drain-select-level backside recesses and to partially fill volumes of the drain-select-level backside recesses;
depositing a second continuous electrically conductive material layer including a second electrically conductive material in unfilled volumes of the word-line-level backside recesses; and
removing at least partially portions of the second electrically conductive material and the first electrically conductive material from the drain-select-level trenches, wherein drain-select-level electrically conductive layers are provided in volumes of the drain-select-level backside recesses as multiple groups that are laterally spaced apart and electrically isolated from one another.

16. The method of claim 15, further comprising:
isotropically removing the first electrically conductive material and the second electrically conductive material from the backside trenches and from above a topmost one of the insulating layers by an isotropic recess etch process, wherein electrically conductive layers including remaining portions of the first and second continuous electrically conductive layers are formed in the backside recesses and in the drain-select-level trenches;
anisotropically etching the second electrically conductive material in drain-select-level cavities selective to the first electrically conductive material; and
etching physically exposed portions of the first electrically conductive material from the drain-select-level cavities, wherein remaining portions of the electrically conductive layers include multiple groups of drain-select-level electrically conductive layers that are laterally spaced apart and electrically isolated from one another.

17. The method of claim 16, wherein:
etching the physically exposed portions of the first electrically conductive material from the drain-select-level cavities comprises performing an anisotropic etch process that partially etches portions of the first electrically conductive material in the drain-select-level trenches; and each drain-select-level electrically conductive layer within each group selected from the multiple groups are electrically connected to and from each other or one another by at least one vertical conductive strip comprising the first electrically conductive material within a respective one of the drain-select-level trenches.

18. The method of claim 16, wherein:

etching the physically exposed portions of the first electrically conductive material from the drain-select-level cavities comprises completely removing the first electrically conductive material from the drain-select-level trenches; and each drain-select-level electrically conductive layer within each group selected from the multiple groups are electrically isolated from each other or one another.

19. The method of claim 15, further comprising anisotropically depositing a nonconformal insulating layer over the sidewalls of the insulating layers that are exposed to the backside trenches and over the drain-select-level trenches, wherein an encapsulated cavity that is free of any solid material therein and bounded by a bottom surface of the nonconformal insulating layer is formed in a volume of one of the drain-select-level trenches.

* * * * *